United States Patent
Hata et al.

(10) Patent No.: US 10,818,581 B2
(45) Date of Patent: Oct. 27, 2020

(54) METHOD OF MANUFACTURING SEMICONDUCTOR DEVICE AND SEMICONDUCTOR DEVICE

(71) Applicant: Renesas Electronics Corporation, Koutou-ku, Tokyo (JP)

(72) Inventors: Toshiyuki Hata, Tokyo (JP); Yuichi Yato, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 167 days.

(21) Appl. No.: 15/657,132

(22) Filed: Jul. 22, 2017

(65) Prior Publication Data

US 2018/0090420 A1    Mar. 29, 2018

(30) Foreign Application Priority Data

Sep. 29, 2016 (JP) .................................. 2016-191449

(51) Int. Cl.
*H01L 23/495* (2006.01)
*H01L 25/00* (2006.01)
(Continued)

(52) U.S. Cl.
CPC .... *H01L 23/49541* (2013.01); *H01L 21/4842* (2013.01); *H01L 23/4951* (2013.01);
(Continued)

(58) Field of Classification Search
CPC ......... H01L 25/00–50; H01L 23/49589; H01L 23/49575; H01L 23/49541–49544; H01L 21/4842
See application file for complete search history.

(56) References Cited

U.S. PATENT DOCUMENTS

| | | | | |
|---|---|---|---|---|
| 6,031,216 A | * | 2/2000 | Singh ................... | B23K 20/007 219/633 |
| 2003/0189830 A1 | * | 10/2003 | Sugimoto ........... | H01L 25/0753 362/294 |

(Continued)

FOREIGN PATENT DOCUMENTS

| | | | |
|---|---|---|---|
| JP | 11121680 A | * | 4/1999 |
| JP | H11-121680 A | | 4/1999 |
| JP | 2009-129952 A | | 6/2009 |

OTHER PUBLICATIONS

Machine translation of JP11121680A, translated May 29, 2018.*

*Primary Examiner* — Lauren R Bell
(74) *Attorney, Agent, or Firm* — SGPatents PLLC

(57) ABSTRACT

An improvement is achieved in the performance of a semiconductor device. A second component mounting portion over which a first electronic component is mounted is connected to a coupling portion of a lead frame via a suspension lead. The suspension lead has a first portion between the second component mounting portion and the coupling portion and a second portion between the first portion and the coupling portion. The second portion has a third portion connected to the first portion and having a width smaller than a width of the first portion, a fourth portion connected to the first portion and having a width smaller than the width of the first portion, and a through hole (opening) located between the third and fourth portions. Each of the first, third, and fourth portions has the same thickness. After a sealing body is formed, a cutting jig is pressed against the suspension lead to cut the suspension lead.

16 Claims, 29 Drawing Sheets

(51) Int. Cl.
  *H01L 21/48*  (2006.01)
  *H01L 23/00*  (2006.01)
  *H01L 23/31*  (2006.01)

(52) U.S. Cl.
  CPC .... *H01L 23/4952* (2013.01); *H01L 23/49513* (2013.01); *H01L 23/49575* (2013.01); *H01L 23/49589* (2013.01); *H01L 25/50* (2013.01); *H01L 23/3107* (2013.01); *H01L 23/49555* (2013.01); *H01L 23/49562* (2013.01); *H01L 23/562* (2013.01); *H01L 24/29* (2013.01); *H01L 24/32* (2013.01); *H01L 24/45* (2013.01); *H01L 24/48* (2013.01); *H01L 24/73* (2013.01); *H01L 24/78* (2013.01); *H01L 24/83* (2013.01); *H01L 24/85* (2013.01); *H01L 24/92* (2013.01); *H01L 24/97* (2013.01); *H01L 2224/05553* (2013.01); *H01L 2224/2929* (2013.01); *H01L 2224/29101* (2013.01); *H01L 2224/29339* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/48257* (2013.01); *H01L 2224/49113* (2013.01); *H01L 2224/73265* (2013.01); *H01L 2224/78301* (2013.01); *H01L 2224/78704* (2013.01); *H01L 2224/83011* (2013.01); *H01L 2224/8391* (2013.01); *H01L 2224/83815* (2013.01); *H01L 2224/83862* (2013.01); *H01L 2224/85181* (2013.01); *H01L 2224/85205* (2013.01); *H01L 2224/85207* (2013.01); *H01L 2224/85439* (2013.01); *H01L 2224/92247* (2013.01); *H01L 2924/19105* (2013.01)

(56) References Cited

U.S. PATENT DOCUMENTS

2010/0052125 A1* 3/2010 Sasaki ............... B23K 20/005
                                                        257/676
2013/0009300 A1* 1/2013 Yato ............... H01L 23/49524
                                                        257/676

* cited by examiner

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2016-191449 filed on Sep. 29, 2016 including the specification, drawings and abstract is incorporated herein by reference in its entirety.

BACKGROUND

The present invention relates to a semiconductor device and a manufacturing technique therefor and to a technique which is effective when applied to a semiconductor device in which a plurality of electronic components, including a semiconductor chip, are mounted.

Japanese Unexamined Patent Application Publication No. 2009-129952 (Patent Document 1) describes a semiconductor device in which a plurality of electronic components, including a semiconductor chip and a capacitor, are mounted in a package.

On the other hand, Japanese Unexamined Patent Application Publication No. Hei 11(1999)-121680 (Patent Document 2) describes a lead frame in which a through hole is formed in the boundary between an outer frame and each of suspension leads supporting a die pad over which a semiconductor chip is mounted.

RELATED ART DOCUMENTS

Patent Documents

[Patent Document 1] Japanese Unexamined Patent Application Publication No. 2009-129952
[Patent Document 2] Japanese Unexamined Patent Application Publication No. Hei 11(1999)-121680

SUMMARY

The present inventors have studied a technique which mounts a plurality of electronic components in a semiconductor device and found the following problem. That is, the present inventors have found that, when a semiconductor device (semiconductor package) in which a plurality of electronic components are mounted over a lead frame is manufactured, if attention is focused only on an improvement in manufacturing efficiency, a problem concerning the reliability of the semiconductor device such as, e.g., detachment of the mounted electronic components from the lead frame arises.

Other problems and novel features of the present invention will become apparent from a statement in the present specification and the accompanying drawings.

A method of manufacturing a semiconductor device according to an embodiment includes the steps of mounting a semiconductor chip over a first component mounting portion of a lead frame, mounting a first electronic component over and between a second component mounting portion and a third component mounting portion of the foregoing lead frame, and sealing the foregoing semiconductor chip and the foregoing first electronic component with a resin, thereby forming a sealing body. The foregoing second component mounting portion is connected to a coupling portion of the lead frame via a suspension lead. The foregoing suspension lead has a first portion between the foregoing second component mounting portion and the foregoing coupling portion and a second portion between the foregoing first portion and the foregoing coupling portion. The foregoing second portion has a third portion which is connected to the foregoing first portion and has a width smaller than a width of the foregoing first portion, a fourth portion which is connected to the foregoing first portion and having a width smaller than the width of the foregoing first portion, and a first opening located between the foregoing third and fourth portions. Each of the foregoing first, third, and fourth portions has the same thickness. After the foregoing sealing body is formed, the foregoing suspension lead is cut by pressing a cutting jig against the suspension lead.

According to the foregoing embodiment, the performance of the semiconductor device can be improved.

DETAILED DESCRIPTION

Figure 1:
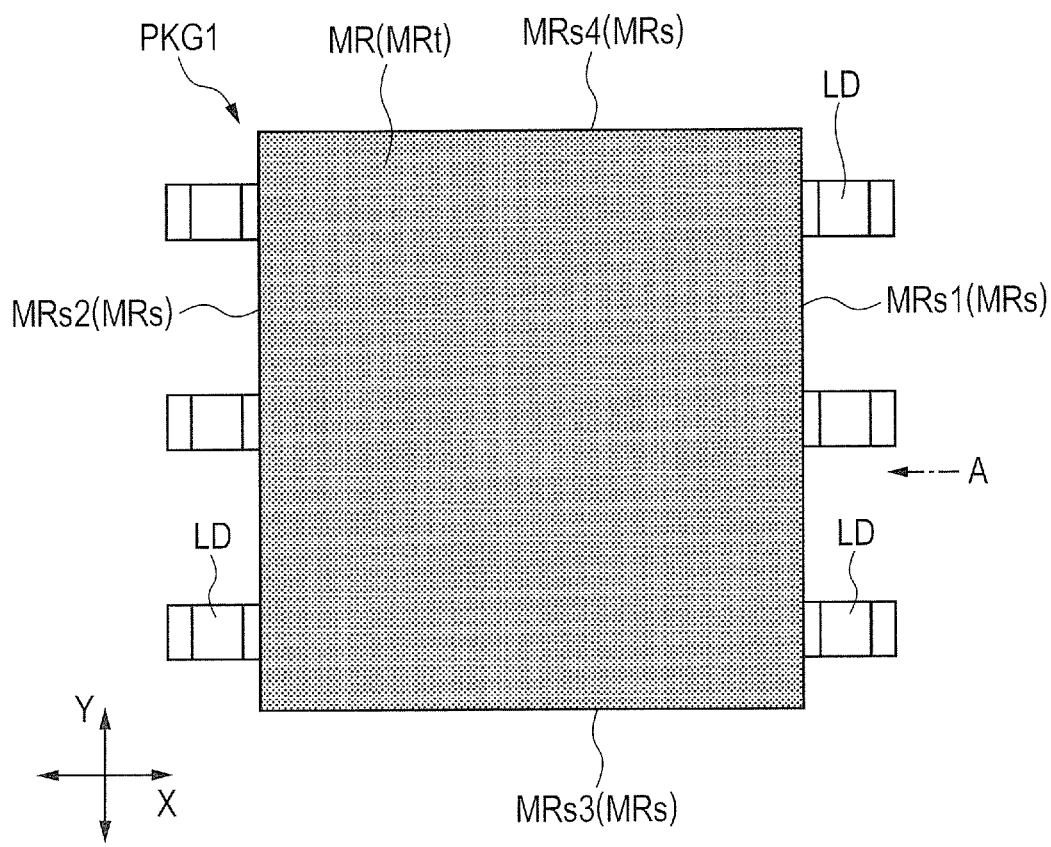
FIG. 1 is a top view of a semiconductor device as an embodiment.

[Explanation of Description Form, Basic Terminology, and Use Thereof in Present Invention]

In the present invention, if necessary for the sake of convenience, an embodiment will be described by being divided into a plurality of sections or the like. However, they are by no means independent of or distinct from each other unless particularly explicitly described otherwise, and one of the individual parts of a single example is details, modifications, and so forth of part or the whole of the others irrespective the order in which they are described. In principle, a repetitive description of like parts will be omitted. Also, each component in the embodiment is not indispensable unless particularly explicitly described otherwise, unless the component is theoretically limited to a specific number, or unless it is obvious from the context that the component is indispensable.

Likewise, even when such wording as "X comprised of A" is used in association with a material, a composition, or the like in the description of the embodiment or the like, it is not intended to exclude a material, a composition, or the like which contains an element other than A unless particularly explicitly described otherwise or unless it is obvious from the context that it excludes such a material, a composition, or the like. For example, when a component is mentioned, the wording means "X containing A as a main component" or the like. It will be appreciated that, even when a "silicon member" or the like is mentioned, it is not limited to pure silicon, and a member containing a SiGe (silicon germanium) alloy, another multi-element alloy containing silicon as a main component, another additive, or the like is also included. Additionally, even when a gold plating, a Cu layer, a nickel plating, or the like is mentioned, it is assumed to include not only a pure gold plating, a pure Cu layer, a pure nickel plating, or the like, but also a member containing gold, Cu, nickel, or the like as a main component unless it is particularly explicitly described otherwise.

Further, when a specific numerical value or numerical amount is mentioned, it may be either more or less than the specific numerical value unless particularly explicitly described otherwise, unless the numerical value or numerical amount is theoretically limited to the number, or unless it is obvious from the context that the numeral value or numerical amount is limited to the number.

In the individual drawings for the embodiment, the same or like parts are designated by the same or similar symbols or reference numerals, and the description thereof will not be repeated in principle.

In the present invention, the term "upper surface" or "lower surface" may be used to mean that the upper and lower surfaces are surfaces located opposite to each other. Since semiconductor packages are mounted in various forms, there may be a case where, e.g., after the mounting of a semiconductor package, the upper surface is arranged below the lower surface. In the embodiment described below, in the manufacturing process of a semiconductor device, the semiconductor device is assembled mainly in a state where the top surface of a semiconductor chip corresponding to the main surface (surface where a semiconductor element is formed) thereof is located above the back surface thereof. Accordingly, a description will be given on the assumption that the top surface of the semiconductor chip corresponds to the upper surface and the back surface of the semiconductor chip located opposite to the top surface corresponds to the lower surface.

In the accompanying drawings, hatching or the like may be omitted even in a cross section when hatching or the like results in complicated illustration or when the distinction between a portion to be illustrated with hatching and a vacant space is distinct. In relation thereto, even when a hole is two-dimensionally closed, the background outline thereof may be omitted in such a case where it is obvious from the description or the like that the hole is two-dimensionally closed. On the other hand, even though not shown in a cross section, a portion other than a vacant space may be illustrated with hatching or a dot pattern to clearly show that the portion with hatching or a dot pattern is not a vacant space or clearly show the boundary of a region.

The technique described in the following embodiment is applicable to semiconductor devices of various package types which are manufactured using lead frames. In the present embodiment, by way of example, a description will be given of a form in which the technique is applied to a SOP (Small Outline Package) semiconductor device in which a plurality of leads serving as external terminals protrude from each of the long side surfaces of a sealing body facing each other.

<Semiconductor Device>

Figure 2:
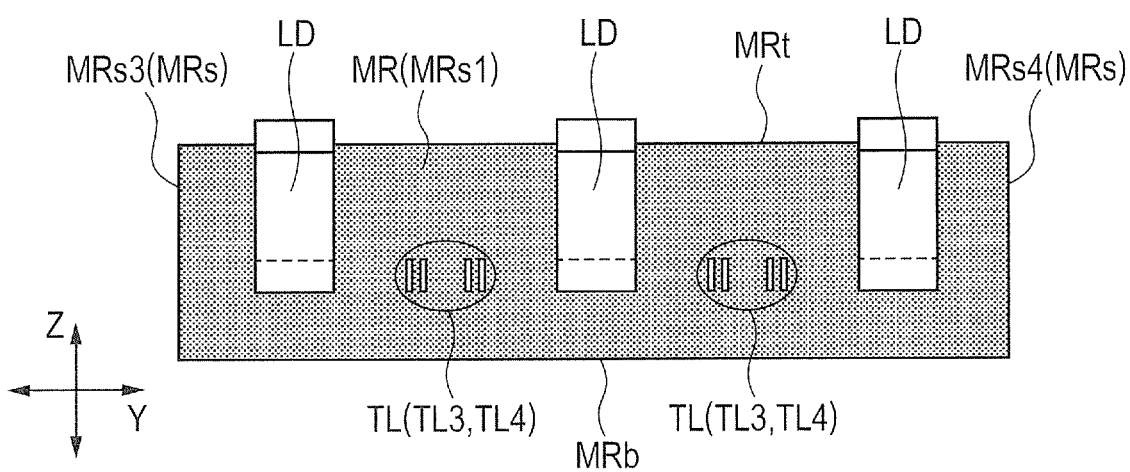
FIG. 2 is a side view obtained by viewing the semiconductor device in the direction of the arrow A shown in FIG. 1.
Figure 3:
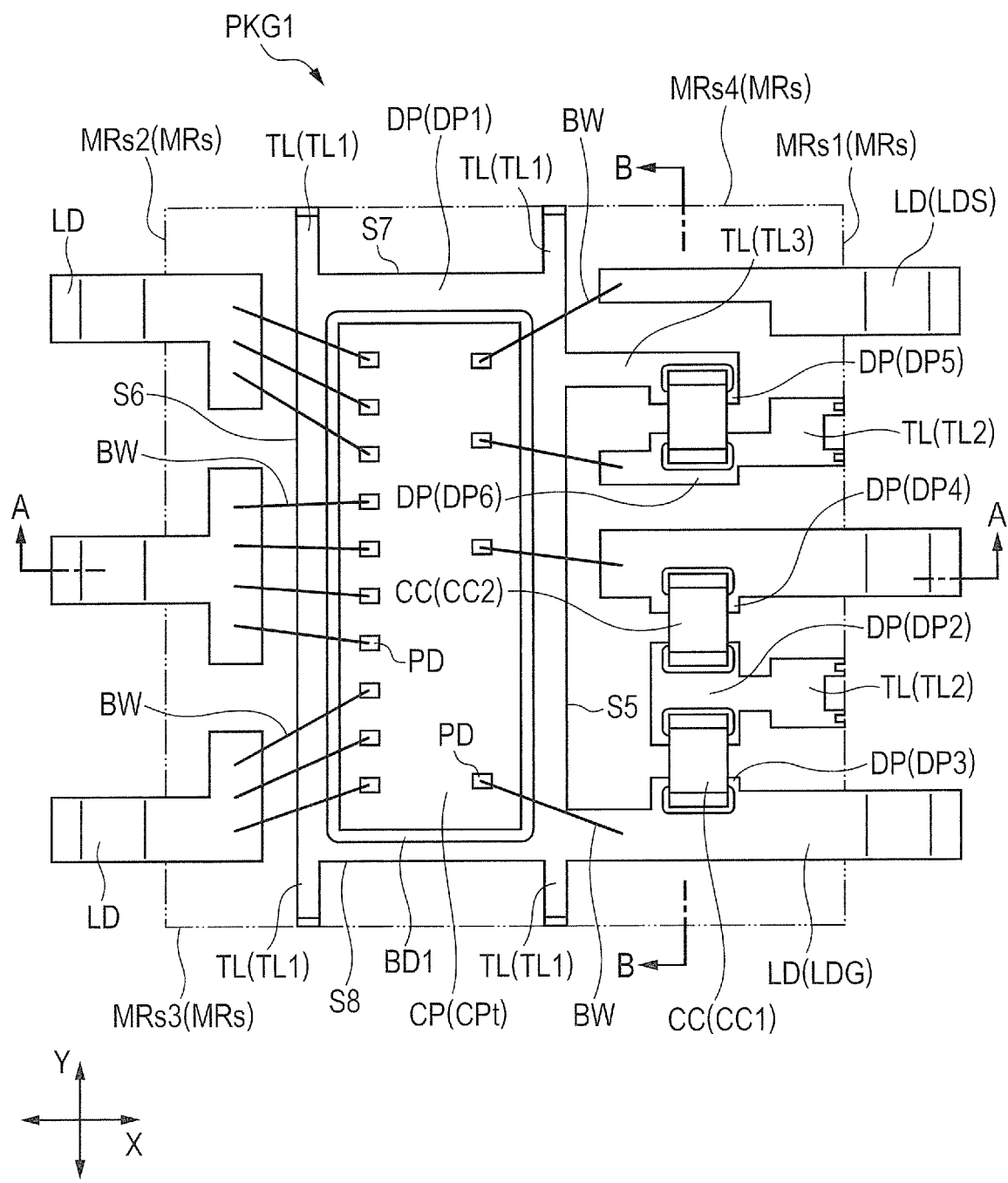
FIG. 3 is a perspective plan view showing an inner structure of the semiconductor device in a state where the sealing body shown in FIG. 1 is removed.
Figure 4:
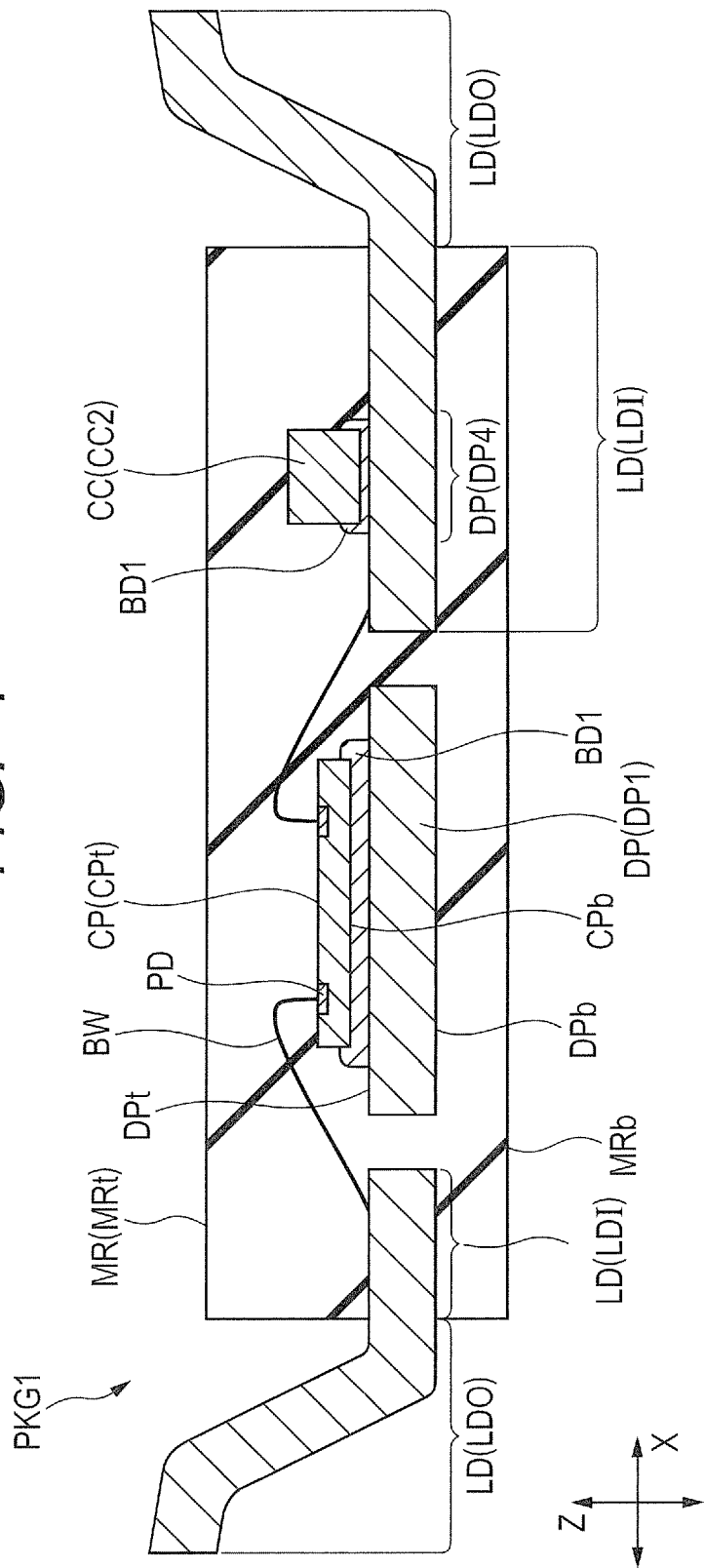
FIG. 4 is a cross-sectional view along the line A-A in FIG. 3.
Figure 5:
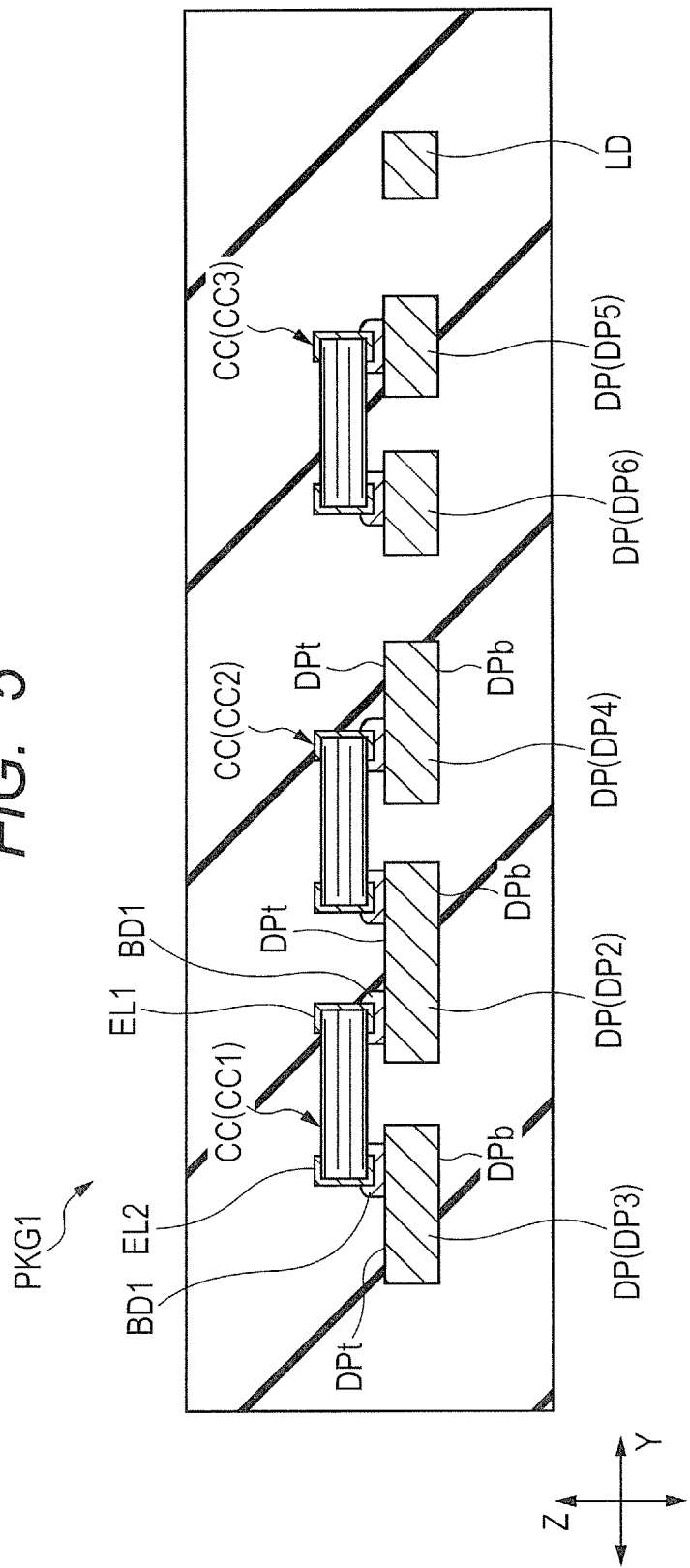
FIG. 5 is a cross-sectional view along the line B-B in FIG. 3.

First, using FIGS. 1 to 5, the outline of a configuration of a semiconductor device PKG1 in the present embodiment will be described. FIG. 1 is a top view of the semiconductor device in the present embodiment. FIG. 2 is a side view obtained by viewing the semiconductor device in the direction of the arrow A shown in FIG. 1. FIG. 3 is a perspective plan view showing an inner structure of the semiconductor device in a state where the sealing body shown in FIG. 1 is removed. FIG. 4 is a cross-sectional view along the line A-A in FIG. 3. FIG. 5 is a cross-sectional view along the line B-B in FIG. 3.

First, a description will be given of an outer structure of the semiconductor device PKG1. As shown in FIG. 1, the semiconductor device PKG1 in the present embodiment includes a sealing body (resin body) MR and a plurality of leads LD exposed from side surfaces MRs of the sealing body. The sealing body MR has a quadrilateral shape in plan view. In plan view, the sealing body MR has a side surface (side edge) MRs1 extending along a Y-direction, a side surface (side edge) MRs2 opposite to the side surface MRs1, a side surface (side edge) MRs3 extending along an X-direction, and a side surface (side edge) MRs4 opposite to the side surface MRs3. The X-direction and the Y-direction cross each other. In the example shown in FIG. 1, the X-direction and the Y-direction are orthogonal to each other. However, in a modification, the X-direction and the Y-direction may also cross each other at an angle other than 90°.

Also, in plan view, the plurality of leads LD protrude from each of the side surfaces MRs1 and MRs2, which are among the four side surfaces of the sealing body MR, toward the outside of the sealing body MR. Such a form as used in the semiconductor device PKG1, in which the leads LD protrude from each of the two oppositely located side surfaces among the four side surfaces of the sealing body MR, is referred to as a SOP semiconductor device (semiconductor package). In the example shown in FIG. 1, the three leads LD protrude from each of the side surfaces MRs1 and MRs2. However, the number of the leads LD and the positions where the leads LD protrude have various modifications in addition to those in the form shown in FIG. 1. For example, the number of the leads LD protruding from one of the side surfaces MRs may be not more than 2 or not less than four. Alternatively, a so-called QFP (Quad Flat Package) semiconductor device may also be used in which the leads LD protrude from all the four side surfaces of the sealing body MR.

As shown in FIG. 2, the sealing body MR has an upper surface (surface or main surface) MRt and a lower surface MRb located opposite to the upper surface MRt. In side view, each of the plurality of leads LD protrudes from the side surface MRs of the sealing body MR between the upper and lower surfaces MRt and MRb of the sealing body MR. In other words, each of the plurality of leads LD has an inner lead portion LDI (see FIG. 4) as the portion to be sealed in the sealing body MR and an outer lead portion LDO (see FIG. 4) as the portion to be exposed from the sealing body MR. In the example of the present embodiment, as shown in FIG. 4, each of the plurality of leads LD (specifically, the outer lead portion of the lead LD) has a bent portion which is bent from the lower surface MRb side toward the upper surface MRt side in the thickness direction (Z-direction shown in FIG. 4) of the semiconductor device PKG1, and the front end portions of the leads LD are located above the upper surface MRt. The front end portions of the leads LD are connected to the terminals of a mounting substrate not shown to allow the semiconductor device PKG1 to be mounted over the mounting substrate. Note that the shape of each of the leads LD has various modifications. For example, it may be possible that the outer lead portion (not shown) of a lead in a modification has a bent portion which is bent from the upper surface MRt side toward the lower surface MRb in the thickness direction of the semiconductor device PKG1, and the front end portions of the leads LD are located below the lower surface MRb. Alternatively, it may also be possible that the outer lead portion (not shown) in another modification has no bent portion.

As also shown in FIG. 2, a plurality of suspension leads TL are exposed at the side surface MRs1 of the sealing body MR. Each of the plurality of suspension leads TL is arranged between the plurality of leads LD at the side surface MRs1. The suspension leads TL are members which support component mounting portions DP during the manufacturing process of the semiconductor device PKG1. Note that, as shown in FIG. 3, a plurality of suspension leads TL1 extend toward the side surfaces MRs3 and MRs4 of the sealing body MR. Accordingly, at the side surfaces MRs3 and MRs4 of the sealing body MR, the suspension leads TL1 are exposed, though the illustration thereof is omitted. On the other hand, at the side surface MRs2 of the sealing body MR, the suspension leads TL are not arranged. Accordingly, at the side surface MRs2 of the sealing body MR, the suspension leads TL are not exposed, though the illustration thereof is omitted. However, in a modification, the plurality of suspension leads TL may also be exposed at the side surface MRs2.

Over each of the portions of the leads LD which are exposed from the sealing body MR (i.e., outer lead portions), a metal film not shown is formed. The metal film is made of, e.g., a solder film formed by a plating method and has the function of improving the wettability of a bonding material when the leads LD are bonded to the terminals of the mounting substrate not shown. The metal film is formed over each of the upper, lower, and side surfaces of the outer lead portion of each of the leads LD.

<Inner Structure>

Next, a description will be given of the inner structure of the semiconductor device PKG1. As shown in FIG. 3, the semiconductor device PKG1 in the present embodiment is a semiconductor package in which a plurality of electronic components (chip components) including the semiconductor chip CP are embedded. In the example shown in FIG. 3, the semiconductor device PKG1 has a plurality of (three in FIG. 3) capacitors (capacitive elements, chip capacitors, electronic components, or chip components) CC in addition to the semiconductor chip CP.

The semiconductor chip CP and the plurality of capacitors CC are mounted over the component mounting portions DP. As shown in FIGS. 4 and 5, each of the plurality of component mounting portions DP has an upper surface DPt and a lower surface DPb located opposite to the upper surface DPt. Each of the semiconductor chip CP and the plurality of capacitors CC is mounted over the upper surface DPt of the component mounting portion DP. Specifically, the semiconductor chip CP is mounted over a component mounting portion (die pad, semiconductor chip mounting portion, or tab) DP1. The semiconductor chip CP is mounted at the center of the component mounting portion DP1. Among the plurality of capacitors CC, a capacitor CC1 is mounted over component mounting portions DP2 and DP3. In plan view, the capacitor CC1 strides over the component mounting portions DP2 and DP3. An electrode EL1 (see FIG. 5) of the capacitor CC1 is connected to the component mounting portion DP2 via a bonding material BD1, while another electrode EL2 (see FIG. 5) of the capacitor CC1 is connected to the component mounting portion DP3 via the bonding material BD1. Also, among the plurality of capacitors CC, a capacitor CC2 is mounted over the component mounting portion DP2 and a component mounting portion DP4. In plan view, the capacitor CC2 strides over the component mounting portions DP2 and DP4. An electrode of the capacitor CC2 is connected to the component mounting portion DP2, while another electrode of the capacitor CC2 is connected to the component mounting portion DP4.

As also shown in FIG. 5, among the plurality of capacitors CC, a capacitor CC3 is mounted over component mounting portions DP5 and DP6. In plan view, the capacitor CC3 strides over the component mounting portions DP5 and DP6. An electrode of the capacitor CC3 is connected to the component mounting portion DP5, while another electrode of the capacitor CC3 is connected to the component mounting portion DP6.

Each of the semiconductor chip CP and the plurality of capacitors CC is fixed onto the component mounting portions DP each via the bonding material (die bonding material, conductive bonding material, or conductive resin bonding material) BD1. As shown in FIG. 4, the semiconductor chip CP is mounted over the component mounting portion DP1 via the bonding material BD1 with a back surface CPb thereof facing the upper surface DPt of the component mounting portion DP1. That is, the semiconductor chip CP is mounted in accordance with a so-called face-up mounting method which causes the surface (back surface CPb) of the semiconductor chip CP opposite to a top surface (main surface) CPt thereof where a plurality of pads PD are formed to face the chip mounting surface (upper surface DPt).

The bonding material BD1 is a resin containing a plurality of (a large number of) conductive particles and has the function of bonding the chip components to the component mounting portions DP and electrically connecting the electrodes of the chip components with the component mounting portions DP. Accordingly, in the example shown in FIG. 5, the respective electrodes of the capacitors CC are electrically connected with the component mounting portions DP each via the bonding material BD1. Examples of the conductive resin bonding material in which a large number of conductive particles are mixed in the resin bonding material include a silver (Ag) paste.

Note that, in the case where electrodes are formed over the back surface CPb of the semiconductor chip CP in a modification of the present embodiment, the electrodes over the back surface CPb of the semiconductor chip CP are electrically connected with the component mounting portion DP1 each via the bonding material BD1. For example, when potentials such as a reference potential and a power supply potential are supplied to the component mounting portion DP1, the foregoing potentials may be supplied via the electrodes formed over the back surface CPb of the semiconductor chip CP. In the example of the present embodiment, over the back surface CPb of the semiconductor chip CP, no electrode is formed. Accordingly, to the internal circuit of the semiconductor chip CP, a potential and a signal are supplied via the pads PD as a plurality of electrodes formed over the top surface CPt. For example, as shown in FIG. 3, to the component mounting portion DP1, the reference potential (low-side potential) is supplied via a lead LDG. However, in the case of the present embodiment, no electrode is formed over the back surface CPb of the semiconductor chip CP. Accordingly, the reference potential (low-side potential) is supplied to the semiconductor chip CP via wires BW connected with the leads LDG and the pads PD connected with the wires BW. Accordingly, in a modification, the bonding material BD1 bonding the semiconductor chip CP to the component mounting portion DP1 need not contain conductive particles.

Each of the plurality of component mounting portions DP is connected with the suspension leads TL or the leads LD. In the manufacturing process of the semiconductor device PKG1, at least during the period until the plurality of component mounting portions DP are sealed in the sealing body MR, each of the plurality of component mounting portions DP is supported by an outer frame (frame portion) LFf of a lead frame LF1 shown in FIG. 20 described later via the leads LD or the suspension leads TL.

The semiconductor chip CP is electrically connected with the plurality of leads LD via the plurality of wires BW. Each of the plurality of wires BW has one end portion bonded to the pad (electrode or electrode pad) PD of the semiconductor chip CP and the other end portion bonded to the bonding area of the lead LD.

As shown in FIG. 3, the two-dimensional shape of the semiconductor chip CP mounted over the component mounting portion DP1 is a quadrilateral. As shown in FIG. 4, the semiconductor chip CP has the top surface (main surface or upper surface) CPt, the back surface (main surface or lower surface) CPb opposite to the top surface CPt, and side surfaces located between the top surface CPt and the back surface CPb. As also shown in FIGS. 3 and 4, over the top surface CPt of the semiconductor chip CP, the plurality of pads (bonding pads) PD are formed. In the present embodiment, the plurality of pads PD are formed along each of the side edges of the top surface CPt. In the main surface of the semiconductor chip CP (specifically, a semiconductor element formation region provided in the upper surface of the base material (semiconductor substrate) of the semiconductor chip CP), a plurality of semiconductor elements (circuit elements) are formed, though the illustration thereof is omitted. The plurality of pads PD are electrically connected with the semiconductor elements via wires (the illustration thereof is omitted) formed in a wiring layer arranged in the semiconductor chip CP (specifically, between the top surface CPt and the semiconductor element formation region not shown).

The semiconductor chip CP (specifically, the base material of the semiconductor chip CP) is made of, e.g., silicon (Si). Over the top surface CPt, an insulating film covering the base material of the semiconductor chip CP and the wires in the semiconductor chip CP are formed. The respective top surfaces of the plurality of pads PD are exposed from the insulating film through openings formed in the insulating film. Each of the pads PD is made of a metal. In the present embodiment, each of the pads PD is made of, e.g., aluminum (Al) or an alloy containing aluminum as a main component.

Each of the plurality of component mounting portions DP, the plurality of leads LD, and the plurality of suspension leads TL is made of the same metal material. In the present embodiment, these members are made of, e.g., copper (Cu) or an alloy containing copper as a main component. Each of the plurality of component mounting portions DP, the plurality of leads LD, and the plurality of suspension leads TL forms a part of the lead frame which is formed by performing a patterning process on a metal plate containing copper as a main component, though the details thereof will be described later.

The metal material forming each of the plurality of component mounting portions DP, the plurality of leads LD, and the plurality of suspension leads TL has various modifications. For example, it may be possible that the metal material containing copper as a main component is used as a base material and the top surface of the base material is covered with a film made of another metal. For example, in the case where each of the outer lead portions LDO (see FIG.

4) is covered with a solder film, when the semiconductor device PKG1 is mounted over the mounting substrate, the wettability of a solder with respect to the leads LD is improved. Alternatively, it may also be possible that, in the vicinity of the regions (wire bonding areas) of the top surface of the base material containing copper as a main component with which the wires BW are to be connected, a film made of another metal (e.g., silver (Ag) film) is selectively formed. When a metal film made of a metal material which is likely to form an alloy layer with the metal material (e.g., gold (Au), aluminum (Al), or copper (Cu)) forming the wires BW is formed over each of the wire bonding areas, the reliability of connection between the wires BW and the leads LD can be improved. Still alternatively, the entire top surface of the base material may also be covered with a film made of a metal different from that forming the base material. For example, in the case where the top surface of the base material containing copper as a main component is covered with a multi-layer film including a nickel (Ni) film, a palladium (Pd) film, and a gold (Au) film, even when a solder film is not formed over each of the outer lead portions LDO, the wettability of a solder is improved. In this case, the wire bonding areas each covered with the foregoing multi-layer film can improve the reliability of connection between the wires BW and the leads LD.

As also shown in FIG. 3, the suspension lead TL or the lead LD is connected to (in other words, coupled to) each of the plurality of component mounting portions DP. As described above, during the manufacturing process of the semiconductor device PKG1, each of the plurality of component mounting portions DP is supported by the suspension lead TL or the lead LD. All the leads LD and majority (suspension leads TL1 and TL2) of the plurality of suspension leads TL have portions exposed from the sealing body MR (see FIG. 1). Note that a suspension lead TL3 connected to the component mounting portion DP5 shown in FIG. 3 has one end portion connected to the component mounting portion DP5 and the other end portion connected to the component mounting portion DP1, but does not have any portion exposed from the sealing body MR. The component mounting portion DP5 is supported by the component mounting portion DP1 via the suspension lead TL3. The details of the suspension leads TL will be described later.

<Circuit Configuration>

Figure 6:
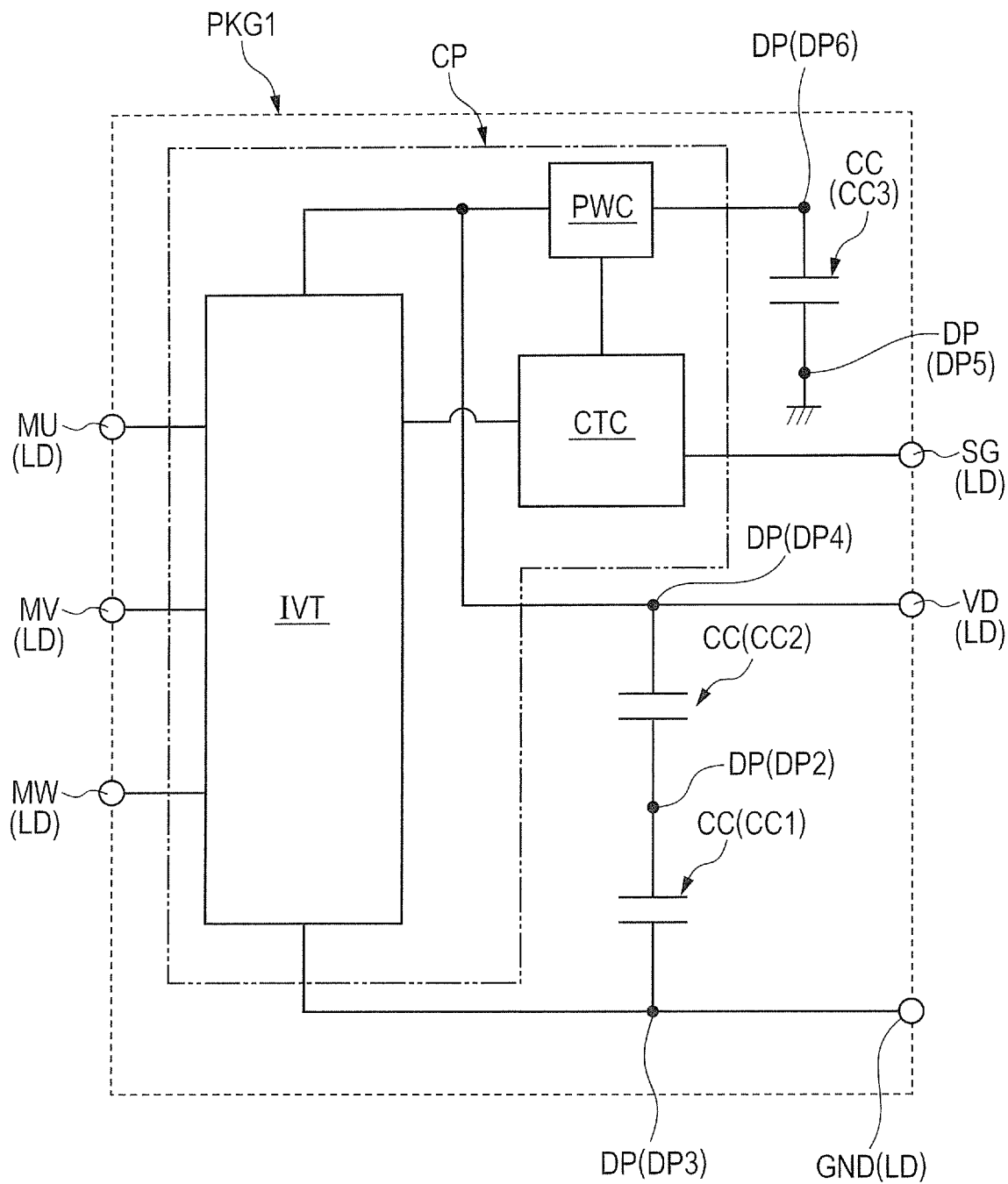
FIG. 6 is a circuit block diagram showing an example of a circuit configuration formed in the semiconductor device shown in FIG. 1.

Next, a description will be given of an example of a configuration of the circuit included in the semiconductor device shown in FIGS. 1 to 5. FIG. 6 is a circuit block diagram showing an example of the circuit configuration formed in the semiconductor device shown in FIG. 1. The semiconductor device PKG1 in the present embodiment is a power semiconductor device in which an inverter IVT as a power conversion circuit and a control circuit CTC which controls the operation of the inverter IVT are embedded. In the example shown in FIG. 6, the inverter IVT is a power conversion device which outputs a 3-phase ac power. Accordingly, the inverter IVT is connected to a terminal MU as a U-phase output terminal, a terminal MV as a V-phase output terminal, and a terminal MW as a W-phase output terminal. The terminals MU, MV, and NW correspond to the leads LD. In the example shown in FIG. 3, the three leads LD exposed from the side surface MRs2 correspond to the terminals MU, MV, and MW.

The inverter IVT is also connected to a terminal (power supply potential terminal or high-side terminal) VD which supplies a relatively high potential (high-side potential) and a terminal (reference potential terminal or low-side terminal) GND which supplies a relatively low potential (low-side potential). In the present embodiment, the low-side potential is, e.g., a ground potential. The terminals VD and GND correspond to the leads LD. In the example shown in FIG. 3, the lead LDG connected to the component mounting portion DP3 corresponds to the terminal GND, while the lead LD connected to the component mounting portion DP4 corresponds to the terminal VD. As shown in FIG. 3, the component mounting portion DP1 over which the semiconductor chip CP is mounted is connected to the lead LDG. Accordingly, when an electrode is formed over the back surface CPb of the semiconductor chip CP shown in FIG. 4 in the modification of the present embodiment as described above, the reference potential (low-side potential) is supplied via the back surface CPb of the semiconductor chip CP. The case where the reference potential is supplied from the entire back surface CPb of the semiconductor chip CP is favorable in that the reference potential is stable. On the other hand, in the case of the present embodiment, no electrode is formed over the back surface CPb of the semiconductor chip CP. Accordingly, the reference potential (low-side potential) is supplied to the semiconductor chip CP via the wire BW connected with the lead LDG and the pad PD connected with the wire BW, as shown in FIG. 3.

With the terminals VD and GND, the capacitors CC1 and CC2 are connected in series. By providing the capacitors CC1 and CC2 in the vicinity of the inverter IVT, it is possible to stabilize the potential difference between the high- and low-side potentials supplied to the inverter IVT.

The inverter IVT is also connected to the control circuit CTC which controls the circuit operation of the inverter IVT. The control circuit CTC is connected to a terminal SG as a signal terminal to which a signal is input from the outside (or which outputs a signal to the outside). In the example shown in FIG. 3, among the plurality of leads LD exposed from the side surface MRs1, a lead LDS located closest to the side surface MRs4 corresponds to the terminal SG.

The control circuit CTC is connected to an internal power supply circuit PWC embedded in the semiconductor chip CP. The internal power supply circuit PWC supplies a power for driving the control circuit CTC. The internal power supply circuit PWC is connected to the capacitor CC3 outside the semiconductor chip CP. By connecting the capacitor CC3 with the internal power supply circuit PWC in the vicinity thereof, it is possible to stabilize the drive voltage supplied from the internal power supply circuit PWC. One of the electrodes of the capacitor CC3 is connected to the internal power supply circuit PWC, while the other electrode thereof is connected to the terminal GND via the component mounting portion DP5.

<Details of Capacitors>

Figure 7:
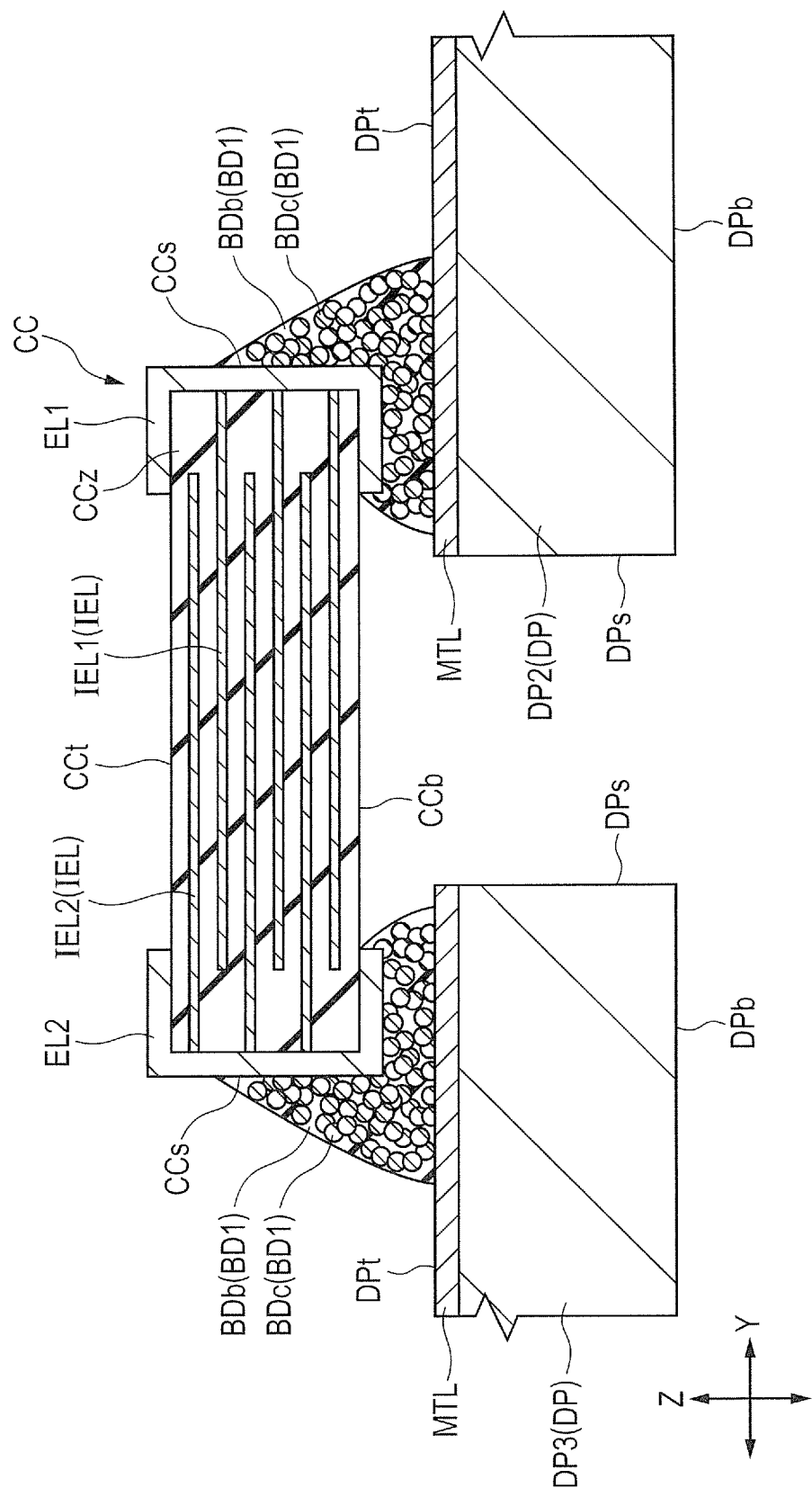
FIG. 7 is an enlarged cross-sectional view showing one of a plurality of capacitors shown in FIG. 5 in enlarged relation.

Next, a description will be given of the details of the capacitors mounted over the component mounting portions. FIG. 7 is an enlarged cross-sectional view showing one of the plurality of capacitors shown in FIG. 5 in enlarged relation. Note that each of the plurality of capacitors CC shown in FIG. 5 has the same structure. In FIG. 7, among the plurality of capacitors CC shown in FIG. 5, the capacitor CC1 is shown as a representative example, and the illustration of enlarged views of the other capacitors CC2 and CC3 is omitted. Also, in FIG. 7, the illustration of the sealing body MR shown in FIG. 5 is omitted.

Figure 8:
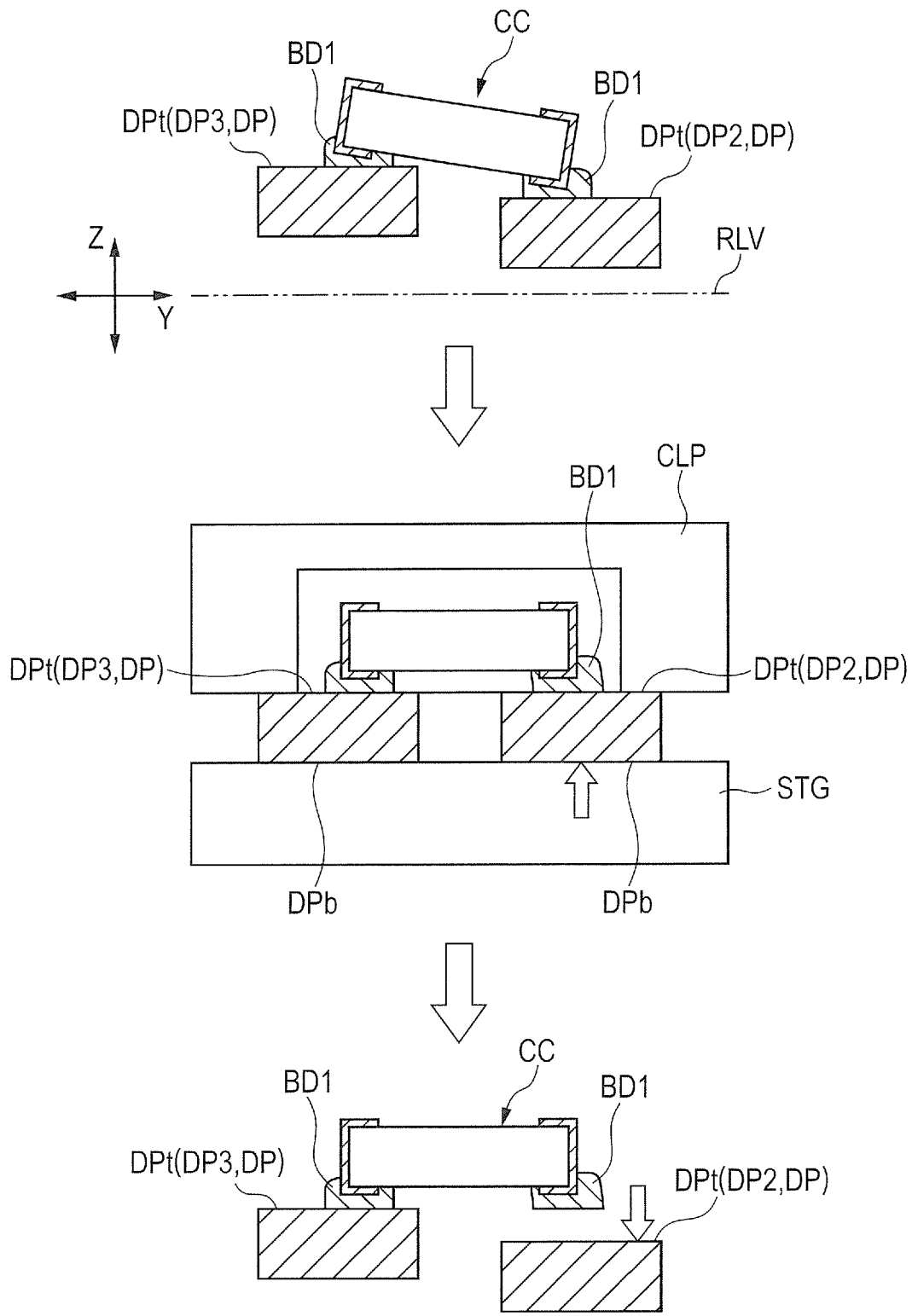
FIG. 8 is an illustrative view schematically showing a mode in which the bonding interface between a chip component and a component mounting portion is detached.

As shown in FIG. 7, the capacitor CC has an upper surface CCt, a lower surface CCb opposite to the upper surface CCt, and side surfaces CCs located between the upper and lower surfaces CCt and CCb. Note that, in the example shown in FIG. 8, the two side surfaces CCs are shown but, as shown in FIG. 3, the capacitor CC has a quadrilateral shape in plan view and has the four side surfaces CCs. Among them, the two side surfaces CCs shown in FIG. 8 are located opposite to each other to form respective portions of the electrodes EL1 and EL2.

The outer size of the capacitor CC is defined by a standard. For instance, examples of the two-dimensional size of the relatively small capacitor CC include a 1005 size (1.0 mm×0.5 mm), a 0603 size (0.6 mm×0.3 mm), and a 0402 size (0.4 mm×0.2 mm). Each of the two-dimensional sizes shown above is given by Length of Long Side Edge× Length of Short Side Edge.

As shown in FIG. 7, the capacitor CC has the electrode (electrode terminal, external electrode, or metal film) EL1 and the electrode (electrode terminal, external electrode, or metal film) EL2 which cover the side surfaces CCs. The capacitor CC also has a plurality of internal electrodes (electrodes) IEL stacked via insulating layers (dielectric layers or insulators) CCz. Specifically, the internal electrodes IEL include internal electrodes IEL1 each connected to the electrode EL1 and internal electrodes IEL2 each connected to the electrode EL2. The internal electrodes IEL1 and IEL2 are alternately stacked via the insulating layers CCz. The capacitor CC includes the electrodes EL1 and EL2 covering the side surfaces CCs as external electrode terminals for extracting the capacitance formed in the internal electrodes IEL1 and IEL2 arranged to face each other via the dielectric material.

Each of the electrodes EL1 and EL2 is a metal film made of a multi-layer metal film in which, e.g., a copper (Cu) film, a nickel (Ni) film, and a tin (Sn) film are stacked in this order. Each of the electrodes EL1 and EL2 covers not only the side surfaces CCs, but also the respective portions of the upper and lower surfaces CCt and CCb which are continued to the side surfaces CCs. The capacitor CC also has the insulating layers CCz covering the internal electrodes IEL between the electrodes EL1 and EL2. The electrodes EL1 and EL2 are insulated from each other by the insulating layers CCz arranged between the electrodes EL1 and EL2.

An electronic component having the electrodes EL1 and EL2 covering the two oppositely located side surfaces CCs among the four side surfaces CCs, such as the capacitor CC in the present embodiment, is referred to as a chip component or a chip-type electronic component. A chip component can easily be surface-mounted via a bonding material such as a solder by forming electrode terminals over the two side surfaces thereof facing each other. Accordingly, a chip-type structure is applied to various passive components (electronic components) such as a resistor component and an inductor component (coil component) in addition to the capacitor components described in the present embodiment.

The capacitor CC is arranged so as to extend over and between the adjacent component mounting portions DP2 and DP3. The electrodes EL1 and EL2 are mounted thereover via the bonding materials BD1. Each of the bonding materials BD1 is a conductive resin made of a resin BDb containing a plurality of conductive particles BDc. As the plurality of conductive particles BDc, e.g., silver (Ag) particles or the like can be used. The resin BDb also contains a thermosetting resin such as, e.g., an epoxy-based resin as a main component. Thus, when the plurality of capacitors CC and the semiconductor chip CP shown in FIG. 3 are mounted over the component mounting portions DP via the bonding materials BD1 containing the thermosetting resin as the main component, the thermosetting resin components contained in the plurality of bonding materials BD1 can simultaneously be cured. This can enhance the efficiency of the manufacturing process.

In the example shown in FIG. 7, over the upper surface DPt of each of the component mounting portions DP2 and DP3, a metal film MTL is formed so as to cover the base material. The metal film MTL is made of, e.g., silver, gold, or the like. The metal film MTL interposed at the bonding interface between each of the bonding materials BD1 and the component mounting portion DP improves the reliability of electrical connection between the bonding material BD1 and the component mounting portion DP.

Note that, as a modification of the bonding material BD1, a solder material may also be used. However, when the back surface CPb of the semiconductor chip CP and the component mounting portion DP1, which are shown in FIG. 4, are electrically connected using a solder material, it is necessary for a material which improves the wettability of the solder, such as a metal film, to be formed over the back surface CPb of the semiconductor chip CP. On the other hand, when a conductive bonding material is used as the bonding material BD1, the conductive bonding material wet-spreads irrespective of the presence or absence of the metal film. This can simplify the structure of the semiconductor chip CP.

<Connection State of Chip Component>

Figure 9:
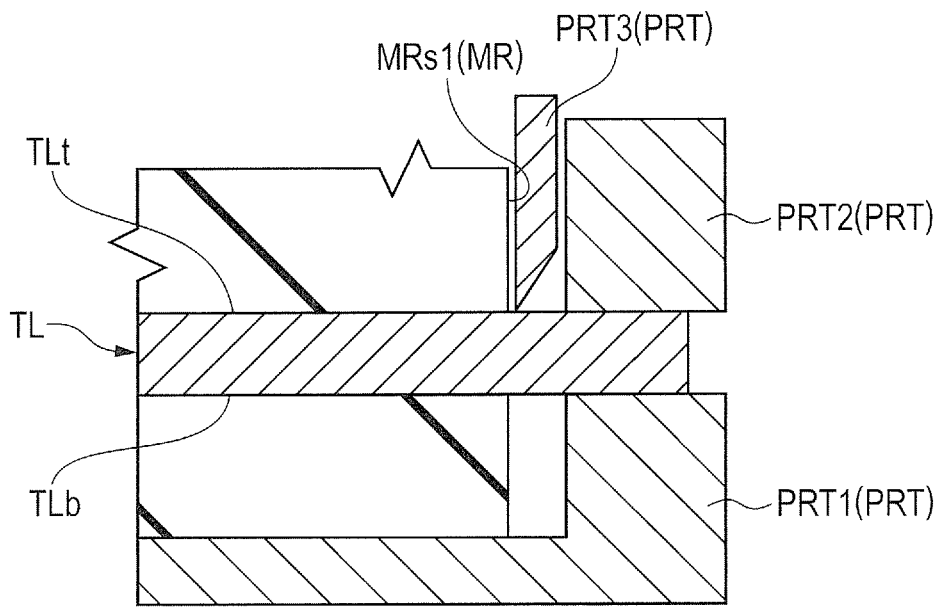
FIG. 9 is an enlarged cross-sectional view showing a state where a suspension lead is cut in the manufacturing process of the semiconductor device shown in FIG. 3.
Figure 10:
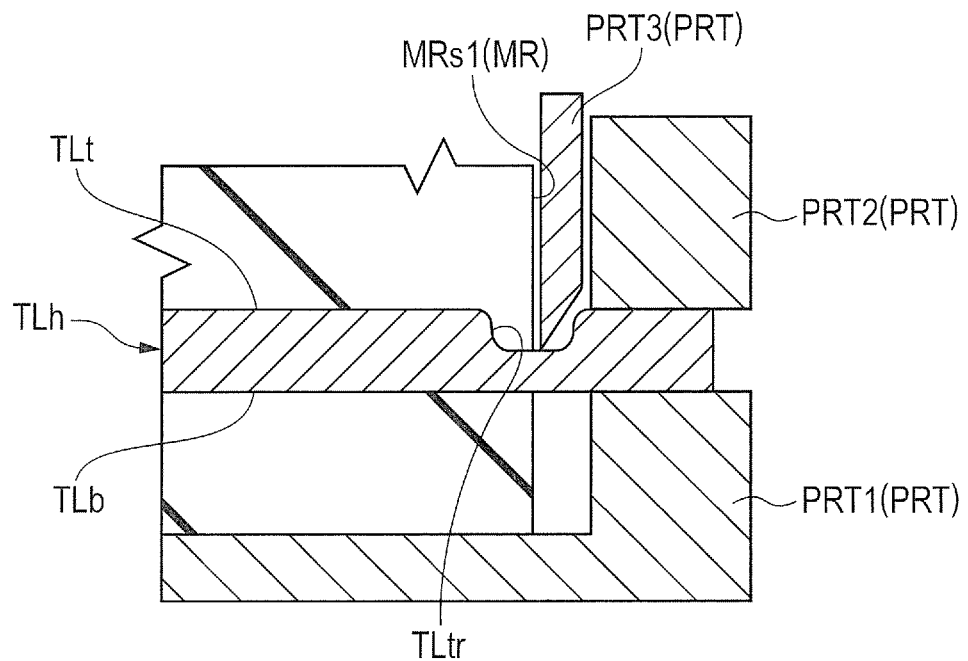
FIG. 10 is an enlarged cross-sectional view showing a state where a suspension lead as a studied example against the suspension lead shown in FIG. 9 is cut.
Figure 11:
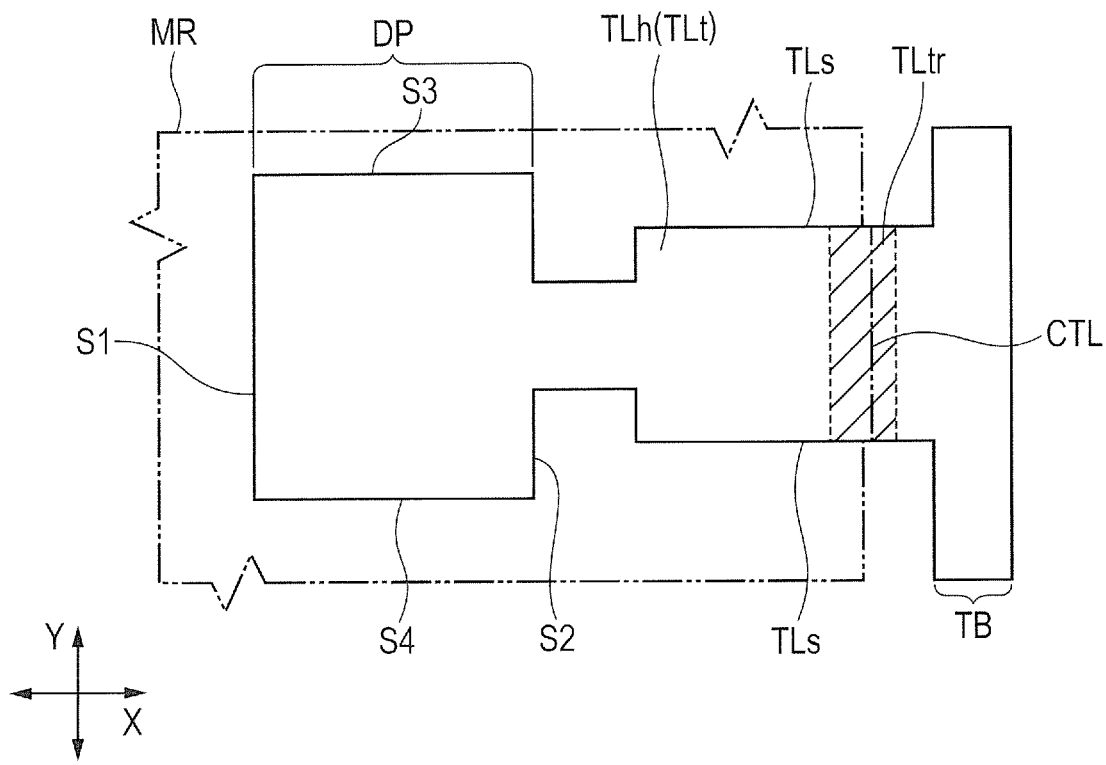
FIG. 11 is a plan view of the suspension lead shown in FIG. 10 before being cut.
Figure 12:
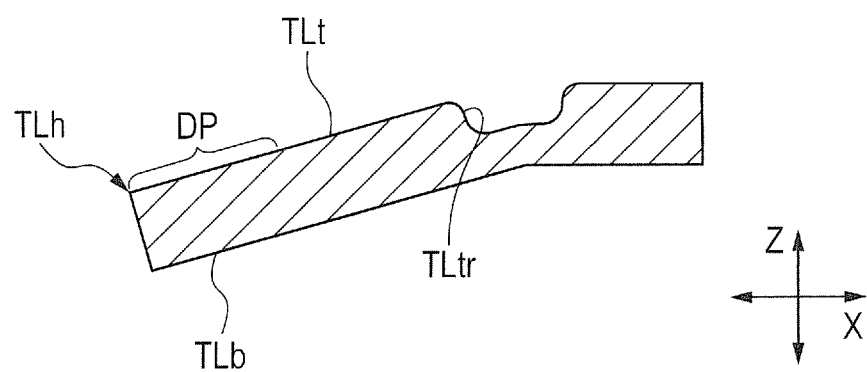
FIG. 12 is a cross-sectional view showing the direction in which the suspension lead shown in FIG. 10 is bent.

Next, a description will be given of the connection state of a chip component such as the capacitor CC when the chip component is mounted over the component mounting portions DP. In the present section, a description will be given first of the manufacturing process steps which are particularly highly related to the state of connection between the chip component and the component mounting portions, while the overall flow of a method of manufacturing the semiconductor device will be described later. FIG. 8 is an illustrative view schematically showing a mode in which the bonding interface between the chip component and the component mounting portions is detached. FIG. 9 is an enlarged cross-sectional view showing a state where the suspension lead is cut in the manufacturing process of the semiconductor device shown in FIG. 3. FIG. 10 is an enlarged cross-sectional view showing a state where the suspension lead as a studied example against the suspension lead shown in FIG. 9 is cut. FIG. 11 is a plan view before the suspension lead shown in FIG. 10 is cut. FIG. 12 is a cross-sectional view showing the direction in which the suspension lead shown in FIG. 10 is bent.

As a result of conducting a study, the present inventors have found that, when a chip component such as the capacitor CC is mounted over and between the plurality of component mounting portions DP independent of each other, due to the strength of bonding to each of the component mounting portions DP and the supporting strength of the component mounting portion DP, the bonding interface between the chip component and the component mounting portion DP may be detached.

For example, as shown in the upper part of FIG. 8, in the case where the height of the upper surface DPt of the component mounting portion DP2 is different from the height of the upper surface DPt of the component mounting portion DP3, when the capacitor CC is mounted over and between the component mounting portions DP2 and DP3, the capacitor CC is mounted in a state where the capacitor CC is inclined with respect to a horizontal direction (e.g., the Y-direction in FIG. 8) over the component mounting portions DP. When the suspension lead TL (see FIG. 3) connected to the component mounting portion DP2 or the lead LD (see FIG. 3) connected to the component mounting portion DP3 is partially bent, as shown in FIG. 8, the height of the upper surface DPt of the component mounting portion DP2 may be different from the height of the upper surface DPt of the component mounting portion DP3.

As shown next in the middle part of FIG. 8, when each of the component mounting portions DP2 and DP3 is interposed between a stage STG and a clamper (clamp tool or fixing jig) CLP, the height difference between the respective upper surfaces DPt of the component mounting portions DP2 and DP3 is forced to be smaller than that before each of the component mounting portions DP2 and DP3 is held between the stage STG and the clamper CLP. Examples of the step of holding each of the component mounting portions DP2 and DP3 between the stage STG and the clamper CLP include a wire bonding step described later. At this time, to the bonding interface between the capacitor CC and the component mounting portion DP, i.e., to the bonding interface between the upper surface DPt of the component mounting portion DP2 and the bonding material BD1 which is upwardly raised in the case of the example shown in FIG. 8, a large stress is applied.

As shown next in the lower part of FIG. 8, when the forced fixation using the stage STG and the clamper CLP is removed, the component mounting portion DP tends to return to the original state. That is, in the case of the example shown in FIG. 8, a force is applied in the direction in which the component mounting portion DP2 downwardly moves. At this time, to the bonding interface between the capacitor CC and the component mounting portion DP, particularly to the bonding interface between the upper surface DPt of the component mounting portion DP2 and the bonding material BD1 in the case of the example shown in FIG. 8, an additional force is applied. As a result, at the portion to which a stress exceeding the bonding strength is applied, the bonded state is destroyed. The example shown in FIG. 8 shows an embodiment in which detachment occurs at the bonding interface between the bonding material BD1 and the component mounting portion DP2. However, the portion where the bonded state is destroyed has various embodiments. For example, when a large stress is applied to the bonding interface between the electrode of the capacitor CC and the bonding material BD1, detachment may occur at the bonding interface between the electrode of the capacitor CC and the bonding material BD1. Also, when, e.g., a large stress is applied to the inside of the bonding material BD1, a part of the bonding material BD1 may undergo fracture. Also, when, e.g., a relatively large stress is applied to the respective portions of the component mounting portion DP3 and the capacitor CC which are bonded and fixed to each other, detachment or fracture may occur in the respective portions of the component mounting portion DP3 and the capacitor CC which are bonded to each other.

Since the capacitor CC is electrically connected to the component mounting portion DP via the bonding material BD1, when the bonded state between the electrode of the capacitor CC and the component mounting portion DP is destroyed, it may cause the degradation of the electric characteristics of the capacitor CC or defective conduction in the circuit. Accordingly, the present inventors have conducted a study on a technique which prevents the destruction of the respective bonded portions of the electrode of the capacitor CC and the component mounting portion DP.

First, to prevent the destruction of the respective bonded portions of the electrode of the capacitor CC and the component mounting portion DP, it is preferable that, when the capacitor CC is mounted over and between the component mounting portions DP2 and DP3, the height difference between the respective upper surfaces DPt of the component mounting portions DP2 and DP3 relative to a reference plane RLV (see FIG. 8) in a horizontal direction is small. As one of main factors which cause such a height difference between the upper surfaces DPt as shown in the upper part of FIG. 8, the bending of a portion of the suspension lead TL (see FIG. 3) or the lead LD (see FIG. 3) connected to the component mounting portion DP can be listed. Accordingly, by enhancing the strength of the suspension lead TL or the lead LD and thus preventing the bending deformation thereof, it is possible to prevent the destruction of the respective bonded portions of the electrode of the capacitor CC and the component mounting portion DP.

In terms of enhancing the supporting strength of the suspension lead TL or the lead LD, a method can be used which increases the width of the suspension lead TL or the lead LD and increases the thickness thereof. For example, in the example shown in FIG. 3, at the boundary between the inner lead portion LDI (see FIG. 4) and the outer lead portion LDO (see FIG. 4), the width (length in the Y-direction) of each of the plurality of leads LD is about 0.5 mm to 0.8 mm. Also, at the boundary between the inner lead portion LDI and the outer lead portion LDO which are shown in FIG. 4, the thickness (length in the Z-direction) of each of the plurality of leads LD is about 0.25 mm. When the lead LD has such cross-sectional dimensions as shown above, the bending deformation of the lead LD does not occur. Therefore, it can be considered that each of the plurality of leads LD has cross-sectional dimensions which are satisfactory in terms of preventing bending deformation.

Among the plurality of leads LD shown in FIG. 3, the lead LDG connected to the component mounting portion DP3 has the inner lead portion LDI (see FIG. 4) having the front end connected to the component mounting portion DP1. Accordingly, the supporting strength of the lead LDG is particularly high compared with that of each of the other leads LD.

However, when the cross-sectional area of the lead LD or the suspension lead TL is increased, the lead LD or the suspension lead TL is less likely to be cut in the step of cutting the lead LD or the suspension lead TL. For example, when the suspension lead TL is cut in the vicinity of the side surface MRs of the sealing body MR as shown in FIG. 9, a cutting jig (cutting tool, jig, or tool) PRT is pressed against the portion of the suspension lead TL which is exposed from the sealing body MR to cut the suspension lead TL. In the example shown in FIG. 9, the cutting jig PRT includes dies PRT1 and PRT2 as a fixing jig (clamp tool) and a punch PRT3 as a cutting blade. In the cutting step, the dies PRT1 and PRT2 are respectively pressed against the lower and upper surfaces TLb and TLt of the suspension lead TL to hold the suspension lead TL therebetween, and then the suspension lead TL is cut using the punch PRT3. In the embodiment shown in FIG. 9, the punch PRT3 is moved from the upper surface TLt of the suspension lead TL toward the lower surface TLb thereof to cut the suspension lead TL. However, in a modification, the punch PRT3 may also be moved from the lower surface TLb of the suspension lead TL toward the upper surface TLt thereof. A cutting method as described above will be hereinafter referred to as press cutting.

When press cutting is performed, to the vicinity of the portion to be cut or to-be-cut portion, an external force is applied from the cutting jig PRT. When the to-be-cut portion has a large cross-sectional area, a large force is required for cutting. The magnitude of the external force applied from the cutting jig PRT is proportional to the cross-sectional area of the to-be-cut portion. As shown in FIG. 9, when the to-be-cut portion is located in the vicinity of the sealing body MR, depending on the magnitude of the external force applied from the cutting jig PRT, a part of the external force may be transmitted to the sealing body MR to possibly damage the sealing body MR. Accordingly, when the suspension lead TL is cut by press cutting in the vicinity of the sealing body MR, it is preferable to reduce the cross-sectional area of the to-be-cut portion and thus prevent the sealing body MR from being damaged.

In view of this, the present inventors have conducted a study on the embodiment in which, as a means for reducing the cross-sectional area of the to-be-cut portion, a trench portion TLtr is provided along the extending direction of the portion of a suspension lead TLh which is to be cut, such as the suspension lead TLh in a studied example shown in FIGS. 10 to 12. In FIG. 11, the region sealed in the sealing body MR is enclosed by the two-dot dash line, and a cut line CTL (imaginary line) as the portion to be cut by press cutting is shown by the one-dot dash line. The region where the trench portion TLtr is provided is hatched to be discriminated from the other portion.

As shown in FIGS. 10 to 12, the suspension lead TLh is different from the suspension lead TL in the present embodiment in that the trench portion TLtr is provided in the suspension lead TLh to extend from one of side surfaces TLs to the other side surface TLs along the cut line CTL (see FIG. 11) as the to-be-cut portion. The trench portion TLtr is formed by a so-called half-etching process in which a suspension lead is etched to a depth equivalent to half the thickness of the suspension lead. The thickness of the portion of the suspension lead TLh where the trench TLtr is formed is about half the thickness of the other portion (portion where the trench portion TLtr is not formed) of the suspension lead TLh.

The portion of the suspension lead TLh which is to be cut by press cutting is allowed to have a cross-sectional area smaller than that of the portion of a suspension lead (the illustration thereof is omitted) unprovided with the trench portion TLtr which is to be cut by press cutting. However, the region of the suspension lead TLh where the trench portion TLtr is provided has a supporting strength lower than that of the other portion of the suspension lead TLh. In particular, as shown in FIG. 12, the suspension lead TLh is likely to undergo bending deformation such that the front end portion of the suspension lead TLh connected to the component mounting portion DP begins to bend downward at the trench portion TLtr to be located below the trench portion TLtr. Accordingly, when the suspension lead TLh shown in FIGS. 10 to 12 is used as the suspension lead to be connected to the component mounting portion DP2 shown in FIG. 3, the height difference between the respective upper surfaces DPt of the component mounting portions DP2 and DP3 relative to the reference plane RLV (see FIG. 8) in the horizontal direction tends to increase. In other words, when any of the plurality of component mounting portions DP is connected to the suspension lead TLh, the bonded state between the chip component and the component mounting portion DP is likely to be destroyed.

Note that, in the case of the present embodiment, each of the suspension leads TL1 shown in FIG. 3 has the same structure as that of the suspension lead TLh shown in FIGS. 10 and 11. That is, each of the plurality of suspension leads TL1 has the trench portion TLtr (see FIG. 11) at the boundary between the sealed portion thereof sealed in the sealing body MR (see FIG. 1) and the exposed portion thereof exposed from the sealing body MR. The trench portion TLtr extends so as to traverse a widthwise direction (X-direction) of the suspension lead TL1 which is orthogonal to the Y-direction as the extending direction of the suspension lead TL1. In other words, the trench portion TLtr extends from one of the side surfaces of the suspension lead TL1 to the other side surface thereof. A specific portion where the foregoing trench portion TLtr is formed herein is the portion including the boundary between the sealed portion sealed in the sealing body MR and the exposed portion exposed from the sealing body MR. That is, as shown in FIG. 11, the foregoing trench portion TLtr is formed in the portion including not only the foregoing boundary, but also each of a part of the foregoing sealed portion and a part of the foregoing exposed portion.

However, as shown in FIG. 3, the component mounting portion DP1 connected to the leads TL1 has a both-side supporting structure in which each of the side edges located opposite to each other in the Y-direction as the extending direction of each of the suspension leads TL1 is supported by the outer frame (frame portion) LFf (see FIG. 20 described later) via the suspension lead TL1. Specifically, the component mounting portion DP1 has a side edge S5 facing each of the component mounting portions DP2 and DP3, a side edge S6 located opposite to the side edge S5, a side edge S7 crossing the side edges S5 and S6, and a side edge S8 located opposite to the side edge S7. In the Y-direction as the extending direction of each of the suspension leads TL1, the suspension leads TL1 are connected to each of the side edges S7 and S8.

On the other hand, the component mounting portion DP supported by the suspension lead TLh shown in FIG. 11 is supported by a cantilevel structure, i.e., a one-side supporting structure. Specifically, the component mounting portion DP has a side edge S1 facing the component mounting portion DP1 (see FIG. 3), a side edge S2 located opposite to the side edge S1 and facing a tie bar TB, a side edge S3 crossing the side edges S1 and S2, and a side edge S4 located opposite to the side edge S3. In the X-direction as the extending direction of the suspension lead TLh, the side edge S2 serves as a base end connected to the suspension lead TLh, while the side edge S1 opposite to the side edge S2 serves as a free end connected to no suspension lead. In the case of the one-side supporting structure, the stress transmitted to the suspension lead TLh connected to the base end when a load is applied to the component mounting portion DP is larger than in the case of the both-side supporting structure. That is, in the case of the one-side supporting structure, the load applied to the suspension lead TLh is larger than in the case of the both-side supporting structure so that the suspension lead TLh is more likely to be deformed.

Accordingly, each of the plurality of suspension leads TL1 connected to the component mounting portion DP1 supported by the both-side supporting structure may also have a structure in which the trench portion TLtr is formed, similarly to the suspension lead TLh shown in FIG. 11.

As described above, in terms of preventing the sealing body MR from being damaged when the suspension lead TL is cut and preventing the bonded state between the chip component and the component mounting portions DP from being destroyed, it is necessary to ensure durability against bending deformation to the to-be-cut portion of the suspension lead TL and reduce the cross-sectional area thereof.

Accordingly, the present inventors have focused attention on the fact that bending rigidity against bending deformation in the Z-direction shown in FIG. 12 can efficiently be improved by setting the length of the to-be-cut portion of the suspension lead in the thickness direction larger than the length thereof in the widthwise direction and found the configuration of the present embodiment. The following will describe a detailed structure of the suspension lead in the present embodiment.

<Detailed Structure of Suspension Lead>

Figure 13:
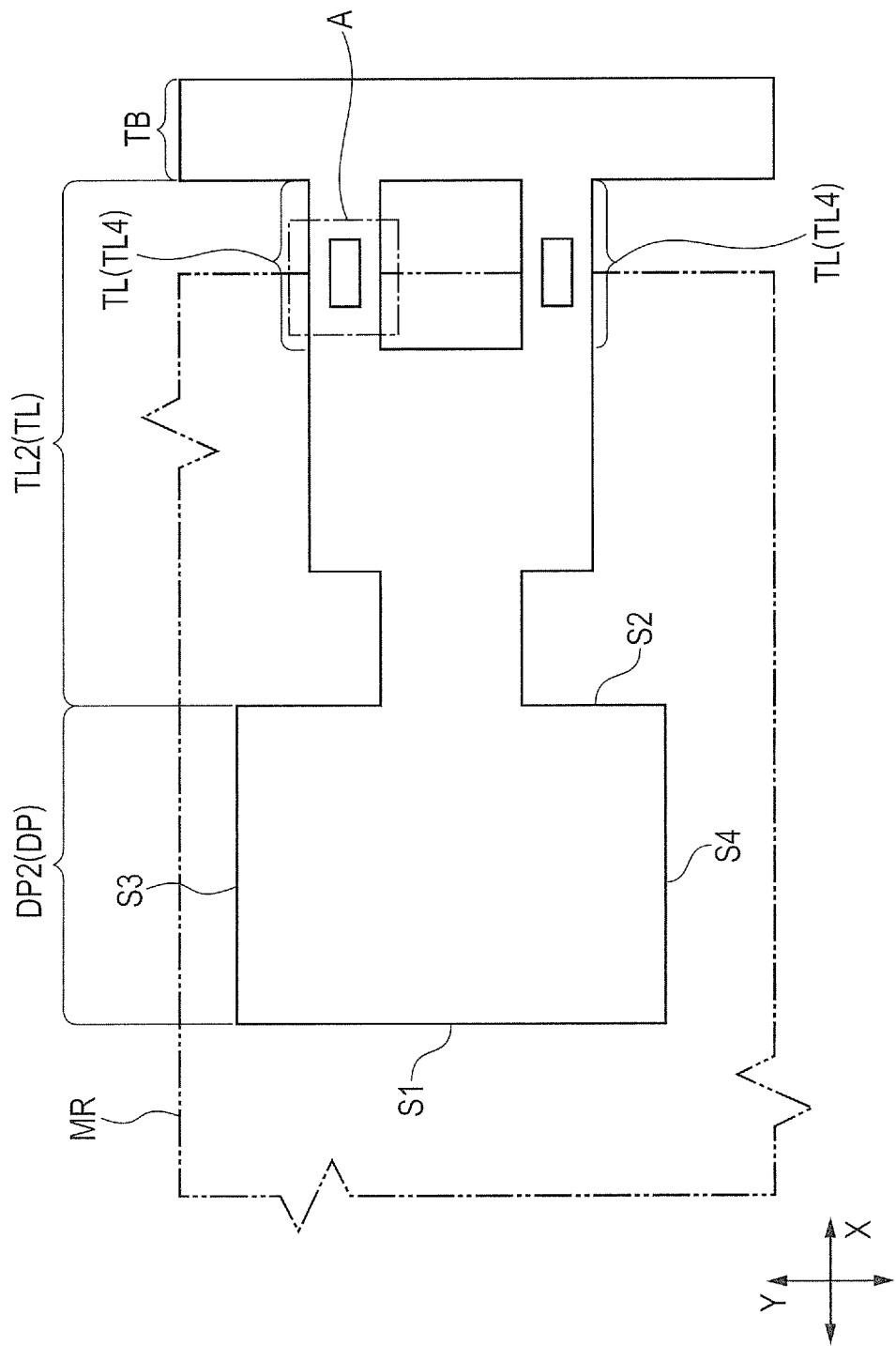
FIG. 13 is a plan view of the suspension lead shown in FIG. 9 before being cut.
Figure 14:
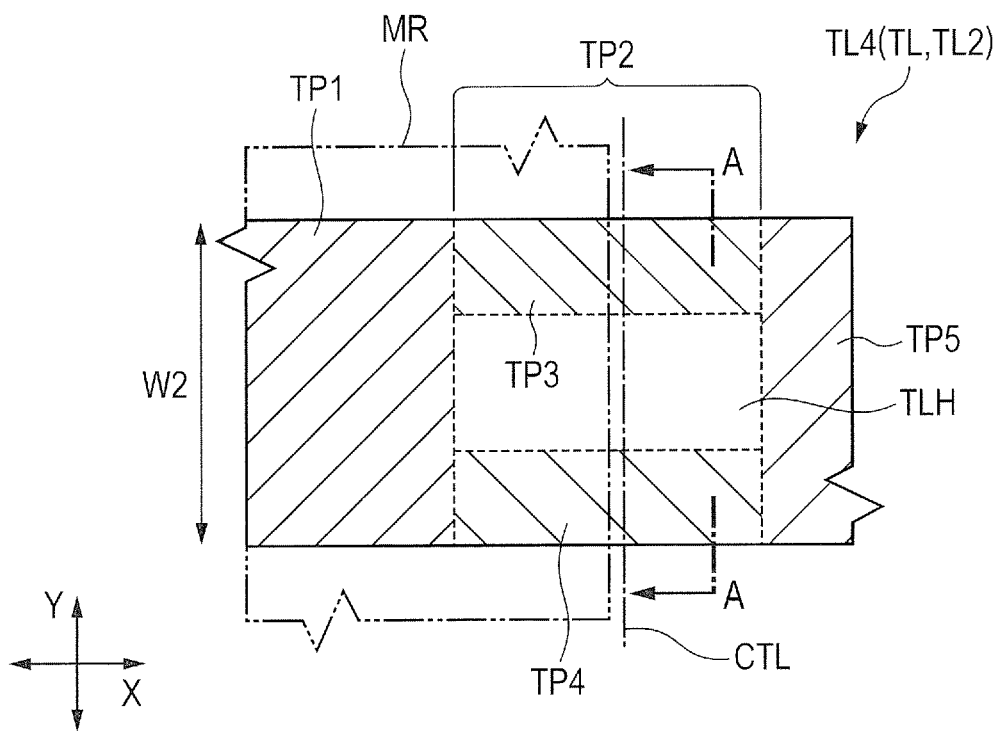
FIG. 14 is an enlarged plan view of the portion A shown in FIG. 13.
Figure 15:
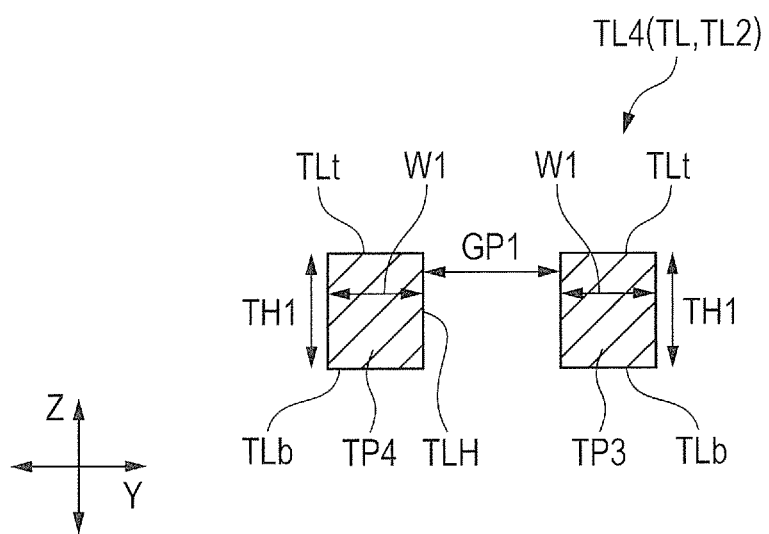
FIG. 15 is an enlarged cross-sectional view along the line A-A in FIG. 14.

FIG. 13 is a plan view of the suspension lead shown in FIG. 9 before being cut. FIG. 14 is an enlarged plan view of the portion A shown in FIG. 13. FIG. 15 is an enlarged cross-sectional view along the line A-A in FIG. 14. FIG. 14 is a plan view, but the plurality of portions included in a suspension lead TL4 are illustrated with different types of hatching to show the boundaries between the individual portions. The suspension lead TL shown in FIG. 13 is in a pre-cutting state. The portion of the suspension lead TL which is opposite to the portion thereof connected to the component mounting portion DP2 is connected to the tie bar (coupling portion) TB. In the following description, the width (or thickness) of each of the portions included in the suspension lead TL2 or TL4 means the length thereof in the Y-direction crossing the X-direction as the extending direction of the suspension lead TL4.

As shown in FIG. 13, the component mounting portion DP2 supported by the suspension lead TL2 is supported by a cantilever structure, i.e., a one-side supporting structure, similarly to the component mounting portion DP described using FIG. 11. Specifically, the component mounting portion DP2 has the side edge S1 facing the component mounting portion DP1 (see FIG. 3), the side edge S2 located opposite to the side edge S1 and facing the tie bar TB, the side edge S3 crossing the side edges S1 and S2, and the side edge S4 located opposite to the side edge S3. In the X-direction as the extending direction of the suspension lead TL2, the side edge S2 serves as a base end connected to the suspension lead TL2, while the side edge S1 opposite to the side edge S2 serves as a free end connected to no suspension lead. In other words, each of the plurality of suspension leads TL4 connected to the component mounting portion DP2 is connected to the side edge S2 of the component mounting portion DP2, while each of the side edges S1, S3, and S4 of the component mounting portion DP2 is spaced apart from the other constituent members of the lead frame. In still other words, none of the side edges S1, S3, and S4 of the component mounting portion DP2 is connected to any of the other members. The capacitor CC mounted over the component mounting portion DP2 is not included in the lead frame and is therefore not included in the foregoing other members.

Thus, the suspension lead TL2 connected to the component mounting portion DP2 supported by the one-side supporting structure needs to have durability against a load larger than that in the case of the both-side supporting structure. Among the plurality of suspension leads shown in FIG. 3, the suspension lead TL2 connected to the component mounting portion DP2 includes the plurality of (two in FIG. 13) suspension leads TL4 extending along the X-direction in plan view, as shown in FIG. 13. Each of the plurality of suspension leads TL4 has the structure shown in FIG. 14.

That is, in plan view, each of the plurality of suspension leads TL4 has a portion TP1 located between the component mounting portion DP2 (see FIG. 13) and the tie bar (see FIG. 13) and a portion TP2 located between the portion TP1 and the tie bar TB. The portion TP2 has a portion TP3 connected to the portion TP1 and having a width smaller (shorter) than the width of the portion TP1, a portion TP4 connected to the portion TP1 and having a width smaller (shorter) than the width of the portion TP1, and an opening (through hole TLH in FIG. 14) located between the portions TP3 and TP4. In other words, the respective upper surfaces TLt of the portions TP3 and TP4 are spaced apart from each other. That is, there is no other member between the respective upper surfaces TLt of the portions TP3 and TP4. Each of the portions TP1, TP3, and TP4 has the same thickness TH1 (see FIG. 15). In the case of the present embodiment, the thickness TH1 is the same as the thickness of each of the plurality of leads LD shown in FIG. 4 and is, e.g., 0.25 mm.

As shown in FIG. 14, in plan view, the boundary between the sealed portion sealed in the sealing body MR and the exposed portion exposed from the sealing body MR is at a position overlapping each of the portions TP3 and TP4 and the through hole (opening) TLH of the suspension lead TL4. In other words, each of the portions TP3 and TP4 and the through hole (opening) TLH of the suspension lead TL4 extends across the boundary between the sealed portion sealed in the sealing body MR and the exposed portion exposed from the sealing body MR. In still other words, each of the portions TP3 and TP4 and the through hole (opening) TLH of the suspension lead TL4 has a portion sealed in the sealing body MR and the other portion exposed from the sealing body MR.

Figure 17:
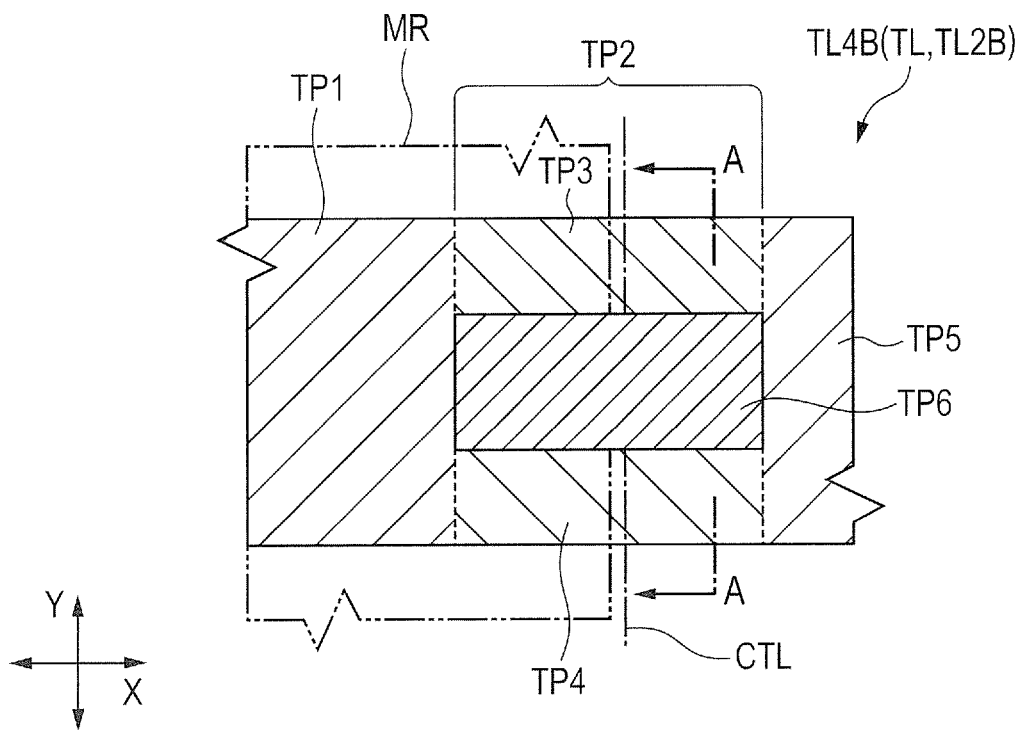
FIG. 17 is an enlarged plan view of the suspension lead as a modification of the suspension lead shown in FIG. 14.
Figure 18:
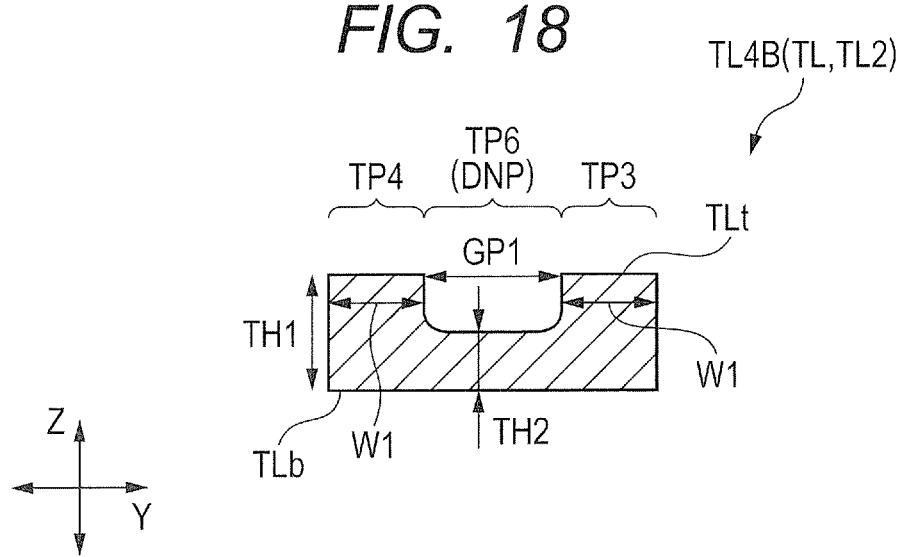
FIG. 18 is an enlarged cross-sectional view along the line A-A in FIG. 17.

In the example shown in FIGS. 14 and 15, there is the through hole (opening) TLH between the portions TP3 and TP4. In other words, in the region between the portions TP3 and TP4, the thickness of the suspension lead TL is smaller than the thickness TH1 of each of the portions TP3 and TP4. The wording "the thickness of the suspension lead TL is smaller than the thickness TH1 of each of the portions TP3 and TP4" covers a case where the through hole TLH as the opening is formed and the thickness of the suspension lead TL is zero, as shown in FIG. 15. Alternatively, as shown in FIGS. 17 and 18 described later in a modification, it may also be possible that a depression (opening) DNP as an opening is provided between the portions TP3 and TP4 and a thickness TH2 of a portion TP6 corresponding to the bottom of the depression DNP is smaller than the thickness TH1 of each of the portions TP3 and TP4. In the through hole TLH shown in FIG. 14, a resin forming the sealing body MR is embedded in the step of forming the sealing body MR.

In the step of cutting the suspension lead TL2 by press cutting, the plurality of suspension leads TL4 are cut along the cut line CTL shown by the one-dot dash line in FIG. 14. In other words, in the step of cutting the suspension lead TL2, the portions TP3 and TP4 are cut. In still other words, the portions TP3 and TP4 include to-be-cut portions which are cut in the step of cutting the suspension lead TL2.

Thus, the suspension lead TL4 includes the portion thinner than the portions TP3 and TP4 and thus allows the to-be-cut portion to have a reduced cross-sectional area. In particular, the suspension lead TL2 is divided into the plurality of suspension leads TL4 which are arranged to be spaced apart from each other and, between the plurality of suspension leads TL4, no metal member is arranged. This can reduce the cross-sectional area of the to-be-cut portion compared to that in the case of the suspension lead TLh shown in FIGS. 10 to 12.

On the other hand, as shown in FIG. 14, each of the suspension leads TL4 has the portions TP3 and TP4 each having the same thickness as that of the portion TP1 and left in the to-be-cut portion extending along the Y-direction. Accordingly, even in a case where a portion having a thickness smaller than the thickness TH1 (see FIG. 15) exists between the portions TP3 and TP4 (including a case where the thickness is zero such as where the through hole TLH is provided), it is possible to prevent the degradation of the supporting strength of the suspension lead TL2. That is, with the suspension lead TL2 in the present embodiment, it is possible to prevent the sealing body MR from being damaged and prevent the bonded state between the chip component and the component mounting portion DP2 from being destroyed when the suspension lead TL2 is cut.

When the portions TL3 and TL4 are cut during the cutting of the suspension leads TL4 cut as shown in FIG. 14, the respective end portions of the portions TL3 and TL4 are exposed from the side surface MRs of the sealing body MR in the semiconductor device PKG1 as a finished product, as shown in FIG. 2.

Also, in the example shown in FIG. 14, each of the portions TP3 and TP4 is located between the portion TP2 and the tie bar TB (see FIG. 13) and connected to a portion TP5 having the same thickness TH1 (see FIG. 15) as that of each of the portions TP3 and TP4. By providing the portion TP5, it is easier to adjust the aperture area of the through hole TLH, and therefore it is possible to reduce the aperture area of the through hole TLH. It is sufficient for the through hole TLH to be present at least in the to-be-cut portion. Accordingly, by reducing the aperture area of the through hole TLH, the supporting strength of the suspension lead TL2 can be improved. However, in a modification of the suspension lead TL2, it may also be possible that the portion TP5 is not provided and each of the portions TP3 and TP4 is connected to the tie bar TB, though the illustration thereof is omitted. In this case, the distance from the tie bar TB to the cut line CTL can be reduced, and consequently the plane area of the lead frame described later can be reduced.

In terms of reducing the cross-sectional area of the to-be-cut portion, it is preferable that a width W1 (see FIG. 15) of each of the portions TP3 and TP4 is small within a range which allows the component mounting portion DP2 to have a sufficient supporting strength. The width W1 is smaller (narrower or shorter) than at least a width W2 of the portion TP1 shown in FIG. 14. In the example shown in FIG. 15, the width W1 is not more than the thickness TH1. The width W1 is also not more than a distance GP1 between the portions TP3 and TP4. In the case of the suspension lead TL4 shown in FIG. 14, the distance GP1 (see FIG. 15) between the portions TP3 and TP4 is as small as, e.g., about the thickness TH1 (at least not more than double the thickness TH1). Accordingly, each one of the portions TP3 and TP4 functions as a reinforcing member which reinforces the other of the portions TP3 and TP4. As a result, even when the width W1 shown in FIG. 15 is reduced, it is possible to prevent the degradation of the supporting strength of the component mounting portion DP2.

Figure 16:
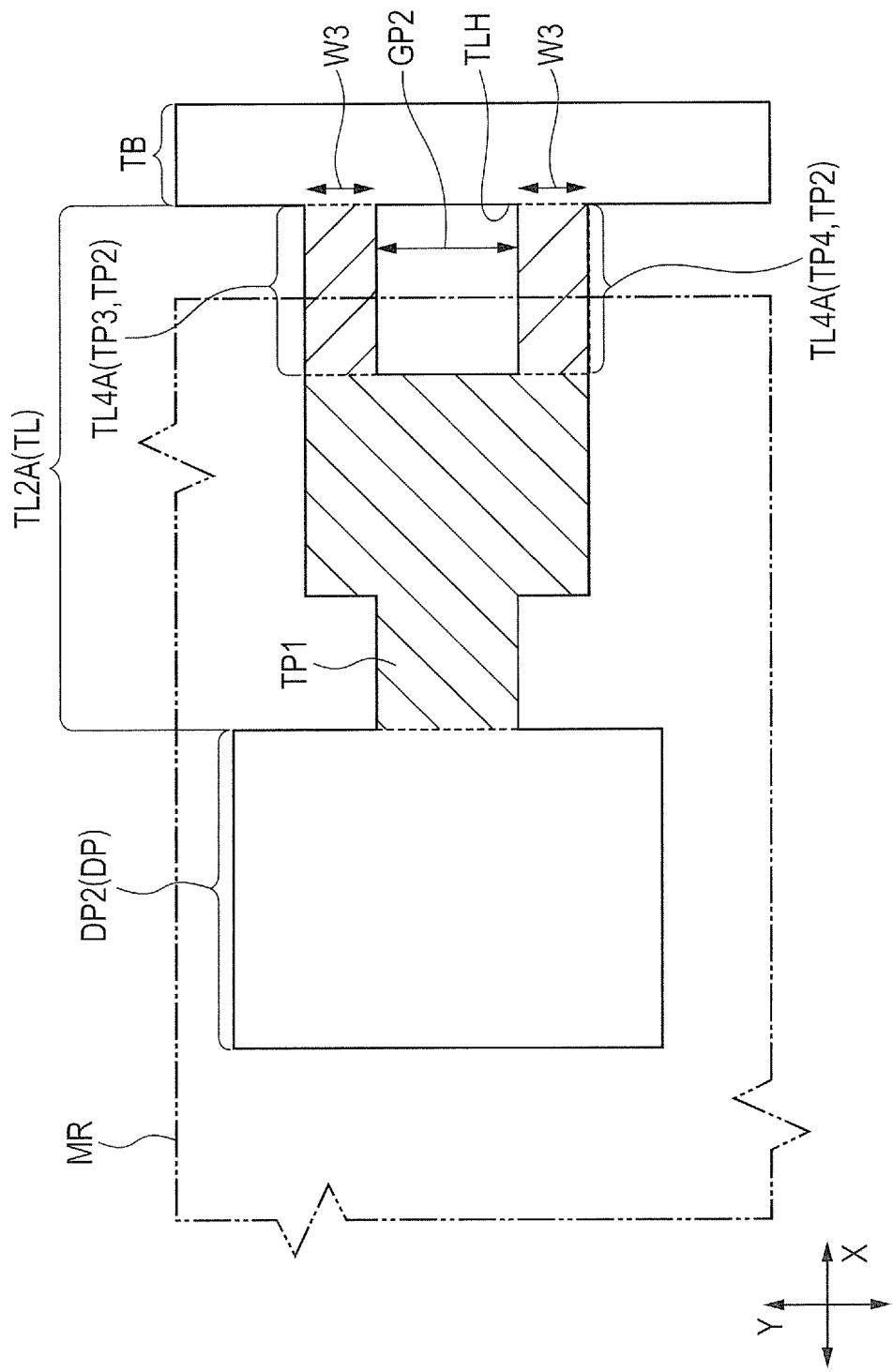
FIG. 16 is an enlarged plan view showing a modification of the suspension lead shown in FIG. 13.

As a modification of the suspension lead TL2 shown in FIG. 13, such a structure as that of a suspension lead TL2A shown in FIG. 16 can also be used. FIG. 16 is an enlarged plan view showing the modification of the suspension lead shown in FIG. 13. The suspension lead TL2A shown in FIG. 16 is different from the suspension lead TL2 shown in FIG. 13 in that the through hole TLH (see FIG. 15) and the depression DNP (see FIG. 18 described later) are not formed in any of suspension leads TL4A equivalent to the suspension leads TL4 shown in FIG. 13. The suspension lead TL2A is otherwise the same as the suspension lead TL2 shown in FIG. 13.

The suspension lead TL2A shown in FIG. 16 has the plurality of suspension leads TL4A spaced apart from each other and extending along the X-direction. Between the adjacent suspension leads TL4A, no metal member is arranged. The structure of the suspension lead TL2A can be considered similarly to the structure of the suspension leads TL4 shown in FIG. 14. That is, as shown in FIG. 16, the suspension lead TL2A has the portion TP1 located between the component mounting portion DP2 and the tie bar TB and the portion TP2 located between the portion TP1 and the tie bar TB. The portion TP2 has the portion TP3 connected to the portion TP1 and having a width smaller (shorter) than the width of the portion TP1 and a fourth portion connected to the portion TP1, having a width smaller (shorter) than the width of the portion TP1, and spaced apart from the portion TP3. Each of the portions TP1, TP3, and TP4 has the same thickness TH1 (see FIG. 15). Between the portions TP3 and TP4, the through hole TLH is located.

Thus, it can be considered that the structure of the suspension lead TL2A is the same as that of the suspension lead TL4 shown in FIG. 14. Also, in the suspension lead TL2A shown in FIG. 16, the cross-sectional area of the to-be-cut portion can be reduced compared to that in the suspension lead TLh shown in FIGS. 10 to 12. In addition, the suspension lead TL2A can improve the supporting strength of the component mounting portion DP2 compared to the suspension lead TLh. In the case of the structure of the suspension lead TL2A, the step of forming the through hole TLH or the like in the suspension lead TL4A can be omitted. This allows the suspension lead TL2A to be manufactured more easily than the suspension lead TL2 shown in FIG. 13.

However, to reduce the cross-sectional area of the to-be-cut portion in the structure of the suspension lead TL2A to a size comparable to that in the suspension lead TL2 shown in FIG. 13, a width W3 of each of the portions TP3 and TP4 needs to be reduced (shortened) to about one-and-a-half times the width W1 shown in FIG. 15. On the other hand, in terms of improving the supporting strength of the component mounting portion DP2, a distance GP2 between the portions TP3 and TP4 is preferably shorter, but the distance GP2 shown in FIG. 16 is longer than the distance GP1 shown in FIG. 14. Accordingly, the supporting strength of the component mounting portion DP2 is higher with the suspension lead TL2 shown in FIG. 13 than with the suspension lead TL2A shown in FIG. 16. Therefore, in terms of preventing the sealing body MR from being damaged and preventing the bonded state between the chip component and the component mounting portion DP2 from being destroyed, when a comparison is made between the suspension lead TL2A and the suspension lead TL2 shown in FIG. 13, the suspension lead TL2 is preferred to the suspension lead TL2A.

As a modification of the suspension lead TL4 shown in FIGS. 14 and 15, a structure of a suspension lead TL4B shown in FIGS. and 18 may also be used appropriately. FIG. 17 is an enlarged plan view of the suspension lead as the modification of the suspension lead shown in FIG. 14. FIG. 18 is an enlarged cross-sectional view along the line A-A in FIG. 17. FIG. 17 is a plan view, but the plurality of portions included in the suspension lead TL4B are illustrated with different types of hatching to show the boundaries between the individual portions.

The suspension lead TL4B shown in FIGS. 17 and 18 is different from the suspension lead TL4 shown in FIGS. 14 and 15 in that, between the portions TP3 and TP4, the portion TP6 having the thickness TH2 (see FIG. 18) smaller than the thickness TH1 (see FIG. 18) is provided. The portion TP6 is the bottom layer of the depression DNP extending from the upper surface TLt of the suspension lead TL4b toward the lower surface TLb thereof. The thickness HT2 is about half the thickness TH1. The depression DNP is formed by, e.g., performing an etching process on the upper surface TLt of the suspension lead TL4B in a state where the upper surfaces TLt of the portions TP3 and TP4 are masked.

By providing the portion TP6 connected to the portions TP3 and TP4 such as provided in the suspension lead TL4B, the strength of each of the portions TP3 and TP4 can be improved. That is, when the suspension lead TL4B is connected to the component mounting portion DP2 shown in FIG. 13, the supporting strength of the component mounting portion DP2 can be improved compared to that when the suspension lead TL4 is connected therewith.

However, the portion TP6 forms a part of the to-be-cut portion when the suspension lead TL2B is cut. Accordingly, in terms of reducing the cross-sectional area of the to-be-cut portion, the structure of the suspension lead TL4 shown in FIGS. 14 and 15 is preferred.

<Manufacturing Process of Semiconductor Device>

Figure 19:
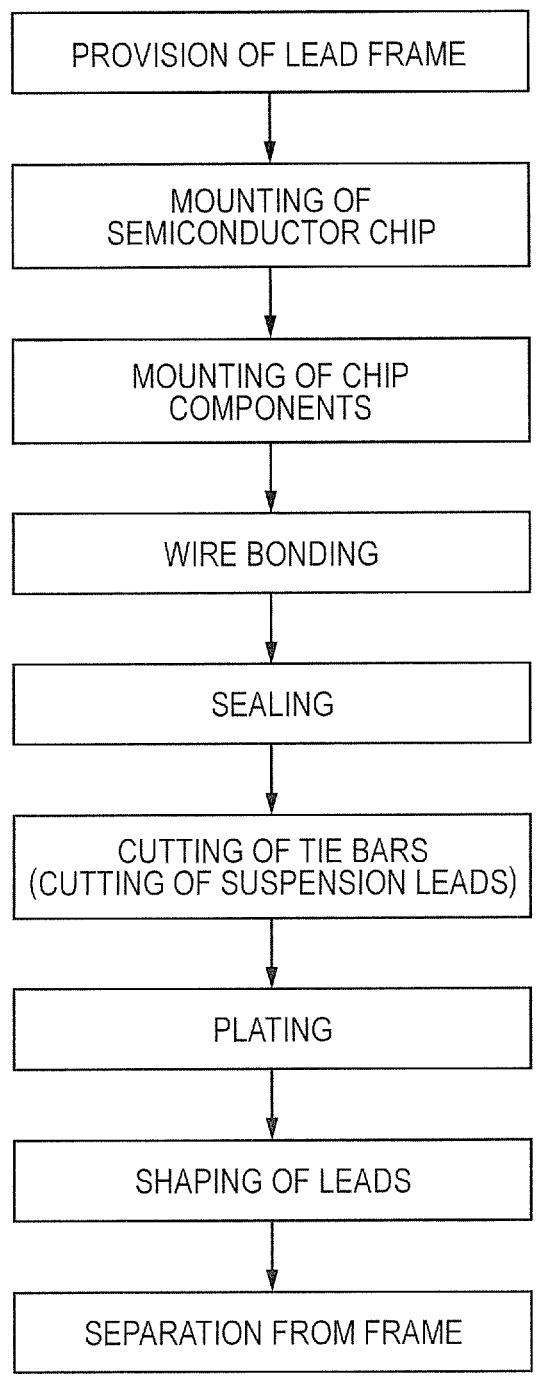
FIG. 19 is an illustrative view showing the flow of assembly of the semiconductor device shown in FIGS. 1 to 5.

Next, a description will be given of the manufacturing process of the semiconductor device PKG1 shown in FIGS. 1 to 5. The semiconductor device PKG1 in the present embodiment is manufactured along the flow of assembly shown in FIG. 19. FIG. 19 is an illustrative view showing the flow of assembly of the semiconductor device shown in FIGS. 1 to 5. In the following description of the individual process steps, plan views are shown in principle. The cross section in each of the process steps will be described with reference to FIGS. 4 and 5 already described above. Note that, in the present embodiment, a description will be given of a form in which the semiconductor device is assembled using the lead frame corresponding to the one semiconductor device PKG1 shown in FIG. 1. However, as a modification, there is also a method which provides a so-called multi-piece substrate including a plurality of product formation regions for the plurality of semiconductor devices PKG1, collectively assembles the plurality of semiconductor devices, and then singulates the multi-piece substrate into the individual product formation regions. In this case, the efficiency of the assembling process can be enhanced.

1. Lead Frame Preparation Step

Figure 20:
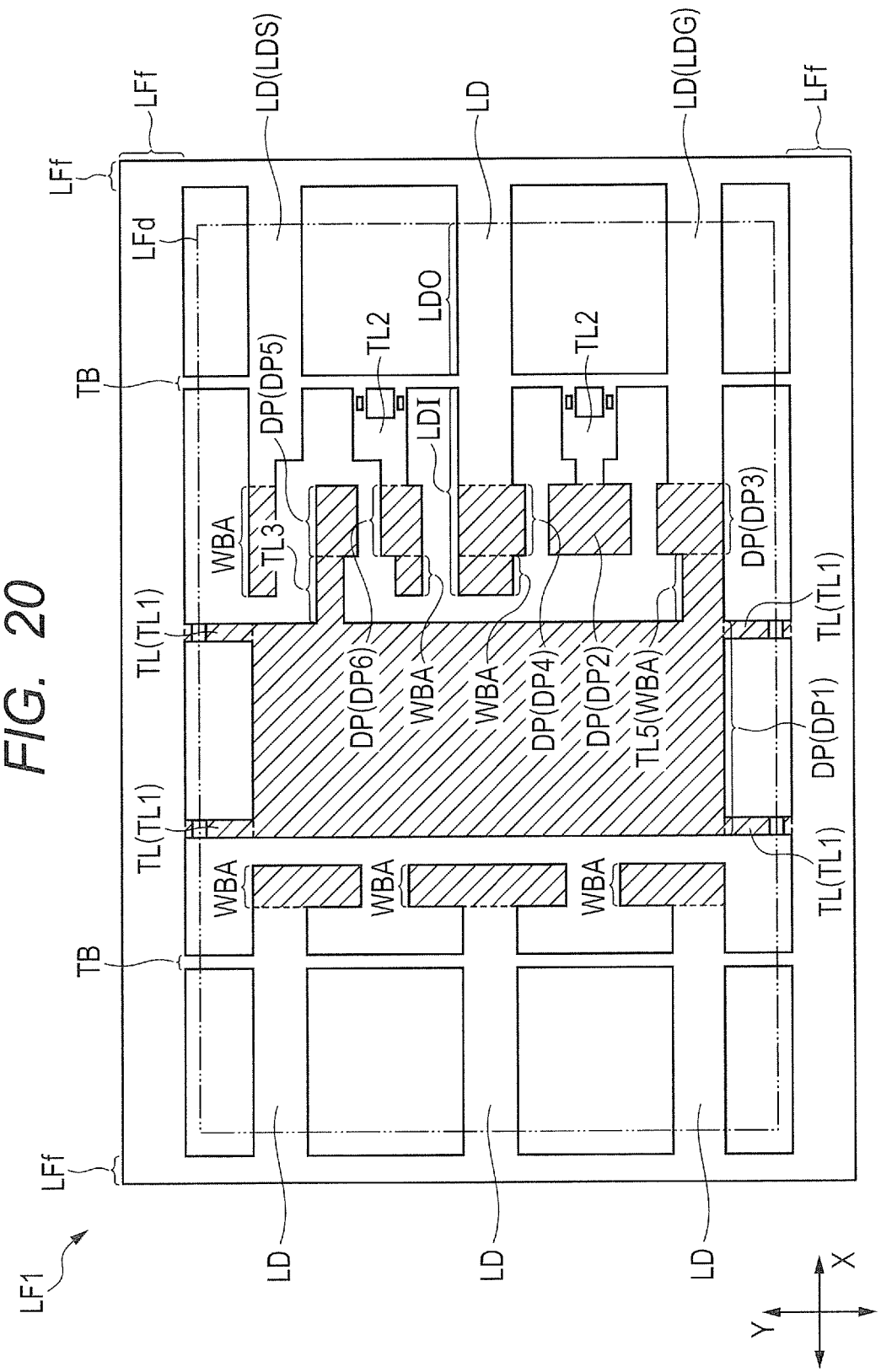
FIG. 20 is a plan view showing a lead frame provided in the lead frame provision step in FIG. 19.

First, in the lead frame provision step shown in FIG. 19, the lead frame LF1 as shown in FIG. 20 is provided. FIG. 20 is a plan view showing the lead frame provided in the lead frame provision step in FIG. 19. FIG. 20 is a plan view, but the portions where a metal film (plating film) such as a silver film (silver plating film) is formed over a base material made of copper are hatched.

The lead frames LF1 provided in the present step include device regions (product formation regions) LFd inside the outer frames LFf. The lead frames LF1 are made of a metal. In the present embodiment, the lead frames LF1 are made of, e.g., a metal material containing copper (Cu) as a main component.

Each of the device regions LFd is connected to the outer frame LFf via the plurality of suspension leads TL1 and the plurality of tie bars TB. The tie bars TB are metal members formed integrally of the same metal material as that of the plurality of leads LD, the plurality of component mounting portions DP, and the outer frame LFf. The tie bars TB are cut in a tie bar cutting step shown in FIG. 19.

In each of the device regions LFd, the plurality of component mounting portions DP are arranged to be aligned. Among the plurality of component mounting portions DP, the component mounting portion DP1 as a chip mounting portion for the semiconductor chip CP (see FIG. 3) has a rectangular two-dimensional shape in which the length in the Y-direction is longer than the length in the X-direction. The component mounting portion DP1 is supported by the outer frame LFf via the plurality of suspension leads TL1 connected to the short side edges thereof located opposite to each other and extending along the Y-direction. The component mounting portions DP2, DP3, DP4, DP5, and DP6 are arranged to be aligned along one of the long side edges of the component mounting portion DP1. The order in which the component mounting portions DP are aligned is not limited to that in the example shown in FIG. 20. For example, the component mounting portions DP3, DP2, DP4, DP6, and DP5 are aligned in this order with increasing distance from one of the end portions of the alignment. The component mounting portions DP2, DP3, DP4, DP5, and DP6 are arranged locally near one of the long side edges of the component mounting portion DP1, and are not arranged near the other long side edge thereof. Each of the component mounting portions DP2, DP3, DP4, DP5, and DP6 is connected to any of the leads LD and the suspension leads TL2 and TL3. Each of the plurality of component mounting portions DP has a structure supported by the outer frame LFf via the lead LD, the suspension lead TL2, or the suspension lead TL3.

Around the plurality of component mounting portions DP, the plurality of leads LD and the plurality of suspension leads TL2 are formed. Each of the plurality of leads LD includes the outer lead portion LDO provided outside the tie bar TB (exposed from the sealing body after the sealing step) and the inner lead portion LDI provided inside the tie bar TB (sealed in the sealing body after the sealing step). Each of the plurality of leads LD and the plurality of suspension leads TL2 and TL3 extends along the X-direction. Near one of the long side edges (side edge S5 shown in FIG. 3) of the component mounting portion DP1, the plurality of leads LD and the plurality of suspension leads TL2 are alternately arranged along the side edge S5. The plurality of leads arranged near the side edge S5 include the lead LDG to which the reference potential is supplied, the lead LDS to which the control signal is supplied, and the lead LD to which the high-side potential is supplied. The plurality of leads LD and the plurality of suspension leads TL2 are connected to each other via the tie bar TB.

Near the other long side edge (side edge S6 shown in FIG. 3) of the component mounting portion DP1, the plurality of leads LD are arranged along the side edge S6, but the suspension leads TL are not arranged. However, in a modification, the suspension leads TL may also be arranged near the side edge S6. The plurality of leads LD aligned near the side edge S6 are connected to each other via the tie bar TB other than the tie bar TB arranged near the side edge S5.

None of the plurality of leads LD is cut in a suspension lead cutting step (see FIG. 19) described later. Accordingly, none of the plurality of leads LD has the portion TP2 such as that of the suspension lead TL4 described using FIG. 14. In other words, none of the plurality of leads LD has a structure in which the portions TP3 and TP4 are arranged next to each other via the opening, as shown in FIG. 14.

Among the plurality of component mounting portions DP, the component mounting portion DP3 connected to the lead LDG to which the reference potential is supplied is connected to the component mounting portion DP1 via a coupling portion TL5 provided between the component mounting portions DP3 and DP1. In other words, to the component mounting portion DP1, the reference potential is supplied via the coupling portion TL5, the component mounting portion DP3, and the lead LDG.

Each of the plurality of component mounting portions DP, the suspension leads TL, and the plurality of leads LD which are included in the lead frame LF1 is formed by providing a planar metal plate and patterning the metal plate by removing portions of the metal plate. Examples of a method for removing the portions of the metal plate include etching which chemically removes unneeded portions in a state where the metal plate is masked except for the portions thereof to be removed and press working which cuts the unneeded portions by pressing a die against the metal plate. In the present embodiment, the metal plate is patterned by, e.g., press working.

Each of the openings described using FIGS. 13 to 18, i.e., the through hole TLH and the depression DNP can be formed by the etching or press working described above. In the present embodiment, when the openings are formed by press working, it is favorable that the worked surface is easily planarized. On the other hand, when the openings are formed by etching, it is favorable that distortion is less likely to develop in members around the openings.

The respective front end portions of the plurality of leads LD and some of the suspension leads TL2 which are closer to the component mounting portion DP1 serve as wire bonding portions (wire bonding areas) WBA as areas with which the wires BW (see FIG. 3) are to be connected. Over each of the hatched portions in FIG. 20, specifically the respective upper surfaces of the plurality of component mounting portions DP and the wire bonding portions WBA, a metal film covering the top surface of the base material is formed. The metal film is a plating film made of, e.g., silver, gold, or the like and formed by a plating method. When the metal film is formed over each of the respective upper surfaces of the plurality of component mounting portions DP and the wire bonding portions WBA, the reliability of electrical connection with the wires BW (FIG. 3) or the bonding materials BD1 (see FIG. 4) is improved. Note that, in FIGS. 3 to 5 already described, the illustration of the metal film is omitted, but the metal film MTL shown in FIG. 7 is equivalent to the metal film illustrated with hatching in FIG. 20.

In the example shown in FIG. 20, the metal film MTL (see FIG. 7) is formed over the upper surface of each of the plurality of suspension leads TL1. However, the metal film MTL need not be formed over the suspension lead TL1. When a sufficient connection strength (or sufficient reliability of electric connection) can be ensured even in a state where copper (or a copper alloy) forming the base material of the lead frame LF1 is exposed also, the metal film MTL need not be formed. When the entire top surface of the base material of the lead frame LF1 is covered with a multi-layer film including a nickel (Ni) film, a palladium (Pd) film, and a gold (Au) film, the metal film MTL need not be further formed over the multi-layer film.

Note that the structure of the suspension lead TL2 described using FIGS. 13 to 15 is already formed at the stage in the present process step. The plurality of suspension leads TL4 shown in FIG. 13 and the portions TP3 and TP4 or the opening (through hole TLH) shown in FIGS. 14 and 15 can be formed, e.g., simultaneously when the portion forming the lead frame LF is patterned or subsequently to the patterning.

In the case of the suspension lead TLh described using FIGS. 10 to 12, when the front end of the suspension lead TLh comes in contact with another object upon handling of the lead frame LF1 during the period up to the sealing step shown in FIG. 19, the suspension lead TLh may undergo bending deformation, as shown in FIG. 12. However, in the case of the suspension lead TL2 in the present embodiment, as described above, the supporting strength of the suspension lead TL2 supporting the component mounting portion DP2 is improved. Accordingly, upon handling of the lead frame LF1, it is possible to prevent the bending deformation of the suspension lead TL2. The same applies also to the case of the suspension lead TL2A (see FIG. 16) and the suspension lead TL2B (see FIG. 17) which are described as the modifications of the suspension lead TL2.

2. Semiconductor Chip Mounting Step

Figure 21:
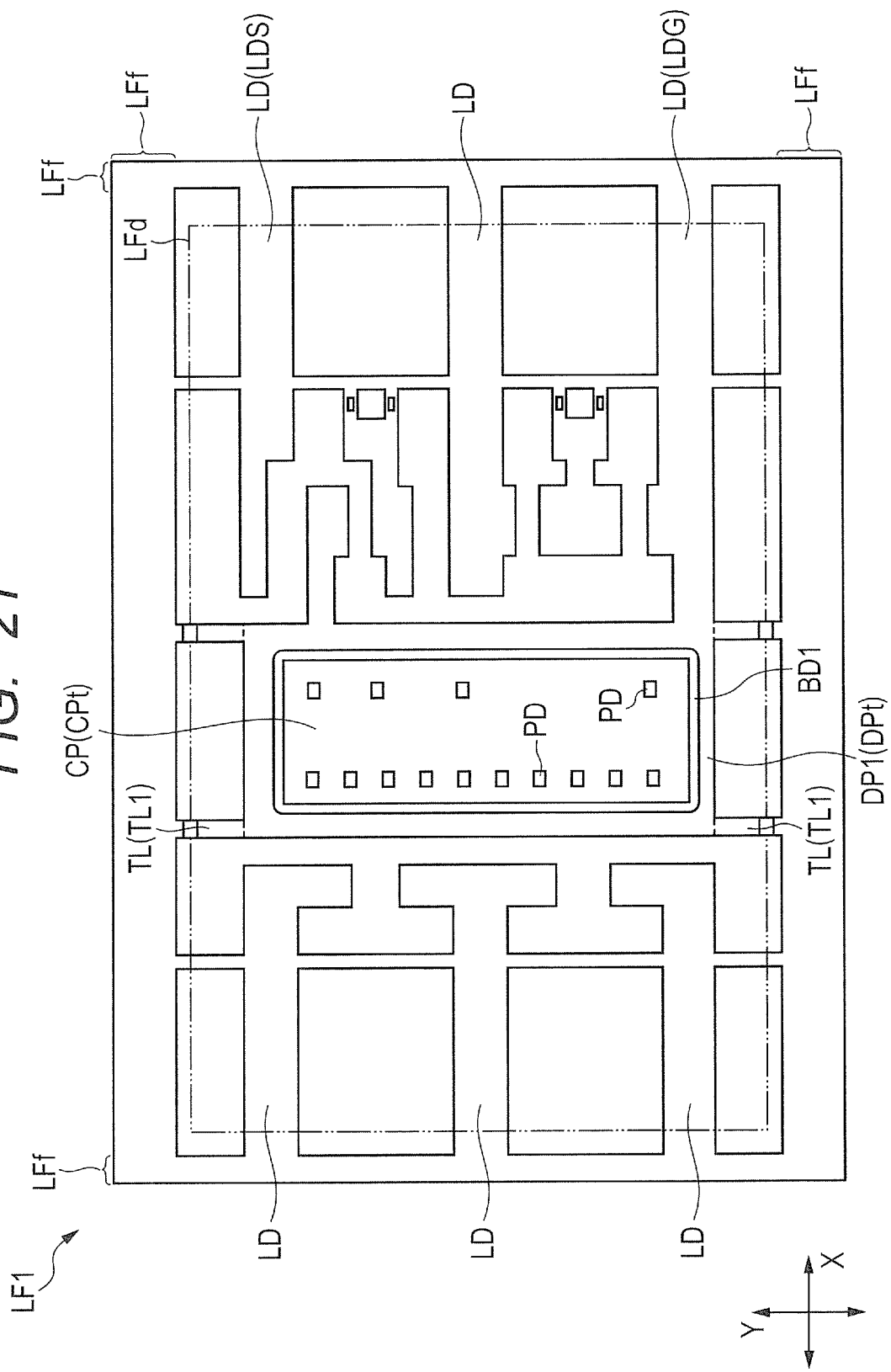
FIG. 21 is a plan view showing a state where a semiconductor chip is mounted over the die pad shown in FIG. 20 via a bonding material.

Next, in the semiconductor chip mounting step shown in FIG. 19, as shown in FIG. 21, the semiconductor chip CP is mounted over the component mounting portion DP1 via the bonding material BD1. FIG. 21 is a plan view showing a state where the semiconductor chip is mounted over the die pad shown in FIG. 20 via the bonding material.

In the present embodiment, the semiconductor chip CP is mounted using a so-called face-up mounting method in which the semiconductor chip CP is mounted with the back surface CPb thereof (see FIG. 4) facing the upper surface DPt of the component mounting portion DP1. As also shown in FIG. 21, the semiconductor chip CP is mounted over the center portion of the component mounting portion DP1 such that the respective side edges of the top surface CPt are arranged along the respective side edges of the component mounting portion DP1.

As described using FIG. 7, the bonding material BD1 is a conductive resin made of the resin BDb containing the plurality conductive particles BDc. The resin BDb is, e.g., a bonding material containing an epoxy-based thermosetting resin, which is a paste material having fluidity before cured (thermally cured). When the paste material is used as the bonding material BD1, first, onto the component mounting portion DP1, the bonding material BD1 is applied. Then, by pressing the back surface CPb of the semiconductor chip CP onto the upper surface DPt of the component mounting portion DP, the bonding material BD1 spreads to the surrounding portion to be bonded (temporarily bonded). When the bonding material BD1 is subsequently cured (e.g., heated to a curing temperature), as shown in FIG. 21, the semiconductor chip CP is bonded and fixed onto the component mounting portion DP via the bonding material BD1. At this time, the back surface CPb of the semiconductor chip CP is electrically connected with the lead LDG as the external terminal to which the reference potential is supplied via the bonding material BD1 and the component mounting portion DP1.

3. Chip Component Mounting Step

Figure 22:
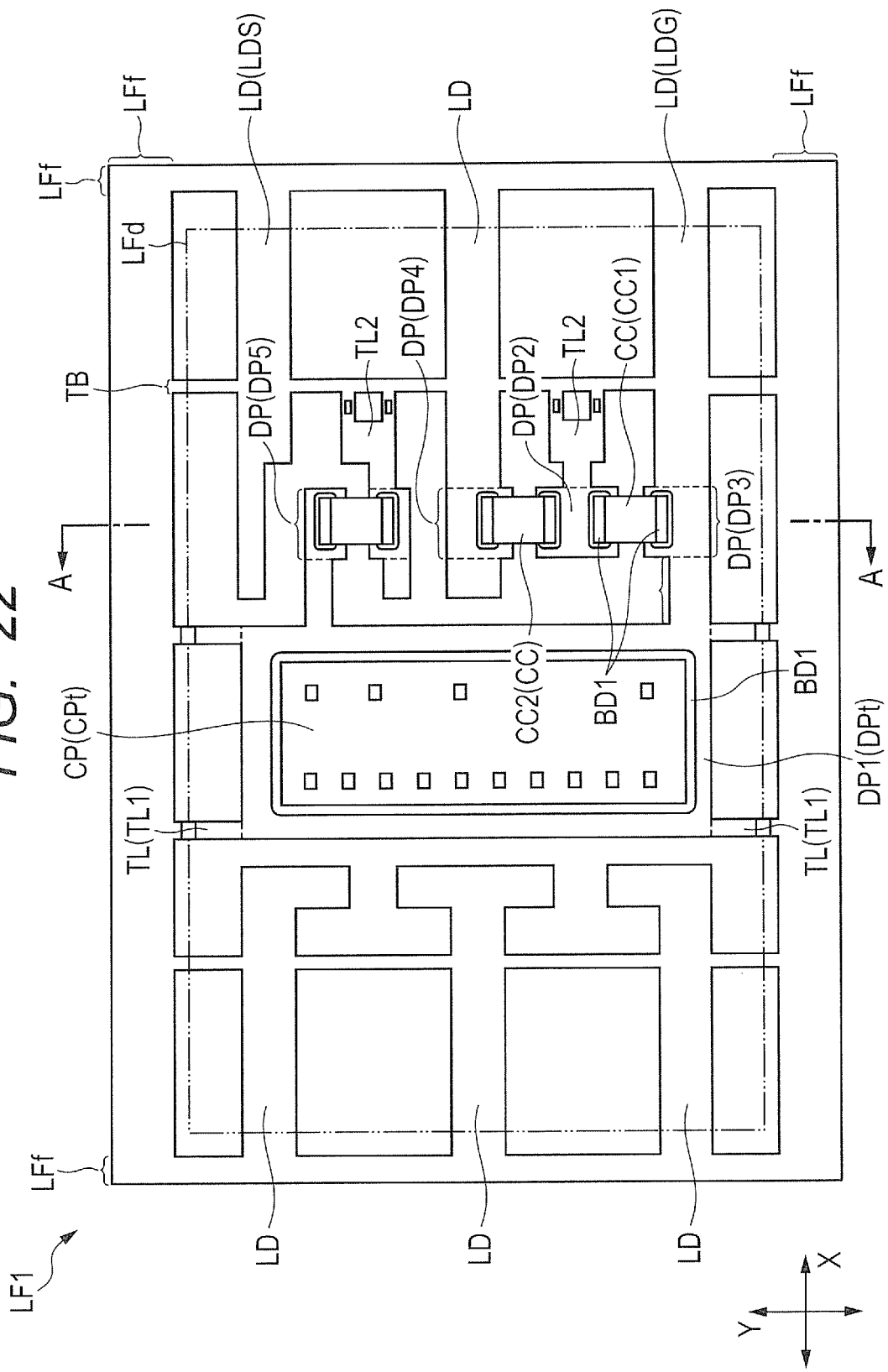
FIG. 22 is a plan view showing a state where a plurality of chip components are mounted over the component mounting portion shown in FIG. 21 each via the bonding material.
Figure 23:
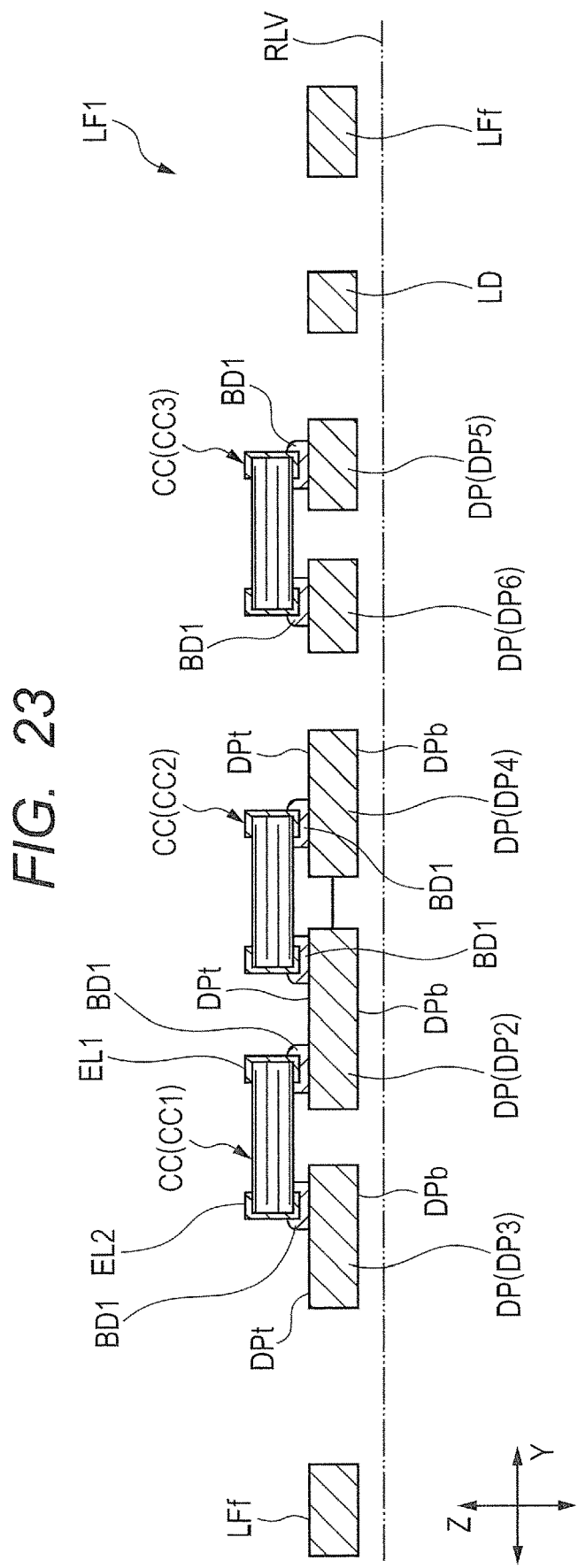
FIG. 23 is a cross-sectional view along the line A-A in FIG. 22.

Next, in the chip component mounting step shown in FIG. 19, as shown in FIGS. 22 and 23, the plurality of capacitors CC are mounted over the plurality of component mounting portions DP each via the bonding material BD1. FIG. 22 is a plan view showing a state where the plurality of chip components are mounted over the component mounting portions shown in FIG. 21 each via the bonding material. FIG. 23 is a cross-sectional view along the line A-A in FIG. 22.

As described using FIG. 7, in the present step, each of the capacitors CC is arranged over and between the adjacent component mounting portions DP2 and DP3. The electrodes EL1 and EL2 are mounted over the respective component mounting portions DP2 and DP3 each via the bonding material BD1.

As stated in the description of the semiconductor chip mounting step, the bonding material BD1 is in the pasty state before cured. Accordingly, in the present step, the bonding material BD1 is applied to the respective upper surfaces DPt (see FIG. 7) of the plurality of component mounting portions DP. Then, by pressing the electrode EL1 (see FIG. 7) or the electrode EL2 (see FIG. 7) of the capacitor CC onto the upper surface DPt of the component mounting portion DP, the bonding material BD1 spreads to the surrounding portion to be bonded (temporarily bonded). When the bonding material BD1 is subsequently cured (e.g., heated to a curing temperature), as shown in FIG. 23, the capacitor CC is bonded and fixed onto the component mounting portion DP via the bonding material BD1. By the present step, the plurality of capacitors CC are electrically connected with the plurality of leads as the external terminals via the bonding materials BD1.

As has already been described, according to the present embodiment, the suspension lead TL2 supporting the component mounting portion DP2 has the high supporting strength. Accordingly, unlike in the studied example described using FIG. 8, as shown in FIG. 23, it is possible to reduce the height difference between the respective upper surfaces DPt of the component mounting portions DP2 and DP3 relative to the reference plane RLV in the horizontal direction. This can reduce the inclination of each of the capacitors CC when the capacitor CC is mounted. For instance, in the example shown in FIG. 23, each of the plurality of capacitors CC is mounted substantially in parallel with the reference plane RLV. In this case, in the subsequent wire bonding step, the amount of movement of the position of each of the component mounting portions DP is reduced to be negligible. Therefore, it is possible to prevent the bonded state between the component mounting portions DP and the capacitor CC from being destroyed.

Note that, in the present embodiment, the description has been given of the form in which, after each of the semiconductor chip mounting step and the chip component mounting step, the heating step (cure-bake step) for curing the bonding material BD1 is performed. However, in a modification, the cure-bake step may also be performed simultaneously after the mounting of the semiconductor chip CP and the capacitors CC. In this case, the time required for cure-baking can be halved to improve the manufacturing efficiency.

When a solder is used as the bonding material BD1, after the semiconductor chip CP and the chip components are mounted, it is necessary to perform a reflow step in which heating is performed to melt the solder and form an alloy layer. At this time, to perform the reflow step in each of the semiconductor chip mounting step and the chip component mounting step, it is necessary to use a solder having a melting point higher than that of the solder for mounting the chip component as the solder for mounting the semiconductor chip CP. Also, when the solder is used as the bonding material BD1, a solder paste which is a mixture of a flux component for removing an oxide film from the top surface of the solder and activating the solder and a solder component is applied onto the component mounting portion DP. In this case, after the reflow step, it is necessary to perform a cleaning step which removes the residues of the flux component. In the case of the present embodiment, the semiconductor chip CP and the plurality of capacitors CC are each mounted over the component mounting portion DP1 via the bonding materials BD1 as the conductive resins made of the same component. This allows a timing for performing the cure-bake step to be freely chosen and improves the degree of freedom in selecting a manufacturing step. Also, according to the present embodiment, the cleaning step which is necessary when a solder is used need not be performed, resulting in an improvement in manufacturing efficiency.

4. Wire Bonding Step

Figure 24:
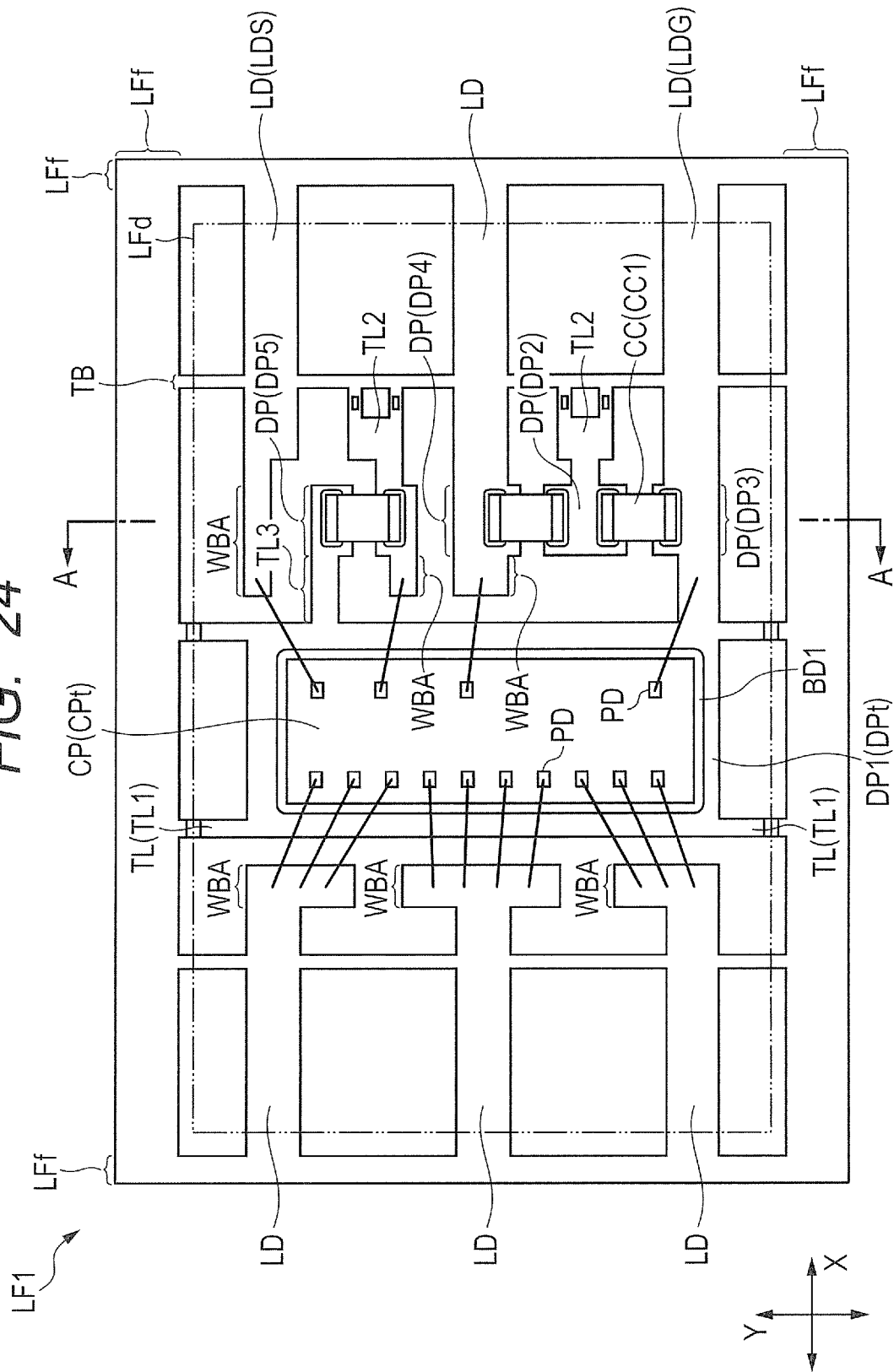
FIG. 24 is a plan view showing a state where the semiconductor chip and the plurality of leads which are shown in FIG. 22 are electrically connected via wires.
Figure 25:
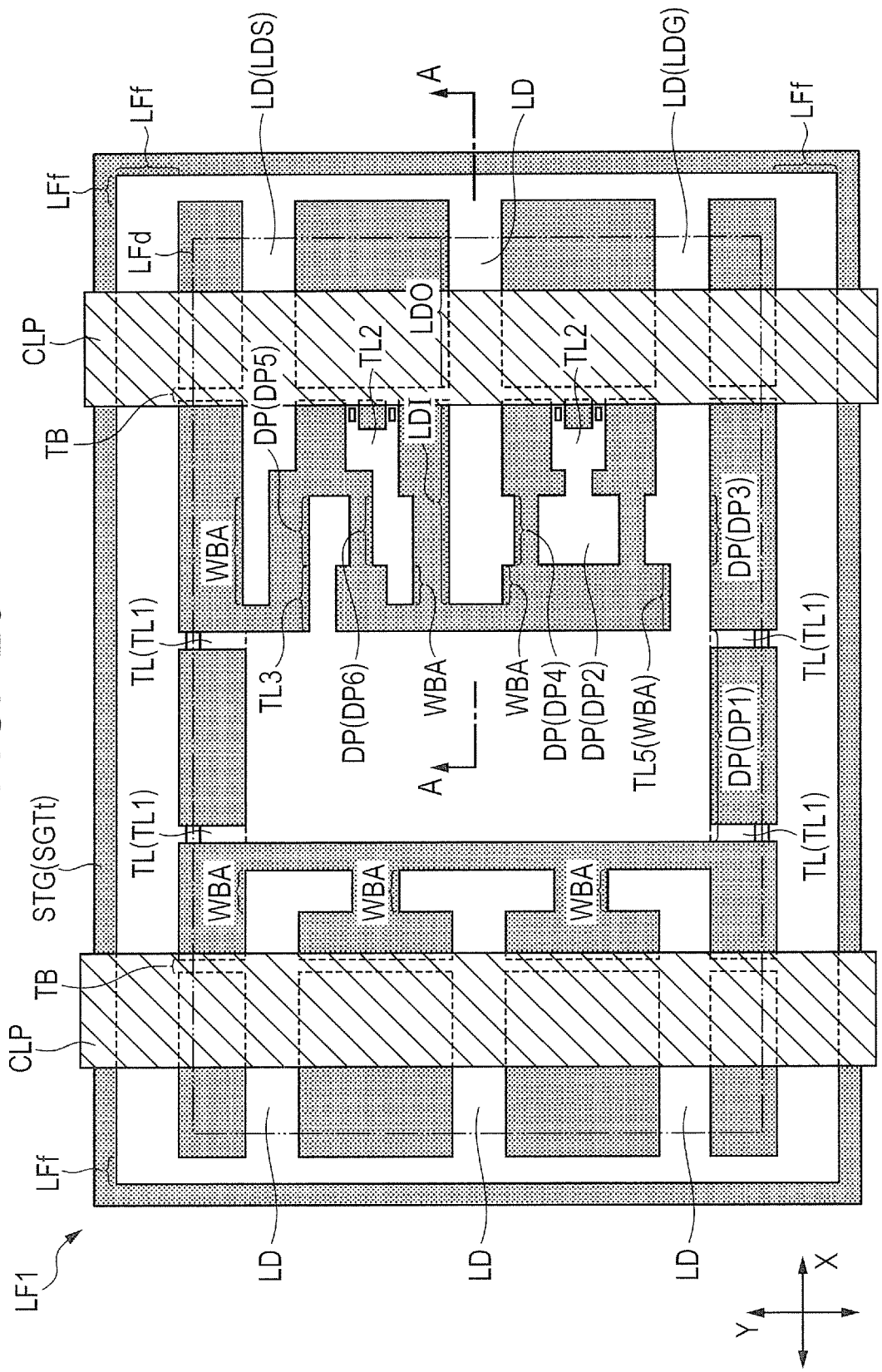
FIG. 25 is a plan view showing the two-dimensional positional relationships between a lead frame, a stage, and a clamper in a wire bonding step.
Figure 26:
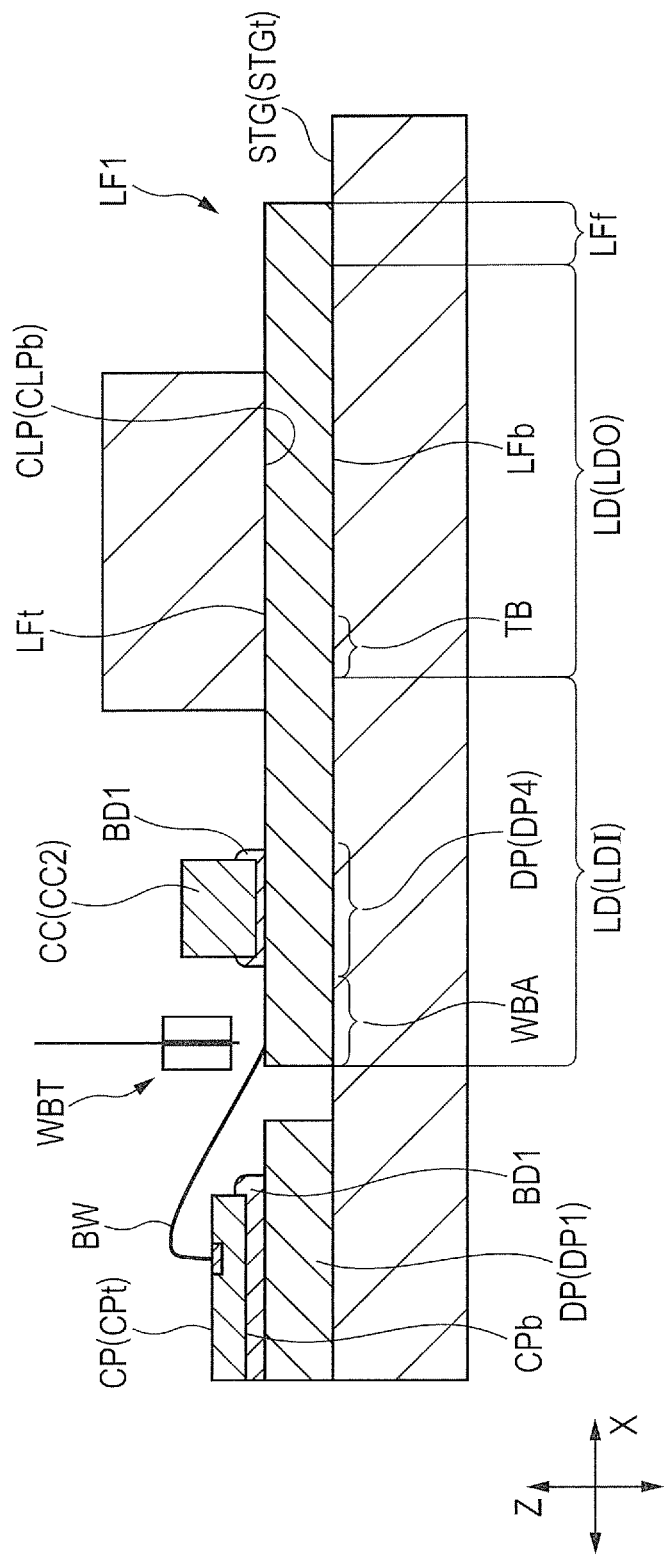
FIG. 26 is an enlarged cross-sectional view along the line A-A in FIG. 25.

Next, in the wire bonding step shown in FIG. 19, as shown in FIG. 24, the plurality of pads PD of the semiconductor chip CP and the plurality of leads LD are electrically connected with each other via the plurality of wires (conductive members) BW. FIG. 24 is a plan view showing a state where the semiconductor chip and the plurality of leads, which are shown in FIG. 22, are electrically connected via the wires. FIG. 25 is a plan view showing the two-dimensional positional relationships between the lead frame, the stage, and the clamper in the wire bonding step. FIG. 26 is an enlarged cross-sectional view along the line A-A in FIG. 25. In FIG. 25, to show the positional relationships between the lead frame LF1, the stage STG, and the clamper CLP in plan view, the stage STG is illustrated with a dot pattern, and the clamper CLP is illustrated with hatching. In FIG. 25, the illustration of each of the semiconductor chip CP, the capacitors CC, the wires BW, and the bonding materials BD1, which are shown in FIG. 24, is omitted. On the other hand, in FIG. 26, the semiconductor chip CP, the capacitors CC, the wires BW, and the bonding materials BD1 are shown.

In the present step, one of the end portions of each of the wires BW is bonded to the pad PD of the semiconductor chip CP, while the other end portion thereof is bonded to the wire bonding portion WBA of the lead LD. In the example shown in FIG. 26, the pad PD is on a first bonding side and the lead LD is on a second bonding side. Specifically, first, the tip of the wire BW is melted to form a ball portion. Next, the ball portion is pressed onto the pad PD on the first bonding side to be pressure-bonded. At this time, when an ultrasonic wave is applied to the ball portion of the wire BW, it is possible to reduce the temperature of the portion to which the ball portion is to be pressure-bonded during the pressure bonding.

Next, while the wire BW is fed out of a bonding tool WBT (see FIG. 26 described later), the bonding tool is moved to form the wire into a loop shape. Then, a part of the wire BW is connected to the second bonding side (wire bonding portion WBA of the lead LD).

As described above, the method which connects a portion (end portion) of the wire with the pad PD of the semiconductor chip CP and then connects another portion of the wire BW to the bonding area of the lead LD (a part of the upper surface of the lead LD) is referred to as a forward bonding method.

In the present step, to efficiently transmit a pressure or an ultrasonic wave to the bonded portion of the wire BW, as shown in FIG. 25, the wire BW is connected in a state where the lead frame LF1 is fixed onto the stage STG.

In the example shown in FIG. 25, an upper surface STGt of the stage STG is a planar surface (surface in a state where a hole, a slit, a depression, a trench, or the like is not formed). As shown in FIG. 26, in the present step, the lead frame LF1 is placed over the stage STG such that an entire lower surface LFb of the lead frame LF1 comes in contact with the upper surface STGt of the stage STG. In addition, by pressing a lower surface CLPb of the clamper CLP onto a part of an upper surface LFt of the lead frame, the lead frame LF1 is held between the stage STG and the clamper CLP to be fixed. The position where the clamper CLP is pressed onto the frame LF1 is preferably in the vicinity of the wire bonding portion WBA. In the case of the present embodiment, over the inner lead portion LDI of the lead LD, the capacitor CC is mounted. Accordingly, in the example shown in FIG. 26, the lower surface CLPb of the clamper CLP is in contact with the outer lead portion LDO of the lead LD and the tie bar TB. Also, in the example shown in FIG. 26, a part of the inner lead portion LDI is in contact with the lower surface CLPb of the clamper CLP within a range in which the clamper CLP is not in contact with the capacitor CC. However, the position where the clamper CLP is pressed onto the lead frame LF1 has various modifications. For example, when the lead frame LF1 can be fixed sufficiently firmly by pressing the clamper CLP onto the inner lead portion LDI, the tie bar TB and the outer lead portion LDO need not be in contact with the clamper CLP. Alternatively, it may also be possible that the outer frame LFf of the lead frame LF1 is in contact with the clamper CLP.

When the lead frame LF1 is thus fixed onto the stage STG and the lower surface of the wire bonding portion WBA is in contact with the upper surface STGt of the stage STG, it is possible to efficiently transmit the pressure or ultrasonic wave applied from the bonding tool WBT to the bonded portion of the wire BW.

Also, as shown in FIG. 25, when the upper surface STGt of the stage STG is a planar surface, the lower surface DPb (see FIG. 23) of the component mounting portion DP2 comes in contact with the upper surface STGt of the stage STG. At this time, in the case where the suspension lead TL2 supporting the component mounting portion DP2 has undergone bending deformation, as described using FIG. 8, the height difference between the respective upper surfaces DPt of the component mounting portions DP2 and DP3 shown in FIG. 23 is forced to be reduced when the lead frame LF1 is fixed. At this time, to the bonding interface between the upper surface DPt of the component mounting portion DP2 and the bonding material BD1, a large stress is applied. However, according to the present embodiment, bending deformation can be prevented by improving the supporting strength of the suspension lead TL2. Accordingly, in the present step, it is possible to reduce the stress applied to the bonding interface between the upper surface DPt of the component mounting portion DP2 and the bonding material BD1.

Figure 27:
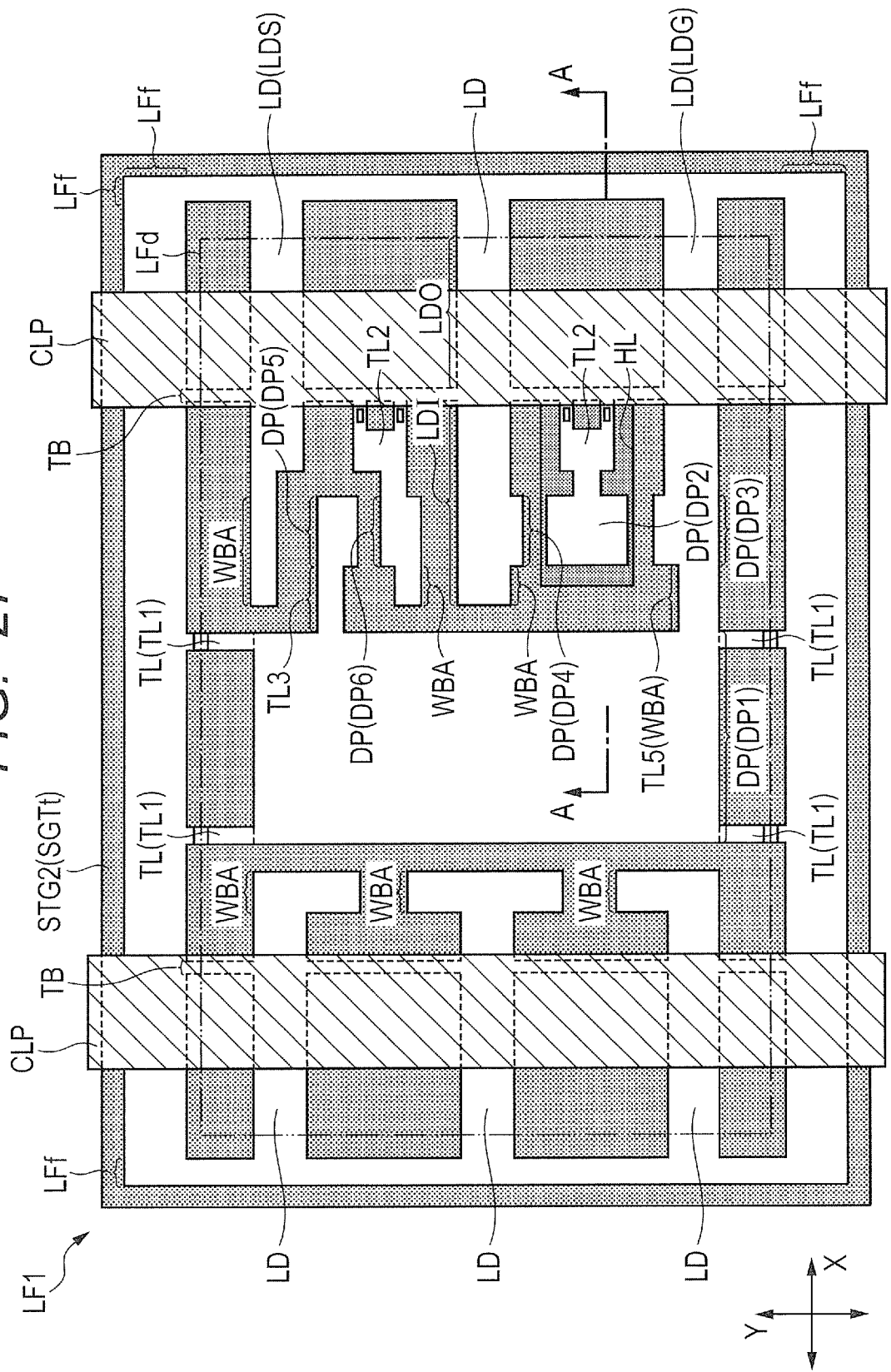
FIG. 27 is a plan view showing a state where a lead frame is fixed onto a stage as a modification against the stage shown in FIG. 25.
Figure 28:
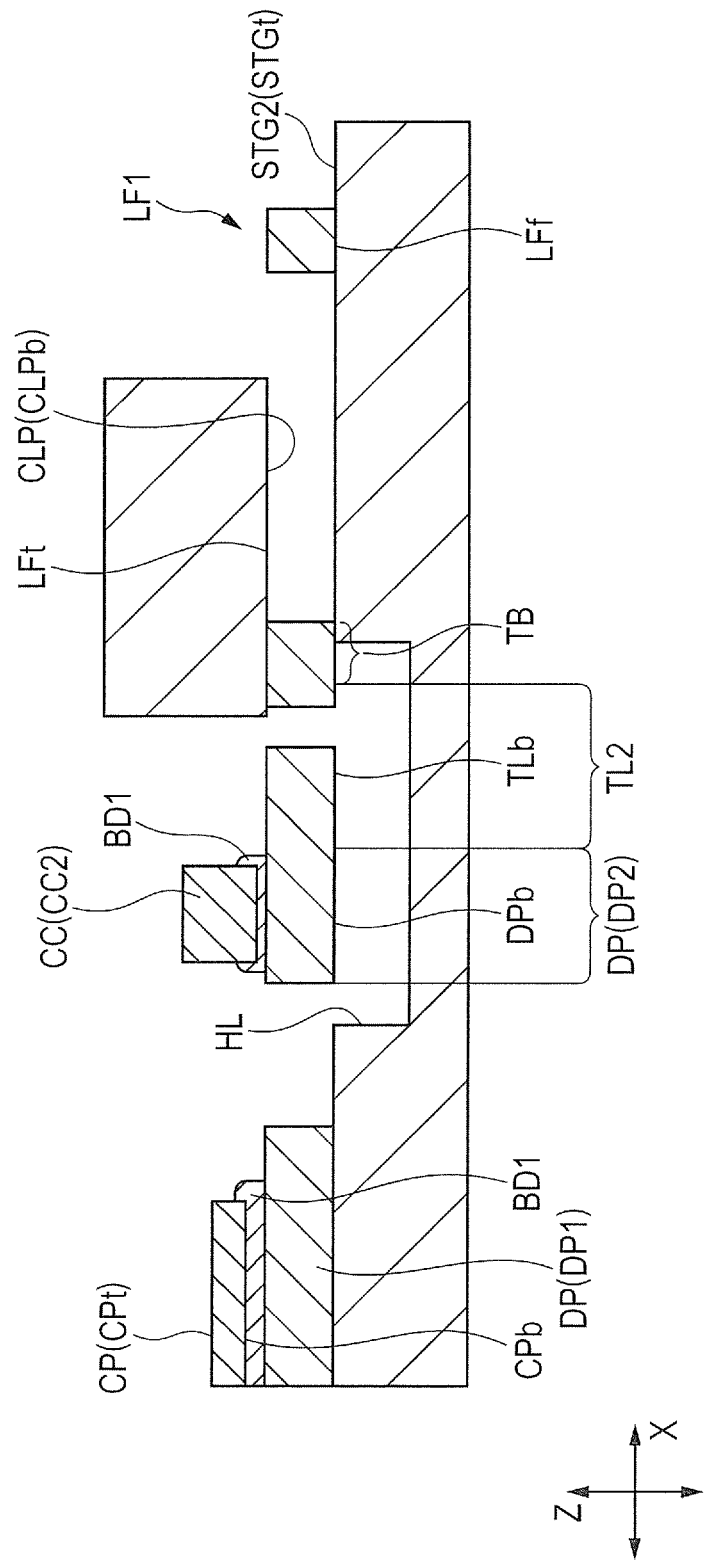
FIG. 28 is an enlarged cross-sectional view along the line A-A in FIG. 27.

As a method which reduces the stress applied to the bonding interface between the upper surface DPt of the component mounting portion DP2 and the bonding material BD1 in the wire bonding step even when the suspension lead TL2 has undergone bending deformation, a modification shown in FIGS. 27 and 28 can be considered. FIG. 27 is a plan view showing a state where the lead frame is fixed onto the stage in a modification of the example shown in FIG. 25. FIG. 28 is an enlarged cross-sectional view along the line A-A in FIG. 27.

A stage STG2 shown in FIGS. 27 and 28 is different from the stage STG shown in FIG. 25 in that an opening HL is provided in a part of the upper surface STGt. In plan view, the opening HL is formed at a position overlapping the entire component mounting portion DP2. In this case, as shown in FIG. 28, even in a state where the lead frame LF1 is fixed onto the stage STG2, the lower surface DPb of the component mounting portion DP2 is not in contact with the stage STG2. In the example shown in FIG. 28, the opening HL is formed at the position overlapping the entire suspension lead TL2. Accordingly, even in the state where the lead frame LF1 is fixed onto the stage STG2, the lower surface TLb of the suspension lead TL2 is not in contact with the stage STG2.

In the example shown in FIG. 28, the opening HL is a hole (depression) having a bottom surface. However, in a modification, the opening HL may also be a through hole extending through the stage STG2 in the thickness direction thereof (Z-direction). By setting the depth of the opening HL sufficiently large, even when the suspension lead TL2 has undergone bending deformation in the wire bonding step, the height of the component mounting portion DP2 is not forcibly determined by the stage STG2. That is, even when the suspension lead TL2 has undergone bending deformation in the wire bonding step, it is possible to reduce the stress applied to the bonding interface between the upper surface DPt of the component mounting portion DP2 and the bonding material BD1.

Similarly to the component mounting portion DP2, the component mounting portion DP6 shown in FIG. 27 is also supported by the suspension lead TL2. However, at the position overlapping the component mounting portion DP6 in the thickness direction, the opening HL is not formed for the following reason.

As can be seen from a comparison made between the component mounting portions DP2 and DP6, between the component mounting portions DP6 and DP1, the wire bonding portion WBA connected to the component mounting portion DP6 is located. To prevent an external force which forcibly determines the height of the component mounting portion DP6 from being applied when the lead frame LF1 is fixed to the stage STG2, it is necessary to provide an opening (the illustration thereof is omitted) which keeps the wire bonding portion WBA connected to the component mounting portion DP6 from contact with the stage STG2.

When wire bonding is performed in a state where the wire bonding portion WBA is not in contact with the stage STG2, the efficiency of transmitting the pressure or ultrasonic wave applied from the bonding tool WBT (see FIG. 26) to the bonded portion of the wire BW (see FIG. 26) deteriorates. Also, when wire bonding is performed in a state where the wire bonding portion WBA is not in contact with the stage STG2, an external force is applied in a direction in which the wire bonding portion WBA is pressed onto the stage STG2. Consequently, due to the external force, the suspension lead TL2 may be deformed. Accordingly, in the wire bonding step, the wire bonding portion WBA connected to the component mounting portion DP6 is preferably in contact with the stage STG2.

On the other hand, as shown in FIG. 27, the wire bonding portion WBA is not connected to the component mounting portion DP2. In other words, the component mounting portion DP2 is spaced apart from each of the plurality of wire bonding portions WBA. Accordingly, even when the component mounting portion DP2 is not in contact with the stage STG2 in the wire bonding step, the above-mentioned problem which arises with respect to the component mounting portion DP6 does not arise with respect to the component mounting portion DP2. In the case of the modification shown in FIGS. 27 and 28, irrespective of whether or not the suspension lead TL2 supporting the component mounting portion DP2 undergoes bending deformation, it is possible to reduce the stress applied to the bonding interface between the upper surface DPt of the component mounting portion DP2 and the bonding material BD1.

5. Sealing Step

Figure 29:
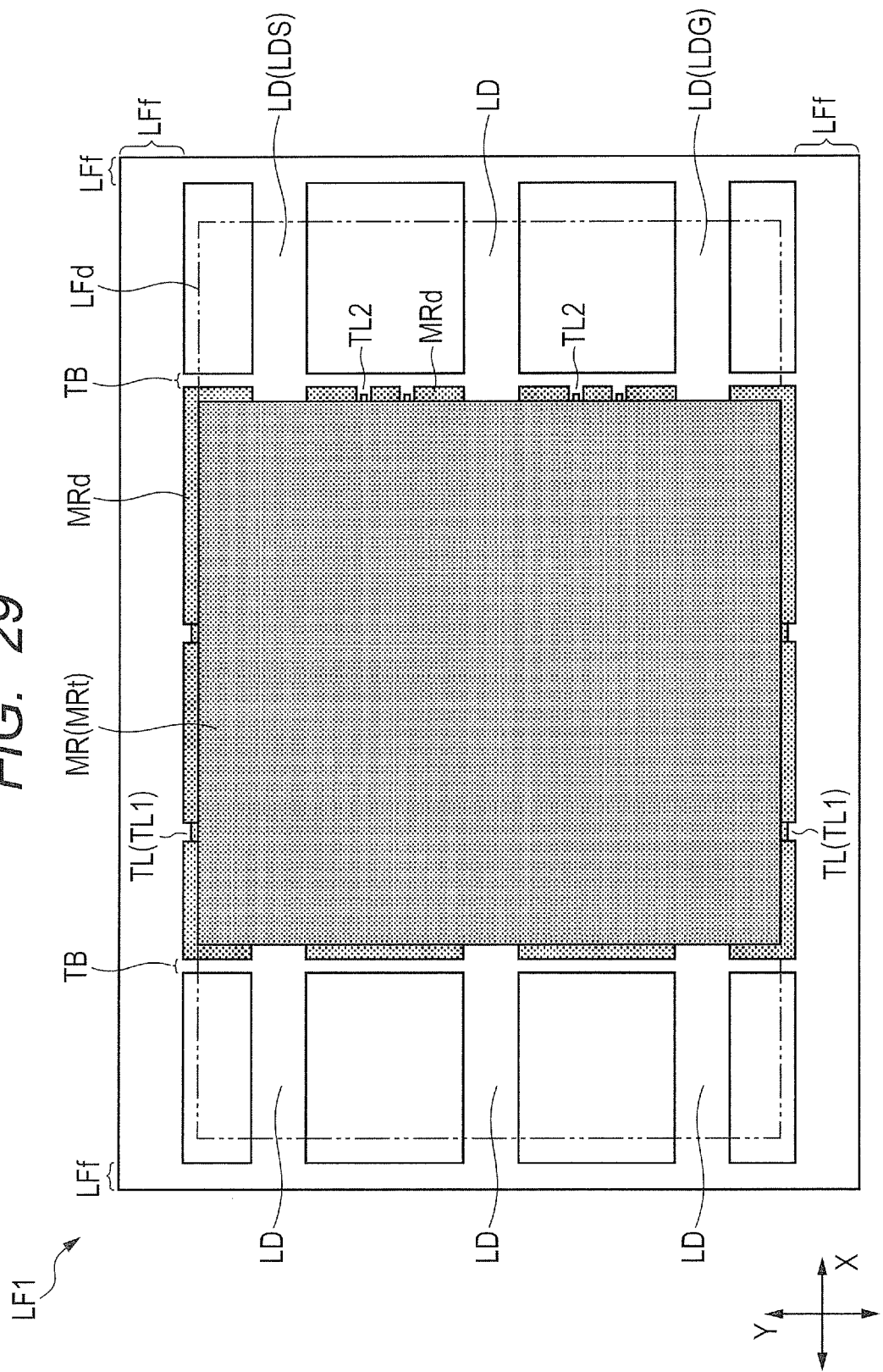
FIG. 29 is a plan view showing a state where a sealing body is formed in the device region of the lead frame shown in FIG. 24.
Figure 30:
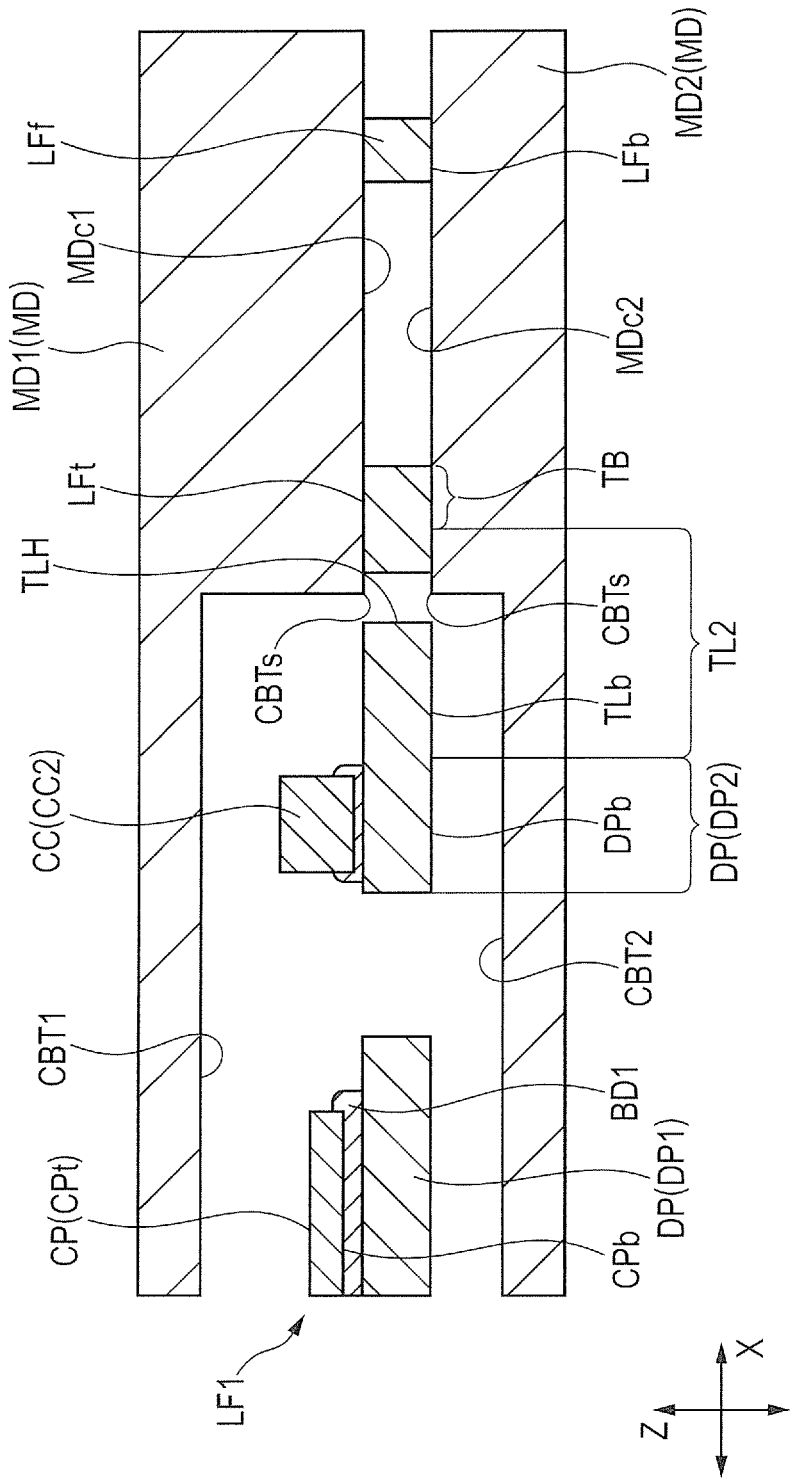
FIG. 30 is an enlarged cross-sectional view showing a state where a lead frame is fixed in molding dies in the sealing step shown in FIG. 19.
Figure 31:
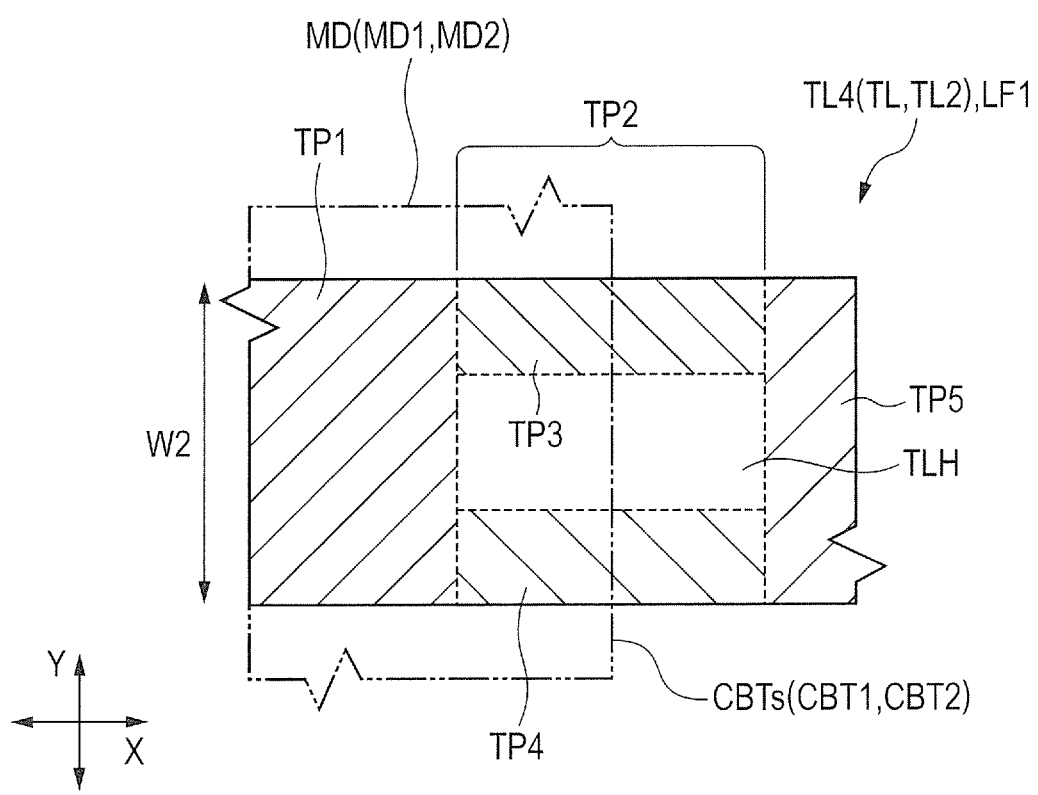
FIG. 31 is an enlarged plan view showing the two-dimensional positional relationship between the suspension lead and the cavities of the molding dies which are shown in FIG. 30.

Next, in the sealing step shown in FIG. 19, as shown in FIG. 29, the sealing body (resin body) MR is formed. FIG. 29 is a plan view showing a state where the sealing body is formed in the device region of the lead frame shown in FIG. 24. FIG. 30 is an enlarged cross-sectional view showing a state where, in the sealing step shown in FIG. 19, the lead frame is fixed in molding dies. FIG. 31 is an enlarged plan view showing the two-dimensional positional relationship between the suspension lead and the cavities of the molding dies which are shown in FIG. 30. Note that FIG. 30 corresponds to a cross section along the line A-A shown in FIG. 27. In the present step, among the components or members shown in FIG. 24, the semiconductor chip CP, the plurality of capacitors CC, the plurality of component mounting portions DP, the plurality of wires BW, the respective portions (sealed portions or inner lead portions) of the plurality of leads LD, the respective portions (sealed portions) of the suspension leads TL1, the respective portions (sealed portions) of the suspension leads TL2, and the suspension lead TL3 are sealed with a resin.

A method of forming the sealing body MR is, e.g., as follows. That is, in a state where the lead frame LF1 is held between molding dies MD as shown in FIG. 30, a softened resin is injected under pressure into the molding dies and then cured, thereby forming the sealing body MR (see FIG. 29). Such a sealing method is referred to as a transfer mold method. The molding dies MD include an upper die (mold) MD1 located over the lead frame LF and a lower die (mold) MD2 located under the lead frame LF. The upper die MD1 includes a cavity (recessed portion) CBT1 and a clamp surface (die surface, pressing surface, or surface) MDc1 which circumferentially surrounds the cavity CBT1 and presses the upper surface LFt (see FIG. 17) of the lead frame LF. The lower die MD2 includes a plurality of cavities (recessed portions) CBT2 arranged to face the cavity CBT1 and a clamp surface (die surface, pressing surface, or surface) MDc2 arranged to face the clamp surface MDc1 and press the lower surface LFb of the lead frame LF. When the sealing body MR is thus formed using the molding dies MD, by adjusting the positions of the cavities of the molding dies and the position of the lead frame LF1, the portions sealed in the sealing body MR and the portions exposed from the sealing body MR can be controlled.

As shown in FIG. 31, in the present step, an end portion (end surface or peripheral edge portion) CBTs of the cavity CBT1 (i.e., the boundary line between the cavity CBT1 and the clamp surface MDc1 shown in FIG. 30) is arranged at a position overlapping each of the portions TP3 and TP4 and the through hole TLH. In other words, in the present step, the lead frame LF1 is fixed such that each of the portions TP3 and TP4 of the suspension lead TL4 and the through hole TLH extends across the end portion CBTs of the cavity CBT1. Likewise, in the present step, the end portion (end surface or peripheral edge portion) CBTs of each of the cavities CBT2 (i.e., the boundary line between each of the cavities CBT2 and the clamp surface MDc2 shown in FIG. 30) is arranged at a position overlapping each of the portions TP3 and TP4 and the through hole TLH. In other words, in the present embodiment, the lead frame LF1 is fixed such that each of the portions TP3 and TP4 and the through hole TLH of the suspension lead TL4 extends across the end portion CBTs of the cavity CBT2.

As a result, the sealing body MR is formed such that the entire portion TP1 of the suspension lead TL2 is sealed in the sealing body MR (see FIG. 14), while the respective portions (exposed portions) of the portions TP3 and TP4 are exposed from the sealing body MR. Also, the portion TP5 is exposed from the sealing body MR. When the respective portions (exposed portions) of the portions TP3 and TP4 are exposed from the sealing body MR, in the tie bar cutting step (suspension lead cutting step) shown in FIG. 19, the respective portions (exposed portions) of the portions TP3 and TP4 can be cut. During the period after the present step until the tie bar cutting step shown in FIG. 19, in the regions between the sealing body MR and the tie bars TB and between the sealing body MR and the outer frame LFf, an in-dam resin MRd is embedded, as shown in FIG. 29. In the through hole TLH as the opening formed in the suspension lead TL2 also, the in-dam resin MRd shown in FIG. 29 is embedded, though the illustration thereof is omitted in FIG. 31.

6. Tie Bar Cutting Step (Suspension Lead Cutting Step)

Figure 32:
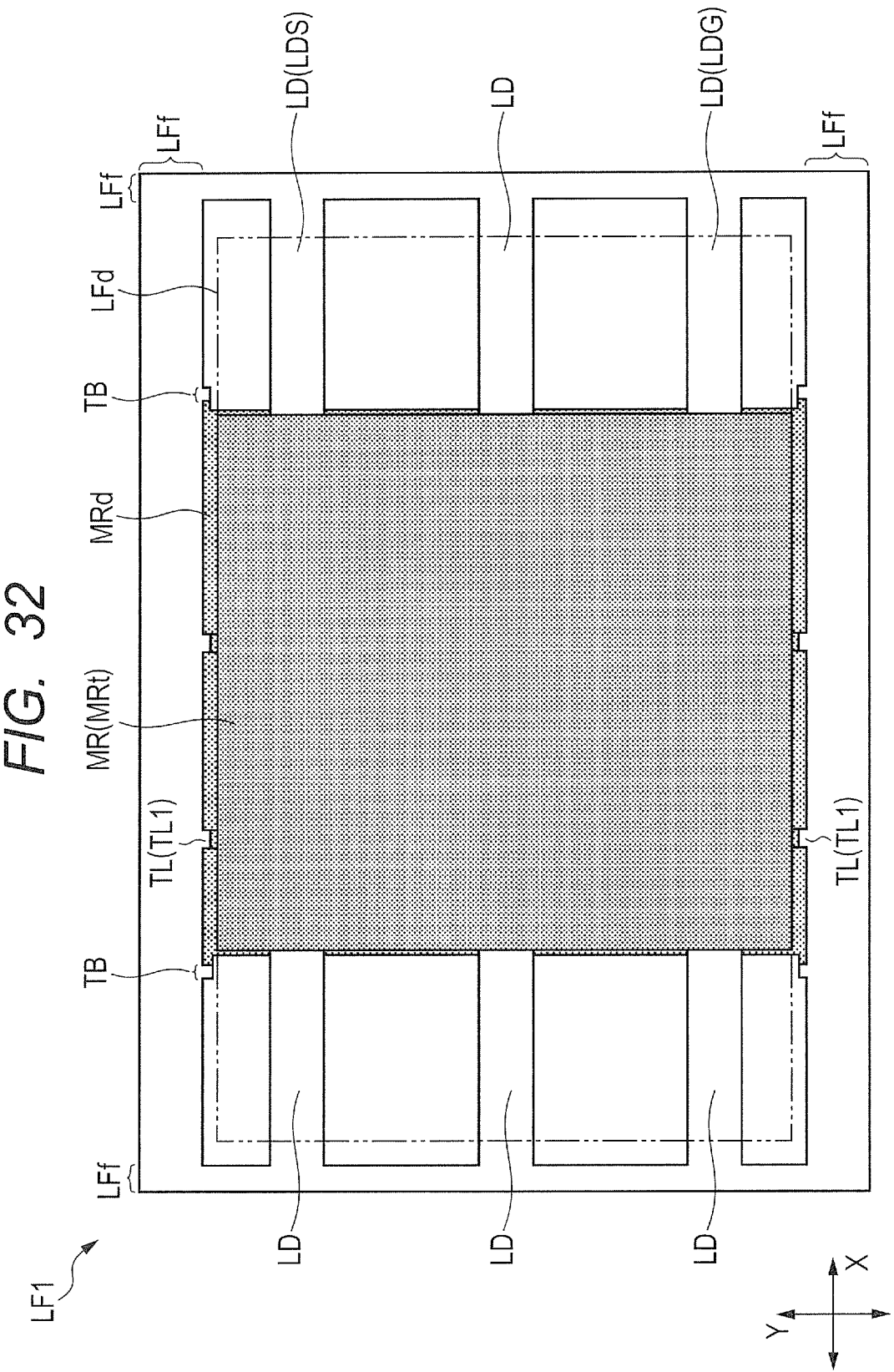
FIG. 32 is a plan view showing a state where the tie bars and the respective portions of the suspension leads which are shown in FIG. 29 are cut.

Next, in the tie bar cutting step shown in FIG. 19, the tie bars TB shown in FIG. 29 are cut to separate the plurality of leads LD from the tie bars TB, as shown in FIG. 32. Also, in the present step, the respective portions (portions exposed from the sealing body MR) of the plurality of suspension leads TL2 shown in FIG. 29 are cut (suspension lead cutting step). The tie bars TB and the suspension leads TL2 may be cut individually in succession or collectively at a time. FIG. 32 is a plan view showing a state where the tie bars and the respective portions of the suspension leads, which are shown in FIG. 29, are cut.

In the present step, the suspension leads TL2 are cut by press cutting. Specifically, of the suspension leads TL (which are the suspension leads TL2 shown in FIG. 29 in the present step), the exposed portions exposed from the sealing body MR are cut by pressing the cutting jig (cutting tool, jig, or tool) PRT thereagainst, as described using FIG. 9. Also, as described using FIG. 14, in the present step, the portions TP3 and TP4 are cut along the cut line CTL shown by the one-dot dash line in FIG. 14. In other words, the portions TP3 and TP4 include the to-be-cut portions which are cut in the step of cutting the suspension leads TL2.

A cutting method using press cutting is short in working time, and therefore the tie bar cutting step (suspension lead cutting step) can efficiently be performed. In the case of the cutting method using press cutting, an external force is applied to a piece to be cut, as described above. Accordingly, when press cutting is performed in the vicinity of the sealing body MR, depending on the magnitude of the external force, a part of the sealing body MR may be damaged during the press cutting. However, according to the present embodiment, the opening is provided between the portions TP3 and TP4 in the to-be-cut portion of each of the suspension leads TL2 so that the cross-sectional area of the to-be-cut portion is reduced. This can reduce the external force applied to each of the suspension leads TL during the press cutting. As a result, even when press cutting is performed in the vicinity of the sealing body MR, the damage to the sealing body MR can be prevented.

Also, in the present step, in addition to the tie bars TB and the suspension leads TL2, the portions of the in-dam resin MRd shown in FIG. 29 which are embedded between the tie bars TB and the sealing body MR are removed.

7. Plating Step

Next, in the plating step shown in FIG. 19, over the top surface of the portion of the lead frame LF1 shown in FIG. 32 which is exposed from the sealing body MR, a metal film such as a solder film is formed. The solder film has the function of improving the wettability of a bonding material when the leads LD are bonded to the terminals of the mounting substrate not shown. The solder film in the present embodiment is made of a so-called lead-free solder, which does not substantially include lead (Pb), such as tin (Sn), a tin-bismuth (Sn—Bi), or a tin-copper-silver (Sn—Cu—Ag).

As a method of forming the solder film, a so-called electrolytic plating method can be used in which the lead frame LF1 shown in FIG. 32 is immersed in a plating solution in a plating tank not shown and, e.g., a dc voltage is applied thereto to precipitate a solder film over the exposed surface of the lead frame LF1.

Note that, in the present embodiment, the description has been given of the method (post-plating method) in which, after the sealing step, the solder film is formed to improve the wettability of the solder when the semiconductor device PKG1 is mounted over the mounting substrate not shown. However, the following modification can also be used appropriately. That is, as a technique which improves the wettability of the solder at the top surfaces of the terminals of the semiconductor device, a so-called pre-plating method in which a metal film is formed in advance over the top surface of a lead frame may also be used instead of the post-plating method.

When the pre-plating method is used appropriately, in the lead frame provision step shown in FIG. 19, a top-surface metal film which improves the wettability of the solder is formed in advance over the entire exposed surface of the lead frame. In the step of forming the top-surface metal film, the top-surface metal film made of, e.g., nickel (Ni), palladium (Pd), or gold (Au) is formed by a plating method. Also, when the pre-plating method is used appropriately, the plating step shown in FIG. 19 can be omitted.

8. Lead Shaping Step

Figure 33:
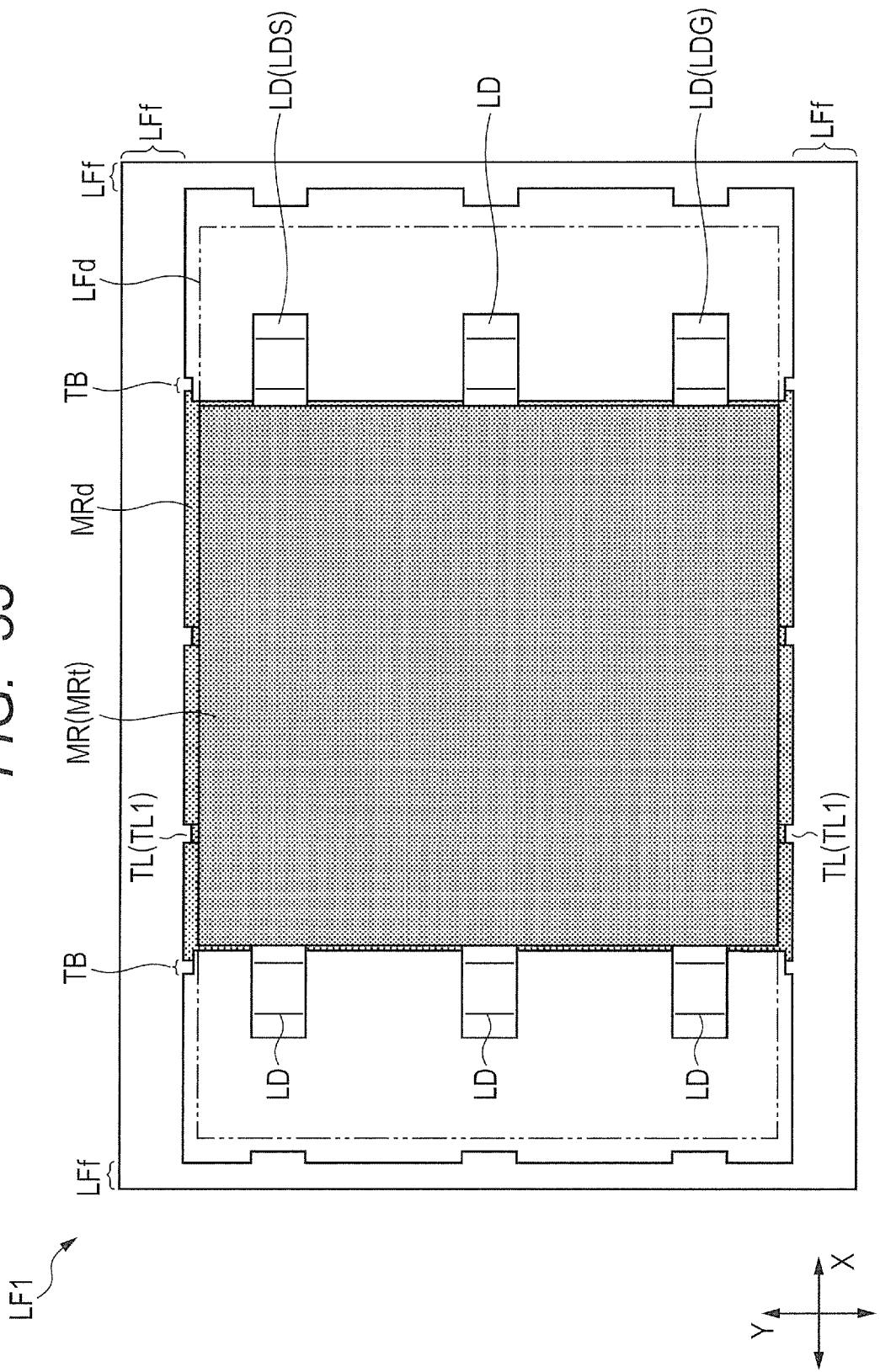
FIG. 33 is a plan view showing a state where the plurality of leads shown in FIG. 32 are cut and shaped.

Next, in a lead shaping step shown in FIG. 19, as shown in FIG. 33, each of the plurality of leads LD is shaped into a shape such as shown by way of example in FIG. 4. FIG. 33 is a plan view showing a state where the plurality of leads shown in FIG. 32 are cut and shaped.

In the present step, each of the plurality of leads LD is cut and separated from the outer frame LFf. As a result, the plurality of leads LD serve as members separated from each other. A method of cutting the plurality of leads LD is not particularly limited, but the plurality of leads LD can be cut by press cutting as shown in FIGS. 9 and 10. In the present step, the to-be-cut portion of each of the plurality of leads LD is in the vicinity of the outer frame LFf and is at a sufficiently long distance from the sealing body MR. Accordingly, even when press cutting is performed in a state where the cross-sectional area of the to-be-cut portion is not reduced, the sealing body MR is less likely to be damaged.

Note that, as already described, as a modification of the present embodiment, there may also be a case where the leads LD are not subjected to bending. In this case, in the present step, by cutting the plurality of leads LD, the shaping thereof is completed.

9. Frame Separation Step

Next, in the frame separation step shown in FIG. 19, by cutting the respective portions of the plurality of suspension leads TL1 shown in FIG. 33, an assembly equivalent to the semiconductor device PKG1 shown in FIG. 1 is separated from the outer frame LFf of the lead frame LF1. As a method of cutting the suspension leads TL1, the press cutting shown in FIG. 10 can be used.

As shown in FIG. 33, the plurality of suspension leads TL1 have the respective portions sealed in the sealing body MR. In the case of cutting the portion of each of the suspension leads TL1, the portion of the suspension lead TL1 is cut in the vicinity of the sealing body MR. Accordingly, when the suspension lead TL1 is cut by press cutting, the cross-sectional area of the to-be-cut portion thereof is preferably reduced. In the case in the present embodiment, as described above in the section <Connection State of Chip Component>, in each of the suspension leads TL1, the trench portion TLtr is formed to extend from one of the side surfaces of the suspension lead TL1 to the other side surface thereof, in the same manner as in the suspension lead TLh described using FIGS. 10 to 12. In the present step, the trench portion TLtr is cut. This reduces the cross-sectional area of the to-be-cut portion of each of the suspension leads TL1. Accordingly, even when press cutting is performed in the present step, it is possible to prevent damage to the sealing body MR.

Also, as described above, the component mounting portion DP1 (see FIG. 20) is supported by the outer frame LFf (see FIG. 20) using the both-side supporting structure. As a result, even when the same structure as that of the suspension lead TLh described using FIGS. 10 to 12 is applied to the suspension lead TL1 connected to the component mounting portion DP1, bending deformation is less likely to occur. When the trench portions TLtr are formed, as shown in FIG. 14, there is no need to leave the portions TP3 and TP4. Accordingly, required processing accuracy is lower than in the case where the through hole TLH shown in FIG. 14 and the depression DNP shown in FIG. 17 are formed. That is, processing is easier.

However, the structure of each of the suspension leads TL1 is not limited to the same structure as that of the suspension lead TLh shown in FIG. 11. In a modification, the structure of each of the suspension leads TL1 may also be the same as the structure of the suspension lead TL4 shown in FIG. 14, the suspension lead TL2A shown in FIG. 16, or the suspension lead TL4B shown in FIG. 17.

After the present step, necessary inspections/tests such as an outer appearance inspection and an electric test are performed, and the products that have passed the inspections/tests become the semiconductor devices PKG1 as finished products shown in FIGS. 1 to 16. Each of the semiconductor devices PKG1 is shipped or mounted on the mounting substrate not shown.

<Other Modifications>

While the invention achieved by the present inventors has been specifically described heretofore on the basis of the embodiment and the various modifications thereof, the present invention is not limited to the foregoing embodiment. It will be appreciated that various changes and modifications, in addition to the modifications described above, can be made in the invention within the scope not departing from the gist thereof.

Figure 34:
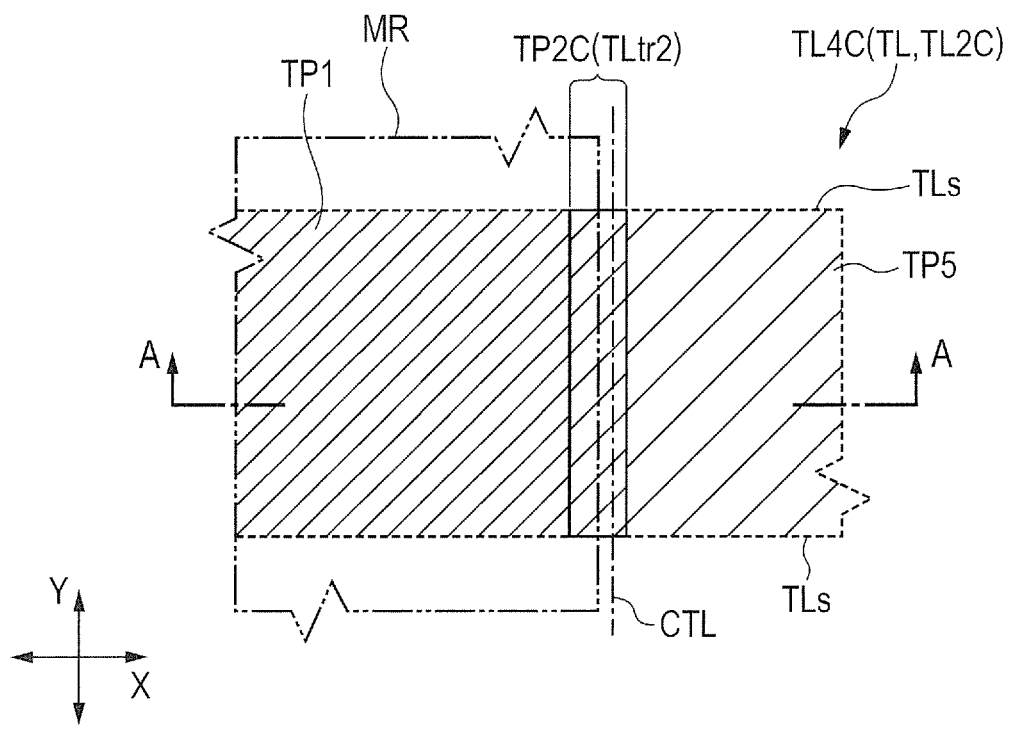
FIG. 34 is an enlarged plan view showing another modification against the suspension lead shown in FIG. 14.
Figure 35:
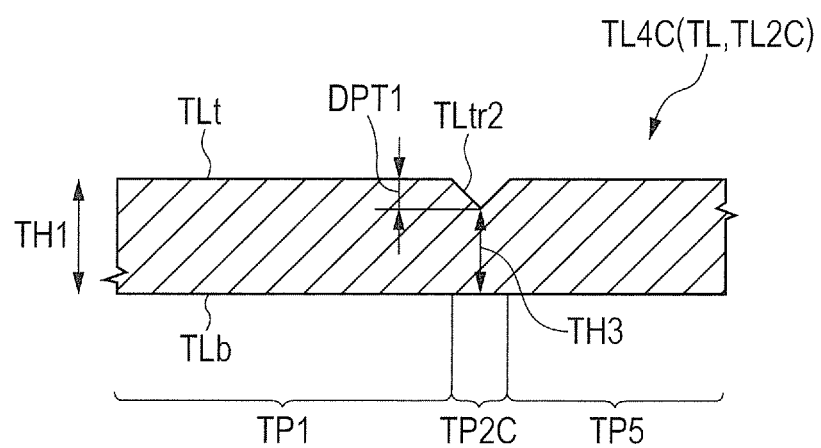
FIG. 35 is an enlarged cross-sectional view along the line A-A in FIG. 34.

For example, in the foregoing embodiment, the portions TP3 and TP4 each having the same thickness as that of the other portion of the suspension lead are left in the to-be-cut portion which is cut in the suspension lead cutting step to improve the supporting strength of the suspension lead TL2. However, even the method which forms the trench portion TLtr shown in FIGS. 10 and 12 can prevent the degradation of the supporting strength due to the trench portion as long as the trench is shallow. FIG. 34 is an enlarged plan view showing another modification against the suspension lead shown in FIG. 14. FIG. 35 is an enlarged cross-sectional view along the line A-A in FIG. 34.

A suspension lead TL2C (suspension lead TL4C) shown in FIGS. 34 and 35 is different from the suspension lead TL2 shown in FIG. 14 in that the suspension lead TL2C has a portion TP2C in which a trench portion TLtr2 is formed between the portions TP1 and TP5, but does not have the portion TP2 shown in FIG. 14.

The trench portion TLtr2 is the same as the trench portion TLtr of the suspension lead TLh shown in FIG. 11 in that, in plan view, the trench portion TLtr2 extends from one of the side surfaces TLs of the suspension lead TL4C to the other side surface TLs thereof. However, as shown in FIG. 35, the trench portion TLtr2 has a depth DPT1 smaller than the depth of the trench portion TLtr shown in FIG. 9. In the example shown in FIG. 35, the depth DPT1 from the deepest portion of the trench portion TLtr2 to the upper surface TLt of the suspension lead TL4C is not more than ¼ of the thickness TH1. In other words, a thickness TH3 from the deepest portion of the trench portion TLtr2 to the lower surface TLb of the suspension lead TL4C is not less than ¾ of the thickness TH1. Thus, the trench portion TLtr2 having the small depth DPT1 can prevent the degradation of the supporting strength of the component mounting portion DP, compared to the trench TLtr shown in FIG. 10. Thus, when the shallower trench portion TLtr2 is formed, the trench portion TLtr2 is preferably formed by press working.

Also, in the form described by way of example in the foregoing embodiment, the component mounting portion DP2 has the one-side supporting structure. However, each of the suspension leads TL connected to the component mounting portion DP supported using the both-side supporting structure, which is among the plurality of component mounting portions DP connected to the suspension leads TL, may also have the structure of the suspension lead TL4 shown in FIG. 14, the suspension lead TL2A shown in FIG. 16, or the suspension lead TL4B shown in FIG. 17.

For example, each of the plurality of leads LD is not cut in the vicinity of the sealing body MR in the suspension lead cutting step shown in FIG. 19. Accordingly, there is no need to reduce the cross-sectional area of the to-be-cut portion, unlike in the suspension lead TL2. As a result, the lead LD does not have the portion TP2 included in the suspension lead TL4 described using FIG. 14. However, each of the plurality of leads LD may also have a structure in which the portions TP3 and TP4 are arranged next to each other via the opening, similarly to the suspension lead TL4 shown in FIG. 14.

Also, in the form described by way of example in the foregoing embodiment, in the suspension lead cutting step shown in FIG. 19, e.g., the cutting jig is pressed against the portion TP2 of the suspension lead TL4 shown in FIG. 14 to cut the suspension lead TL4 by press cutting. However, there may also be a case where, depending on the alignment accuracy of the cutting jig and the dimensions of the portion TP2, the cutting jig (punch PRT3 shown in FIG. 9) does not come in contact with the portion TP2. In this case, e.g., the portion TP5 shown in FIG. 14 may also be cut. The portion TP5 has the cross-sectional area in the Y-direction shown in FIG. 14 which is larger than that of the portion TP2. Consequently, the external force applied to the suspension lead TL4 during the cutting thereof is larger when the portion TP5 is cut. However, between the portion TP5 and the sealing body MR, the portions TP3 and TP4 arranged next to each other via the opening are located. In addition, the respective portions of the portions TP3 and TP4 which are exposed from the sealing body MR are more likely to be deformed than that of the portion TP1. The external force applied to the portion TP5 is reduced through the deformation of the exposed portions of the portions TP3 and TP4. Accordingly, even when the large external force is applied to the portion TP5, it is possible to prevent the external force from being directly transmitted to the sealing body MR.

Also, in the form described in the foregoing embodiment, the conductive resin is used as the bonding material BD1. However, it may also be possible to apply the structure of the suspension lead TL4 shown in FIG. 14, the suspension lead TL2A shown in FIG. 16, or the suspension lead TL4B shown in FIG. 17 to a semiconductor device in which the semiconductor chip CP and the capacitors CC are fixed using a solder material. In the case of using the solder material, the strength of bonding to each of the component mounting portions is significantly improved compared to that obtained in the case of using the conductive resin. However, in the case of using the solder material, it is necessary to consider wettability with respect to the back surface CPb of the semiconductor chip CP, unlike in the case of using the conductive resin. That is, it is necessary to improve the wettability of the solder material with respect to the back surface CPb of the semiconductor chip by forming a metal film such as an electrode over the back surface CPb of the semiconductor chip CP.

Also, in the example described in the foregoing embodiment, e.g., the one capacitor CC is mounted as the electronic component. However, the number of electronic components is not limited to one, and the types of electronic components are not limited to one. For example, the present invention is applicable to a semiconductor device in which any one or more of electronic components including a capacitor component, a resistor component, and an inductor component (coil component) each having a chip-type structure is embedded.

Alternatively, the various modifications described above may also be combined with each other and used appropriately.

What is claimed is:

1. A method of manufacturing a semiconductor device, comprising:
   (a) providing a lead frame having:
      a first component mounting portion connected to a first suspension lead,
      a second component mounting portion having a first side edge facing the first component mounting portion in a first direction and connected to a second suspension lead,
      a third component mounting portion arranged next to the second component mounting portion in a second direction crossing the first direction,
      a plurality of leads,
      a frame portion connected to each of the first suspension lead, the second suspension lead, and the plurality of leads, and
      a first coupling portion connected to each lead of the plurality of leads and to the second suspension lead;
   (b) after (a), mounting a semiconductor chip over the first component mounting portion via a first bonding material, and mounting a first electronic component over the second and third component mounting portions via the first bonding material such that the first electronic component strides over the second and third component mounting portions;
   (c) after (b), electrically connecting the semiconductor chip with each lead of the plurality of leads via a respective wire of a plurality of wires;
   (d) after (c), sealing the semiconductor chip, the first electronic component, the first component mounting portion, the second component mounting portion, the third component mounting portion, the plurality of wires, a sealed portion of each lead of the plurality of leads, a sealed portion of the first suspension lead, and a sealed portion of the second suspension lead with a resin, thereby forming a sealing body; and
   (e) after (d), cutting the second suspension lead by pressing a cutting jig against an exposed portion of the second suspension lead, which is exposed from the sealing body,
   wherein the first bonding material is a resin containing a plurality of conductive particles,
   wherein, in a plan view, the second suspension lead has a first portion located between the second component mounting portion and the first coupling portion, and a second portion located between the first portion and the first coupling portion,
   wherein the second portion has:
      a third portion connected to the first portion and having a width smaller than a width of the first portion, a fourth portion connected to the first portion and having a width smaller than the width of the first portion, and a first opening located between the third and fourth portions;

wherein each of the third and fourth portions has a respective second opening, wherein the first opening is located between the second opening of the third portion and the second opening of the fourth portion, wherein an area of the first opening is greater than an area of each of the second openings, wherein each of the first, third, and fourth portions has a same thickness as one another, wherein, in (d), a part of each of the third portion and the fourth portion is sealed such that the exposed portion of the second suspension lead is exposed from the sealing body, wherein, in (d), a width of the first opening is greater than a width of each of the second openings in the plan view, and wherein, in (d), the width of each of the second openings is greater than a thickness of the exposed portion of the second suspension lead in a cross-sectional view and is less than twice the thickness of the exposed portion of the second suspension lead in the cross-sectional view.

2. The method of manufacturing the semiconductor device according to claim 1, wherein the second component mounting portion of the lead frame has:

the first side edge facing the first component mounting portion, a second side edge located opposite to the first side edge, extending in the second direction, and facing the first coupling portion, a third side edge extending in the first direction and intersecting with the first and second side edges, and a fourth side edge located opposite to the third side edge; and wherein the second suspension lead is connected to the second side edge of the second component mounting portion.

3. The method of manufacturing the semiconductor device according to claim 2, wherein the third component mounting portion is connected to the first component mounting portion via a second coupling portion provided between the third and first component mounting portions.

4. The method of manufacturing the semiconductor device according to claim 3, wherein a first lead is connected to the third component mounting portion, wherein the first lead is located on an opposite side of the second comprising portion via the third component mounting portion, wherein the first lead is connected to the second suspension lead via the first coupling portion, and wherein the first lead is not cut in (e).

5. The method of manufacturing the semiconductor device according to claim 2, wherein, in the plan view, the first component mounting portion has:

a fifth side edge facing each of the second and third component mounting portions, a sixth side edge located opposite to the fifth side edge and extending along the second direction, a seventh side edge extending along the first direction, which direction intersects with the fifth and sixth side edges, and an eighth side edge located opposite to the seventh side edge and extending along the first direction, and wherein the first component mounting portion is connected at the seventh and eighth side edges to the first suspension lead, which extends along the second direction, the method of manufacturing the semiconductor device further comprising:

(f) after (d), cutting a part of the first suspension lead.

6. The method of manufacturing the semiconductor device according to claim 5, wherein the lead frame has:

at least some leads of the plurality of leads arranged along the sixth side edge of the first component mounting portion, and a third coupling portion connected to each lead of said at least some leads of the plurality of leads;

wherein said at least some leads of the plurality of leads are not cut in (e).

7. The method of manufacturing the semiconductor device according to claim 5, wherein the first suspension lead has:

the sealed portion sealed in the sealing body, an exposed portion exposed from the sealing body, and a trench portion at a boundary between the sealed portion and the exposed portion;

wherein, in the plan view, the trench portion extends from one side surface of the first suspension lead to an opposite side surface of the first suspension lead, and wherein, in (f), the first suspension lead is cut by pressing a cutting jig against a portion of the trench portion which is exposed from the sealing body.

8. The method of manufacturing the semiconductor device according to claim 1, wherein, in (e), the third and fourth portions are cut.

9. The method of manufacturing the semiconductor device according to claim 1, wherein, in (c), the plurality of wires is connected in a state where the lead frame is fixed to a stage, wherein the stage has a third opening formed at a position overlapping the entire second component mounting portion, and wherein, in (c), each lead of the plurality of leads is in contact with the stage, while the second component mounting portion is kept from contact with the stage.

10. The method of manufacturing the semiconductor device according to claim 1, wherein the plurality of wires includes a first wire, and wherein the second component mounting portion is spaced apart from the first component mounting portion and electrically connected with the semiconductor chip via the first wire.

11. The method of manufacturing the semiconductor device according to claim 10, wherein the second component mounting portion is connected to a wire bonding portion of the lead frame located between the second and first component mounting portions and connected to an end portion of the first wire.

12. The method of manufacturing the semiconductor device according to claim 1, wherein the third component mounting portion is connected to a third suspension lead, wherein the third suspension lead has an end portion connected to the third component mounting portion and another end portion connected to the first component mounting portion, and wherein, in (d), the third suspension lead and the entire third component mounting portion are sealed within the resin.

13. The method of manufacturing the semiconductor device according to claim 1, wherein the semiconductor chip has:

a top surface over which a plurality of electrodes is formed, and a back surface which is located opposite to the top surface and over which no electrode is formed;

wherein, in (b), the semiconductor chip is mounted over the first component mounting portion via the first bonding material such that the back surface of the semiconductor chip faces the first component mounting portion, and wherein, in (c), each wire of the plurality of wires is connected to a respective electrode of the plurality of electrodes formed over the top surface of the semiconductor chip.

14. The method of manufacturing the semiconductor device according to claim 1, wherein the second component mounting portion is supported in the lead frame by a cantilever formed by the second suspension lead.

15. The method of manufacturing the semiconductor device according to claim 1, wherein the third component mounting portion is connected to a first lead of the plurality of leads, the first lead being located on a side of the third component mounting portion opposite from the first component mounting portion along the first direction, and the method further comprising, after (e), cutting the first lead.

16. The method manufacturing the semiconductor device according to claim 15, wherein, prior to cutting the first lead, there is no opening in the first lead in the plan view.

* * * * *